(12) United States Patent
Wu et al.

(10) Patent No.: US 11,133,286 B2
(45) Date of Patent: Sep. 28, 2021

(54) CHIP PACKAGES AND METHODS OF MANUFACTURE THEREOF

(71) Applicant: Taiwan Semiconductor Manufacturing Company, Ltd., Hsinchu (TW)

(72) Inventors: Chih-Wei Wu, Zhuangwei Township (TW); Jing-Cheng Lin, Hsinchu (TW); Szu-Wei Lu, Hsinchu (TW); Ying-Ching Shih, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/594,922

(22) Filed: Oct. 7, 2019

(65) Prior Publication Data
US 2020/0043892 A1 Feb. 6, 2020

Related U.S. Application Data

(63) Continuation of application No. 15/636,272, filed on Jun. 28, 2017, now Pat. No. 10,483,234, which is a (Continued)

(51) Int. Cl.
*H01L 21/56* (2006.01)
*H01L 21/683* (2006.01)
(Continued)

(52) U.S. Cl.
CPC ........ *H01L 25/0652* (2013.01); *H01L 21/561* (2013.01); *H01L 21/565* (2013.01); *H01L 21/568* (2013.01); *H01L 21/6835* (2013.01); *H01L 21/76885* (2013.01); *H01L 23/3114* (2013.01); *H01L 23/49811* (2013.01); *H01L 23/5389* (2013.01); *H01L 24/06* (2013.01);
(Continued)

(58) Field of Classification Search
CPC ..................................................... H01L 21/568
See application file for complete search history.

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

| CN | 102347251 A | 2/2012 |
| CN | 103000593 A | 3/2013 |
| WO | 2014150564 A1 | 9/2014 |

*Primary Examiner* — Omar F Mojaddedi
(74) *Attorney, Agent, or Firm* — Slater Matsil, LLP

(57) ABSTRACT

Chip packages and method of manufacturing the same are disclosed. In an embodiment, a chip package may include: a redistribution layer (RDL); a first chip including a plurality of first contact pads, the plurality of first contact pads facing the RDL; a second chip disposed between the first chip and the redistribution layer (RDL) wherein a portion of the first chip is disposed outside a lateral extent of the second chip; and a conductive via laterally separated from the second chip, the conductive via extending between the RDL and a first contact pad of the plurality of first contact pads, the first contact pad located in the portion of the first chip disposed outside the lateral extent of the second chip.

20 Claims, 60 Drawing Sheets

Related U.S. Application Data continuation of application No. 14/871,447, filed on Sep. 30, 2015, now Pat. No. 9,704,825.

(51) Int. Cl.

| | | |
|---|---|---|
| *H01L 21/768* | (2006.01) | |
| *H01L 21/78* | (2006.01) | |
| *H01L 23/367* | (2006.01) | |
| *H01L 25/00* | (2006.01) | |
| *H01L 25/065* | (2006.01) | |
| *H01L 23/00* | (2006.01) | |
| *H01L 23/538* | (2006.01) | |
| *H01L 23/498* | (2006.01) | |
| *H01L 23/31* | (2006.01) | |
| *H01L 25/18* | (2006.01) | |

(52) U.S. Cl.
CPC .............. *H01L 24/11* (2013.01); *H01L 24/13* (2013.01); *H01L 24/19* (2013.01); *H01L 24/20* (2013.01); *H01L 24/25* (2013.01); *H01L 24/32* (2013.01); *H01L 24/73* (2013.01); *H01L 24/96* (2013.01); *H01L 24/97* (2013.01); *H01L 25/18* (2013.01); *H01L 25/50* (2013.01); *H01L 21/6836* (2013.01); *H01L 21/78* (2013.01); *H01L 23/367* (2013.01); *H01L 24/33* (2013.01); *H01L 24/83* (2013.01); *H01L 2221/68327* (2013.01); *H01L 2221/68359* (2013.01); *H01L 2221/68381* (2013.01); *H01L 2224/02371* (2013.01); *H01L 2224/0401* (2013.01); *H01L 2224/04105* (2013.01); *H01L 2224/05023* (2013.01); *H01L 2224/05124* (2013.01); *H01L 2224/05147* (2013.01); *H01L 2224/061* (2013.01); *H01L 2224/11002* (2013.01); *H01L 2224/12105* (2013.01); *H01L 2224/13023* (2013.01); *H01L 2224/13024* (2013.01); *H01L 2224/211* (2013.01); *H01L 2224/215* (2013.01); *H01L 2224/24137* (2013.01); *H01L 2224/24147* (2013.01); *H01L 2224/32145* (2013.01); *H01L 2224/32225* (2013.01); *H01L 2224/32245* (2013.01); *H01L 2224/33181* (2013.01); *H01L 2224/73217* (2013.01); *H01L 2224/73253* (2013.01); *H01L 2224/73267* (2013.01); *H01L 2224/92244* (2013.01); *H01L 2224/97* (2013.01); *H01L 2225/06548* (2013.01); *H01L 2225/06562* (2013.01); *H01L 2225/06586* (2013.01); *H01L 2225/06589* (2013.01); *H01L 2924/1027* (2013.01); *H01L 2924/1032* (2013.01); *H01L 2924/10253* (2013.01); *H01L 2924/141* (2013.01); *H01L 2924/143* (2013.01); *H01L 2924/1421* (2013.01); *H01L 2924/1431* (2013.01); *H01L 2924/1434* (2013.01); *H01L 2924/1436* (2013.01); *H01L 2924/1461* (2013.01); *H01L 2924/3511* (2013.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2007/0145556 | A1* | 6/2007 | Bolken ............... H01L 25/0655 257/678 |
| 2010/0140779 | A1* | 6/2010 | Lin ..................... H01L 23/5389 257/690 |
| 2011/0042798 | A1 | 2/2011 | Pagaila et al. |
| 2011/0291288 | A1 | 12/2011 | Wu et al. |
| 2012/0028411 | A1 | 2/2012 | Yu et al. |
| 2013/0026468 | A1 | 1/2013 | Yoshimuta et al. |
| 2013/0062760 | A1 | 3/2013 | Hung et al. |
| 2013/0062761 | A1* | 3/2013 | Lin ....................... H01L 21/565 257/738 |
| 2013/0168848 | A1 | 7/2013 | Lin et al. |
| 2013/0307140 | A1 | 11/2013 | Huang et al. |
| 2014/0103488 | A1* | 4/2014 | Chen ................ H01L 21/76885 257/532 |
| 2014/0203429 | A1* | 7/2014 | Yu ...................... H01L 21/6835 257/737 |
| 2014/0210099 | A1* | 7/2014 | Hu ....................... H01L 21/568 257/774 |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2015/0044819 | A1 | 2/2015 | Lin et al. |
| 2015/0255432 | A1 | 9/2015 | Lin et al. |

* cited by examiner

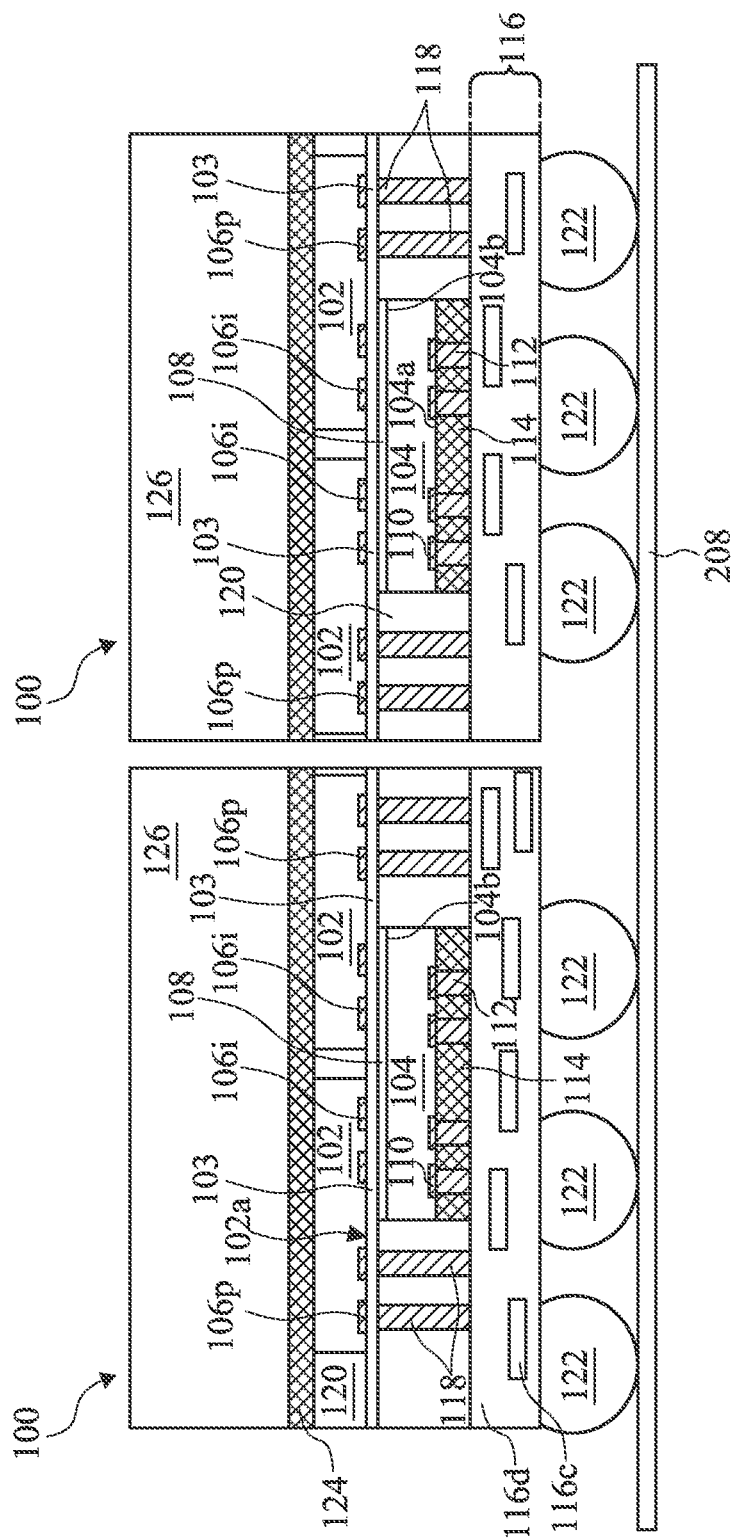

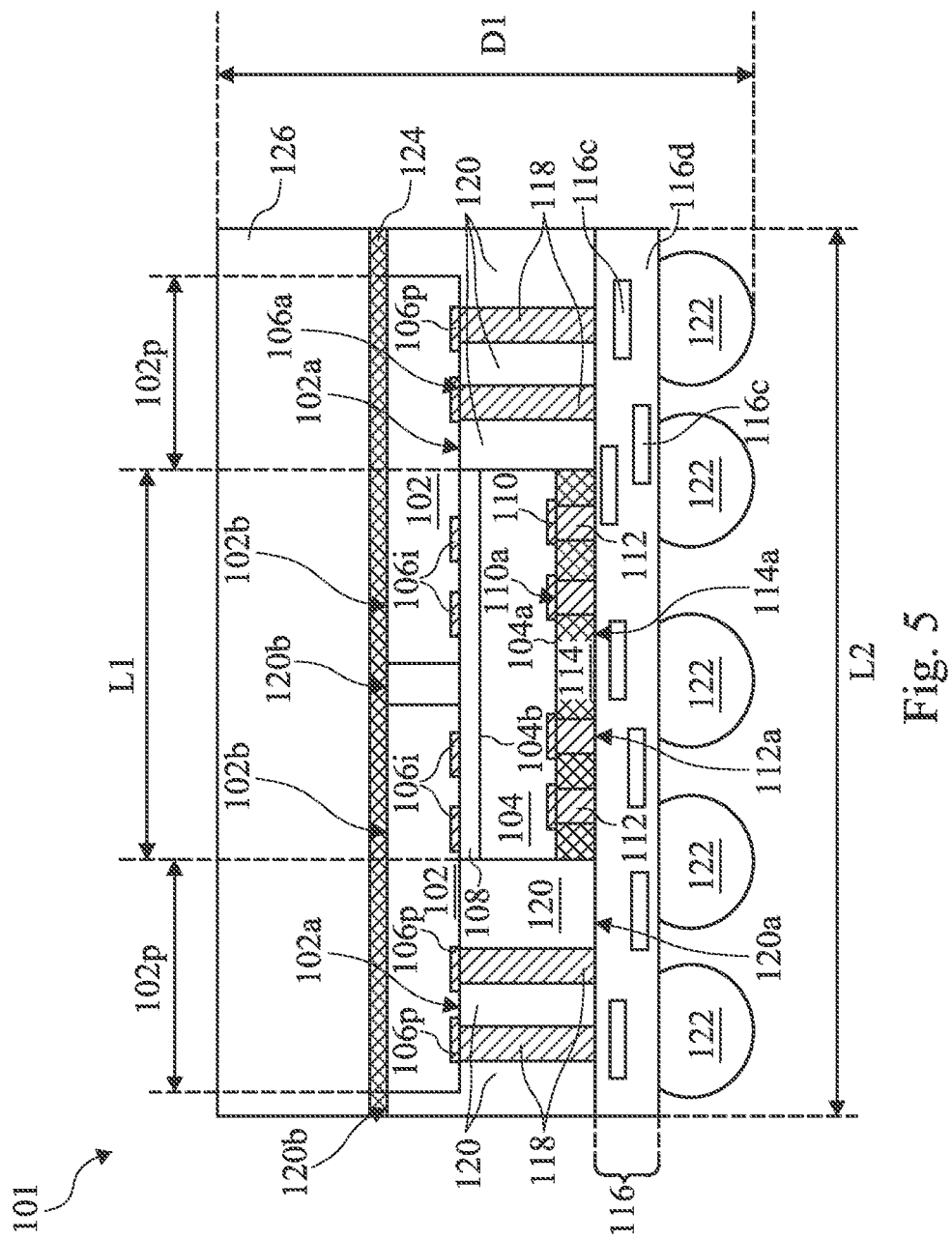

CHIP PACKAGES AND METHODS OF MANUFACTURE THEREOF

PRIORITY CLAIM

This patent application is a continuation of U.S. application Ser. No. 15/636,272, filed on Jun. 28, 2017 and entitled "Chip Packages and Methods of Manufacture Thereof," which is a continuation of U.S. application Ser. No. 14/871,447, filed on Sep. 30, 2015 and entitled "Chip Packages and Methods of Manufacture Thereof," now U.S. Pat. No. 9,704,825 issued on Jul. 11, 2017, which applications are hereby incorporated by reference herein in their entireties.

BACKGROUND

In an aspect of packaging technologies, redistribution layers (RDLs) may be formed over a chip and electrically connected to active devices in the chip. Input/output (I/O) connectors such as solder balls on under-bump metallurgy (UBMs) may then be formed to electrically connect to the chip through the RDLs. An advantageous feature of this packaging technology is the possibility of forming fan-out packages. Thus, the I/O pads on the chip can be redistributed to cover a greater area than the chip, and hence the number of I/O pads packed on the surfaces of the packaged chips can be increased.

Integrated Fan Out (InFO) package technology is becoming increasingly popular, particularly when combined with Wafer Level Packaging (WLP) technology. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3K show a process flow illustrating some of the steps of another method of forming the multi-chip package shown in FIG. 1, in accordance with an embodiment.

FIG. 5 shows another multi-chip package, in accordance with an embodiment.

FIGS. 6A to 6J show a process flow illustrating some of the steps of a method of forming the multi-chip package shown in FIG. 5, in accordance with an embodiment.

DETAILED DESCRIPTION

Figure 1:
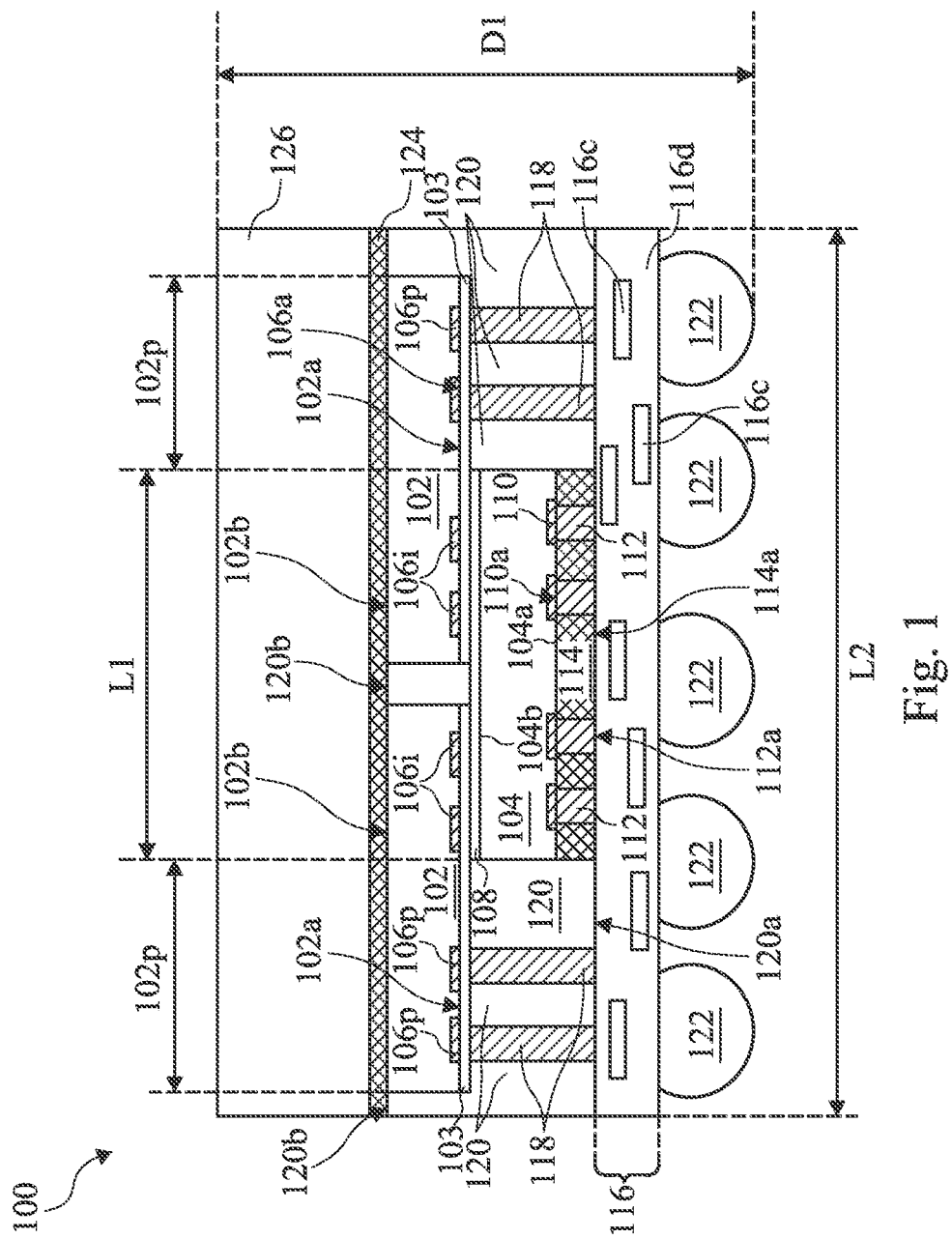
FIG. 1 shows a multi-chip package, in accordance with an embodiment.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a package 100 comprising a plurality of chips, in accordance with one or more embodiments. The package 100 may be a multi-chip fan-out package, as an example. As another example, the package 100 may be an integrated fan-out (InFO) chip package. The package 100 may include at least one first chip 102 and at least one second chip 104 included in a single package. Each of the at least one first chip 102 and the at least one second chip 104 of the package 100 may have been subjected to one or more functional tests (e.g. electrical connection and stress tests) and may have passed such functional tests. In such an example, each of the at least one first chip 102 and the at least one second chip 104 may be a known good die (KGD).

The at least one first chip 102 may comprise a semiconductor chip and could be any type of integrated circuit. As an example, the at least one first chip 102 may comprise a processor chip, a logic chip, a memory chip (e.g. a dynamic random access memory chip), an analog circuit, a digital circuit, a mixed signal device, an imaging device, a MEMS device, combinations thereof, or the like. As a further example, the at least one first chip 102 may be a system-on-chip (SoC) integrated circuit that includes digital, analog, mixed-signal, and/or radio-frequency functions on a single chip substrate. The at least one second chip 104 may comprise a processor chip, a logic chip, a memory chip (e.g. a dynamic random access memory (DRAM) chip), an analog circuit, a digital circuit, a mixed signal device, an imaging device, a MEMS device, combinations thereof, or the like. As a further example, the at least one second chip 104 may be a system-on-chip (SoC) integrated circuit that includes digital, analog, mixed-signal, and/or radio-frequency functions on a single chip substrate. The at least one first chip 102 and the at least one second chip 104 may differ in function. As an example, the at least one first chip 102 may comprise a DRAM chip while the at least one second chip 104 may comprise a logic chip electrically coupled to the at least one first chip 102. In such an embodiment, the package 100 may be a memory-logic merged chip package.

In the example shown in FIG. 1, the package 100 includes two first chips 102 that are laterally separated from each other. However, in another example, the package 100 may include only one first chip 102 or may include more than two first chips 102 that may be laterally separated from each other. In yet another example, the package 100 may include two or more first chips 102 may be stacked over each other. In like manner, the package 100 shown in FIG. 1 include one second chip 104. However, in another example, the package 100 may include a plurality of second chips 104 that may be laterally separated from each other and/or stacked over each other.

The at least one first chip 102 may include a substrate, one or more active devices, and an interconnect structure. The substrate, one or more active devices, and interconnect structure of the at least one first chip 102 are not shown in FIG. 1 for the sake of simplicity. The substrate of the at least one first chip 102 may be a bulk silicon substrate, although other semiconductor materials including group III, group IV, and group V elements may also be used. Alternatively, the substrate may be a silicon-on-insulator substrate, a germanium-on-insulator substrate, or the like.

The one or more active devices of the at least one first chip 102 may be formed within and/or atop the substrate of the at least one first chip 102 using suitable semiconductor manufacturing processes. The one or more active devices may comprise one or more transistors, as an example. The respective interconnect structures of the at least one first chip 102 may be formed over the substrate and the one or more active devices of the at least one first chip 102. The respective interconnect structures may electrically connect the one or more active devices to form functional circuits in the at least one first chip 102.

The interconnect structure may include one or more inter-layer dielectric (ILD) layers and/or one or more inter-metal dielectric (IMD) layers containing conductive features formed therein. The respective interconnect structures may be formed by forming the one or more ILD and/or IMD layers (e.g. by a spin coating or a deposition process) over the substrate of the at least one first chip 102, patterning the one or more ILD and/or IMD layers (e.g. using a combination of photolithography and etching processes) to form openings therein, and forming the conductive features in the openings of the one or more ILD and/or IMD layers (e.g. by depositing a seed layer in the patterns formed in the one or more ILD and/or IMD layers and overfilling the patterns with a conductive material which may be planarized subsequently). The conductive features may include, or may be, conductive lines and/or vias, which may comprise a conductive material such as copper, aluminum, tungsten, combinations thereof, or the like. The one or more ILD and/or IMD layers may include, or may consist of, low-k dielectric materials having k values, for example, less than or equal to about 4.0 (e.g. less than or equal to about 2.8) disposed between the conductive features. In some embodiments, the one or more ILD and/or IMD layers of the interconnect structure may be include, or may consist of, for example, silicon oxide, SiCOH, undoped silica glass (USG), or the like.

The at least one first chip 102 may include input/output (I/O) features that may be formed over the interconnect structure of the at least one first chip 102, as an example. For example, the at least one first chip 102 may comprise a plurality of first contact pads 106p, 106i that may function as I/O features of the at least one first chip 102. The plurality of first contact pads 106p, 106i may be formed at a first surface 102a (e.g. active surface or a front side) of the at least one first chip 102. The at least one first chip 102 may have a second surface 102b (e.g. a back side) opposite the first surface 102a of the at least one first chip 102. The plurality of first contact pads 106p, 106i may include, or may consist of, a conductive material such as aluminum, copper, or the like. The plurality of first contact pads 106p, 106i may be formed by any suitable process, such as a deposition and etching, damascene or dual damascene, or other suitable processes with any suitable conductive material. In the example shown in FIG. 1, surfaces 106a of the plurality of first contact pads 106p, 106i facing away from the second surface 102b of the at least one first chip 102 are substantially coplanar with the first surface 102a of the at least one first chip 102. However, in another example, the surfaces 106a of the plurality of first contact pads 106p, 106i may protrude from the first surface 102a of the at least one first chip 102, e.g. in a direction away from the second surface 102b of the at least one first chip 102.

As illustrated in the example of FIG. 1, the plurality of first contact pads 106p, 106i may be electrically connected to a first redistribution layer (RDL) 103. The first RDL 103 may include conductive features (e.g. conductive lines and/or vias) formed in one or more first dielectric layers. The conductive features and the one or more first dielectric layers are not shown in FIG. 1 for the sake of simplicity. These features are, however, shown in FIG. 2C. The conductive features 103c of the first RDL 103 may be formed in one or more metallization layers of the first RDL 103. The one or more first dielectric layers 103d of the first RDL 103 may be formed of any suitable insulating and/or polymer material (e.g. PI, PBO, BCB, epoxy, silicone, acrylates, nano-filled pheno resin, siloxane, a fluorinated polymer, polynorbornene, or the like) using any suitable method, such as, spin-on coating, sputtering, or the like. The formation of the conductive features 103c in the one or more first dielectric layers 103d of the first RDL 103 may include patterning the one or more first dielectric layers 103d (e.g. using a combination of photolithography and etching processes) and forming the conductive features 103c in the patterned one or more first dielectric layers (e.g. by a damascene and/or dual damascene process).

The at least one second chip 104 may be attached to the at least one first chip 102 by a first adhesive layer 108 disposed between the at least one first chip 102 and the first RDL 103.

As shown in the example of FIG. 1, a portion 102p of the at least one first chip 102 may be disposed outside a lateral extent L1 (e.g. a width) of the at least one second chip 104. As such, the plurality of first contact pads 106p, 106i may comprise a first group of first contact pads 106p that may be disposed outside the lateral extent L1 of the at least one second chip 104, and a second group of first contact pads 106i that may be disposed within the lateral extent L1 of the at least one second chip 104. The first adhesive layer 108 may be disposed within the lateral extent L1 of the at least one second chip 104, and thus, the first adhesive layer 108 may be located between the second group of first contact pads 106i and the at least one second chip 104. In an embodiment, a first one of the second group of first contact pads 106i may be electrically connected to a second one of the second group of first contact pads 106i and/or a contact pads of the first group of first contact pads 106p by a conductive trace (not shown in FIG. 1) that may extend along the first surface 102a of the at least one first chip 102.

The first adhesive layer 108 may comprise a non-conductive material and/or a glue, a polymer material, a die attach film (DAF), or the like. The at least one second chip 104 may have a first surface 104a (e.g. active surface or a front side of the at least one second chip 104, which may face away from the at least one first chip 102. The at least one second chip 104 may have a second surface 104b (e.g. a back side) opposite the first surface 104a of the at least one second chip 104. The second surface 104b of the at least one second chip 104 may face the at least one first chip 102, as shown in the example of FIG. 1. The first adhesive layer 108 may be disposed between the first surface 102a of the at least one first chip 102 and the second surface 104b of the at least one second chip 104.

The at least one second chip 104 may include a substrate, one or more active devices, and an interconnect structure. The substrate, one or more active devices, and interconnect structure of the at least one second chip 104 are not shown in FIG. 1 for the sake of simplicity. The substrate of the at least one second chip 104 may be a bulk silicon substrate, although other semiconductor materials including group III, group IV, and group V elements may also be used. Alternatively, the substrate may be a silicon-on-insulator substrate, a germanium-on-insulator substrate, or the like.

The one or more active devices of the at least one second chip 104 may be formed within and/or atop the substrate of the at least one second chip 104 using suitable semiconductor manufacturing processes. The one or more active devices may comprise one or more transistors, as an example. The respective interconnect structures of the at least one second chip 104 may be formed over the substrate and the one or more active devices of the at least one second chip 104. The respective interconnect structures may electrically connect the one or more active devices to form functional circuits in the at least one second chip 104.

The interconnect structure may include one or more ILD layers and/or one or more IMD layers containing conductive features formed therein. The respective interconnect structures may be formed by forming the one or more ILD and/or IMD layers (e.g. by a spin coating or a deposition process) over the substrate of the at least one second chip 104, patterning the one or more ILD and/or IMD layers (e.g. using a combination of photolithography and etching processes) to form openings therein, and forming the conductive features in the openings of the one or more ILD and/or IMD layers (e.g. by depositing a seed layer in the patterns formed in the one or more ILD and/or IMD layers and overfilling the patterns with a conductive material which may be planarized subsequently). The conductive features may include, or may be, conductive lines and/or vias, which may comprise a conductive material such as copper, aluminum, tungsten, combinations thereof, or the like. The one or more ILD and/or IMD layers may include, or may consist of, low-k dielectric materials having k values, for example, less than or equal to about 4.0 (e.g. less than or equal to about 2.8) disposed between the conductive features. In some embodiments, the one or more ILD and/or IMD layers of the interconnect structure may be include, or may consist of, for example, silicon oxide, SiCOH, USG, or the like.

The at least one second chip 104 may include input/output (I/O) features that may be formed over the interconnect structure of the at least one second chip 104, as an example. For example, the at least one second chip 104 may comprise a plurality of second contact pads 110 that may function as I/O features of the at least one second chip 104. The plurality of second contact pads 110 may be formed at a first surface 104a of the at least one second chip 104. The plurality of second contact pads 110 may comprise similar materials as the plurality of first contact pads 106p, 106i. The plurality of second contact pads 110 may be formed using similar processes as the plurality of first contact pads 106p, 106i. In the example shown in FIG. 1, surfaces 110a of the plurality of second contact pads 110 facing away from the second surface 104b of the at least one second chip 104 are substantially coplanar with the first surface 104a of the at least one second chip 104. However, in another example, the surfaces 110a of the plurality of second contact pads 110 may protrude from the first surface 104a of the at least one second chip 104, e.g. in a direction away from the second surface 104b of the at least one second chip 104. The plurality of second contact pads 110 may be electrically connected to the one or more active devices of the at least one second chip 104 through the various conductive features in the interconnect structure of the at least one second chip 104.

The package 100 may also include a plurality of first conductive pillars 112 electrically connected to the plurality of second contact pads 110. For example, a respective conductive pillar of the plurality of first conductive pillars 112 may be electrically and/or physically contacting a respective contact pad of the plurality of second contact pads 110. The first conductive pillars 112 may include, or may consist of, copper, tungsten, combinations thereof, or the like.

The package 100 may include a first polymer layer 114 disposed at the first surface 104a of the at least one second chip 104. The first polymer layer 114 may additionally surround the plurality of first conductive pillars 112. A surface 114a of the first polymer layer 114 facing away from the first surface 104a of the at least one second chip 104 may be substantially coplanar with surfaces 112a of the plurality of first conductive pillars 112 facing away from the first surface 104a of the at least one second chip 104, as shown in the example of FIG. 1. The first polymer layer 114 may include, or may consist of, an electrically insulating material, such as polyimide (PI), polybenzoxazole (PBO), benzocyclobuten (BCB), epoxy, silicone, acrylates, nano-filled pheno resin, siloxane, a fluorinated polymer, polynorbornene, or the like.

In an embodiment, the first polymer layer 114 may be formed by coating or depositing a suitable insulating material (e.g. PI, PBO, etc.) over the first surface 104a of the at least one second chip 104, and patterning the insulating material to form a plurality of openings therein (e.g. using a combination of photolithography and etching processes). The plurality of first conductive pillars 112 may thereafter be formed in the plurality of openings of the patterned first polymer layer 114 by filling the plurality of openings of the patterned first polymer layer 114 with conductive material. The filling of the plurality of openings of the patterned first polymer layer 114 may include depositing a seed layer in the plurality of openings and plating the plurality of openings (e.g. electro-chemically plating, electroless plating, and the like) with a conductive material. The conductive material may overfill the plurality of openings of the patterned first polymer layer 114, and a planarizing process (e.g. an etching process or a chemical-mechanical polishing (CMP) process) may be performed to remove excess portions of the conductive material over the first polymer layer 114 to form the plurality of first conductive pillars 112.

In another embodiment, the plurality of first conductive pillars 112 may already be formed over the plurality of second contact pads 110 (e.g. by electro-chemically plating, electroless plating, or the like). The first polymer layer 114 may thereafter be formed over the first surface 104a of the at least one second chip 104 and over the plurality of first conductive pillars 112 (e.g. by a coating or deposition process). Such a step may cover the first surface 104a of the at least one second chip 104 and the surfaces 112a of the plurality of first conductive pillars 112 facing away from the first surface 104a of the at least one second chip 104. The first polymer layer 114 may subsequently be planarized (e.g. using a CMP process or an etching process) to expose the surfaces 112a of the first conductive pillars 112 facing away from the first surface 104a of the at least one second chip 104.

The package 100 may include a second RDL 116 formed at the side of the first polymer layer 114 facing away from the at least one second chip 104. As an example, the first polymer layer 114 may be disposed between the second surface 104b of the at least one second chip 104 and the second RDL 116. As shown in the example of FIG. 1, the at least one first chip 102 and the at least one second chip 104 may be disposed within a lateral dimension L2 of the second RDL 116.

The second RDL 116 may include conductive features 116c (e.g. conductive lines and/or vias) formed in one or more second dielectric layers 116d. The conductive features 116c may be formed in one or more metallization layers of the second RDL 116. The one or more second dielectric layers 116d of the second RDL 116 may be formed of any suitable insulating and/or polymer material (e.g. PI, PBO, BCB, epoxy, silicone, acrylates, nano-filled pheno resin, siloxane, a fluorinated polymer, polynorbornene, or the like) using any suitable method, such as, spin-on coating, sputtering, or the like. The formation of the conductive features 116c in the one or more second dielectric layers 116d may include patterning the one or more second dielectric layers 116d (e.g. using a combination of photolithography and etching processes) and forming the conductive features 116c in the patterned one or more second dielectric layers 116d (e.g. by a damascene and/or dual damascene process).

The conductive features 116c of the second RDL 116 may be electrically coupled to the plurality of first conductive pillars 112. Consequently, the at least one second chip 104 may be electrically coupled to the second RDL 116 through the plurality of second contact pads 110 and the plurality of first conductive pillars 112. As shown in the example of FIG. 1, electrical connections from the plurality of first conductive pillars 112 may be fanned-out by the second RDL 116. Accordingly, the second RDL 116 may be referred to as a fan-out structure of the package 100.

The conductive features 116c of the second RDL 116 may additionally be electrically coupled to the at least one first chip 102 through at least one second conductive pillar 118, which may be laterally separated from the at least one second chip 104. Four second conductive pillars 118 are shown in the example of FIG. 1 (e.g. two on each side of the at least one second chip 104); however, the number of second conductive pillars 118 may be different in other embodiments. The at least one second conductive pillar 118 may be a via that extends between the second RDL 116 and the first RDL 103. The at least one second conductive pillar 118 may be disposed within the portion 102p of the at least one first chip 102 disposed outside the lateral extent L1 of the at least one second chip 104, as shown in the example of FIG. 1. The at least one second conductive pillar 118 may additionally be electrically coupled to the first RDL 103, thereby electrically connecting the second RDL 116 and the at least one first chip 102 (e.g. the plurality of first contact pads 106p, 106i of the at least one first chip 102) to each other. As a result of the arrangement shown in FIG. 1, the at least one first chip 102 and the at least one second chip 104 may be electrically coupled through an electrical path that comprises the plurality of first contact pads 106p, 106i, the first RDL 103, the at least one second conductive pillar 118, the conductive features 116c of the second RDL 116, the plurality of first conductive pillars 112, and the plurality of second contact pads 110. The at least one second conductive pillar 118 may comprise similar materials as the plurality of first conductive pillars 112.

The package 100 may include a molding compound 120 that encapsulates (e.g. at least laterally encapsulate) the at least one first chip 102, the at least one second chip 104, and the at least one second conductive pillar 118. The molding compound 120 may additionally encapsulate (e.g. fully encapsulate) the first adhesive layer 108 and the first polymer layer 114 The molding compound 120 may include any suitable material such as an epoxy resin, a molding underfill, or the like. The molding compound 120 may have a first surface 120a facing the second RDL 116, and a second surface 120b opposite the first surface 120a. The first surface 120a of the molding compound may be substantially coplanar with the surfaces 112a of the plurality of first conductive pillars 112 and the surface 114a of the first polymer layer 114 facing away from the first surface 104a of the at least one second chip 104. The second surface 120b of the molding compound 120 may be substantially coplanar with the second surface 102b of the at least one first chip 102, as shown in the example of FIG. 1.

As described above, the first polymer layer 114 may comprise at least one of PI, PBO, BCB, epoxy, silicone, acrylates, nano-filled pheno resin, siloxane, a fluorinated polymer, or polynorbornene. These materials may have a coefficient of thermal expansion (CTE) and/or a modulus of elasticity that is intermediate that of the molding compound 120 and the plurality of first conductive pillars 112, thus reducing the mechanical and thermal stress formed between the plurality of first conductive pillars 112 and the molding compound 120. As an example, the material of the first polymer layer 114 may have a modulus of elasticity in a range from about 0.5 GPa to about 5.0 GPa (e.g. about 2.1 GPa) below glass transition temperature. Accordingly, the material of the first polymer layer 114 may be more compliant (e.g. less brittle or more pliable) compared to the molding compound 120. As another example, the material of the first polymer layer 114 may comprise a material having a CTE in a range from about 10 ppm/° C. to about 100 ppm/° C. (e.g. about 80 ppm/° C.) below glass transition temperature.

The package 100 may include additional package features, such as a plurality of external connectors 122 that may be disposed at a surface of the second RDL 116 facing away from the at least one first chip 102 and the at least one second chip 104. The external connectors 122 may be a ball grid array (BGA), controlled collapse chip connector (C4) bumps, or the like. The external connectors 122 may be electrically connected to the at least one second conductive pillar 118 by way of the second RDL 116. Furthermore, the external connectors 122 may be electrically connected to the plurality of first conductive pillars 112 by way of the second RDL 116. The external connectors 122 may be used to electrically connect the package 100 to other package components such as another device die, interposers, package substrates, printed circuit boards, a mother board, or the like.

The package 100 may additionally include a second adhesive layer 124 disposed at the second surface 120b of the molding compound 120 and the second surface 102b of the at least one first chip 102. The second adhesive layer 124 may comprise similar materials as the first adhesive layer 108 and may attach a heat sink 126 to the second surface 120b of the molding compound 120 and the second surface 102b of the at least one first chip 102. The heat sink 126 may comprise a thermally conductive material such as tin, copper, or the like, and may function to dissipate heat generated in the at least one first chip 102 and the at least one second chip 104.

In summary, the package 100 shown in FIG. 1 may include the second RDL 116 and the at least one first chip 102, which may include the plurality of first contact pads 106p, 106i. As shown in FIG. 1, the plurality of first contact pads 106p, 106i faces the second RDL 116. The package 100 also includes the at least one second chip 104, which is disposed between the at least one first chip 102 and the second RDL 116. Furthermore, the portion 102p of the at least one first chip 102 is disposed outside the lateral extent L1 of the at least one second chip 104. The package 100 further includes a conductive via (e.g. the at least one second conductive pillar 118) laterally separated from the at least one second chip 104. The conductive via (e.g. the at least one second conductive pillar 118) extends between the second RDL 116 and a contact pad 106p of the plurality of first contact pads 106p, 106i, in which the contact pad 106 is located in the portion 102p of the at least one first chip 102 disposed outside the lateral extent L1 of the at least one second chip 104.

As another summary, the package 100 shown in FIG. 1 may include the plurality of dynamic random access memory (DRAM) chips 102 laterally adjacent to each other, each of the plurality of DRAM chips 102 having the plurality of first contact pads 106p, 106i disposed at the first surface 102a thereof. The package 100 also includes the logic chip 104 attached to the first surfaces 102a of the plurality of DRAM chips 102. The logic chip 104 may have the plurality of second contact pads 110 disposed at the first surface 104a thereof. As shown in FIG. 1, the first surface 104a of the logic chip 104 faces away from the plurality of DRAM chips 102. Furthermore, the plurality of first conductive pillars 112 has first ends coupled to the plurality of second contact pads 110 of the logic chip 104. The package 100 also includes the second RDL 116 coupled to second ends of the plurality of first conductive pillars 112 opposite the first ends, and the plurality of second conductive pillars 118 are laterally separated from the logic chip 104. The plurality of second conductive pillars 118 extend between the second RDL 116 and the first group 106p of the plurality of first contact pads, which is disposed outside the width L1 of the logic chip 104.

In package-on-package structures, different chip packages having different functionalities are stacked one atop of another. As described above, the at least one first chip 102 and the at least one second chip 104 may differ in function. Consequently, compared to package-on-package structures, the package 100 shown in the example of FIG. 1 may be able to accommodate chips having different functionalities into a single package. This feature of the package 100 may be referred to as heterogeneous chip integration. Consequently, the package 100 may not be subject to package type limitations observed in package-on-package structures where a respective package has one or more chips having the same functionality formed therein.

Furthermore, in the package 100, the at least one first chip 102 (e.g. DRAM chip) and the at least one second chip 104 (e.g. logic chip) form a chip stack having a back-to-front configuration where the first surface 102a (e.g. front side) of the at least one first chip 102 and the second surface 104b (e.g. back side) of the at least one second chip 104 face each other. Furthermore, as shown in the example of FIG. 1, a space between the at least one first chip 102 and the at least one second chip 104 is devoid of an underfill or electrical connections between the at least one first chip 102 and the at least one second chip 104. Instead, the first adhesive layer 108 fills the space between the at least one first chip 102 and the at least one second chip 104. Since the first adhesive layer 108 may comprise an electrically insulating material, electrical connections between the at least one first chip 102 and the at least one second chip 104 may be made through the second RDL 116 and the at least one second conductive pillar 118. This electrical path between the at least one first chip 102 and the at least one second chip 104 (which may differ in function) of the package 100 may be shorter compared to an electrical path between different chip packages in a package-on-package structure. This can, in turn lead to better RC performance in the package 100 compared to package-on-package structures.

Even further, since heterogeneous chip integration may be achieved in the package 100 with the inclusion of chips having different functionalities into a single package, a form factor (e.g. first dimension D1) of the package 100 may be smaller than a form factor of a package-on-package structure. This may result in greater integration density in systems including the package 100 and less warpage in the package 100 compared to a package-on-package structure. The decrease in warpage in the package 100 compared to a package-on-package structure can also lead to lower stresses in the package 100 and, thus, higher reliability of the package 100 compared to a package-on-package structure.

Figure 2A:
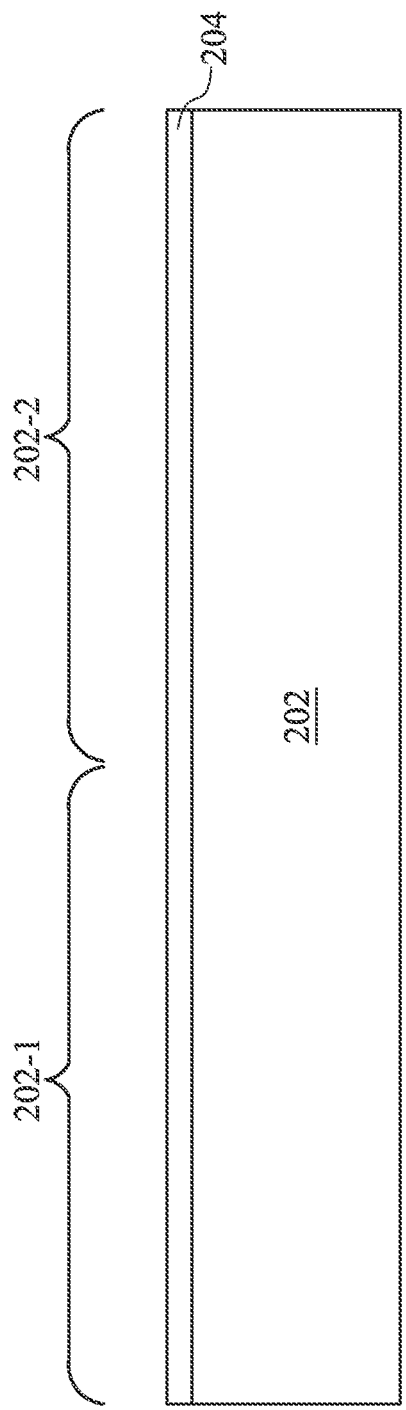
FIGS. 2A to 2J show a process flow illustrating some of the steps of a method of forming the multi-chip package shown in FIG. 1, in accordance with an embodiment.

FIGS. 2A to 2J show a process flow illustrating some of the steps of a method of forming the package 100 shown in FIG. 1, in accordance with one or more embodiments. FIG. 2A shows a carrier 202, which may provide temporary mechanical and structural support to the features of the package 100 that are formed during subsequent processing steps. The carrier 202 may comprise, for example, glass, silicon, silicon oxide, aluminum oxide, or the like. The carrier 202 may, as an example, be a carrier wafer, and a plurality of packages 100 may be formed over the carrier 202. As an example, a first one of the package 100 may be formed in a first portion 202-1 of the carrier 202, while a second one of the package 100 may be formed (e.g. simultaneously formed) in a second portion 202-2 of the carrier 202.

FIG. 2A also shows an optional third adhesive layer 204 formed over the carrier 202 (e.g. by a process that rolls and attaches the third adhesive layer 204 to the carrier 202). The third adhesive layer 204 may be formed of a Light-to-Heat Conversion (LTHC) material, for example, although other types of adhesives may be used. In accordance with some embodiments, the third adhesive layer 204 may be capable of decomposing under the heat of light, and hence can release the carrier 202 from the structures formed thereon (e.g. see description below in respect of FIG. 2I).

Figure 2B:
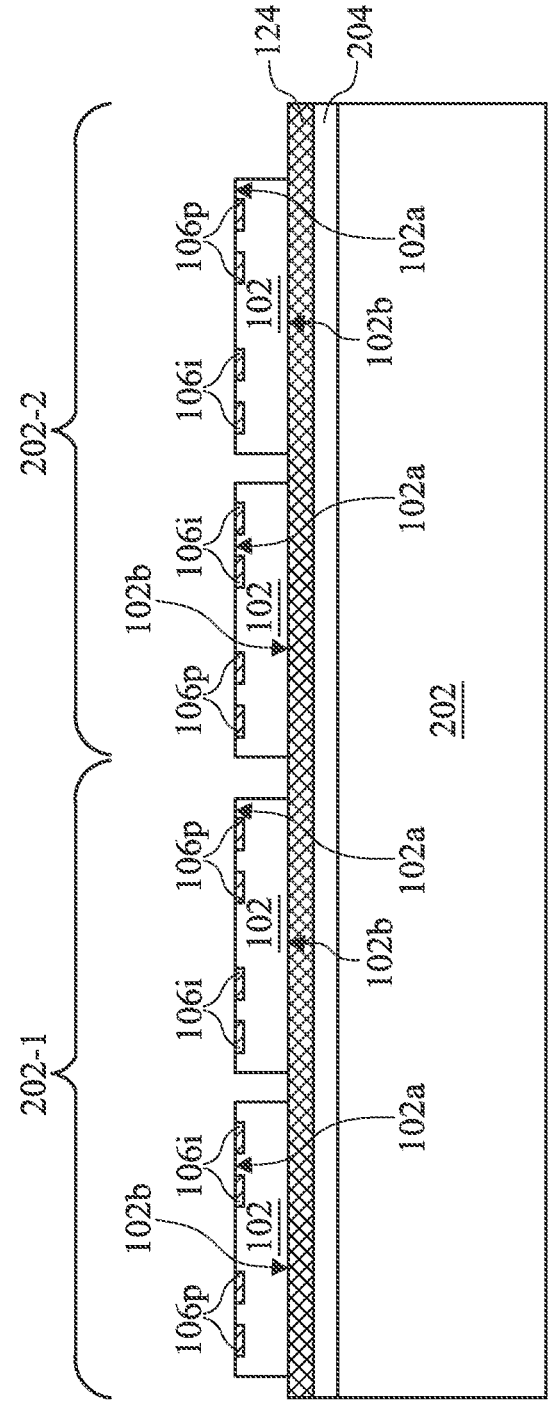

Referring to FIG. 2B, the second adhesive layer 124 may be formed over the third adhesive layer 204 (e.g. by a process that rolls and attaches the second adhesive layer 124 to the third adhesive layer 204). In an embodiment, the second adhesive layer 124 may differ in composition from the third adhesive layer 204. As an example, the second adhesive layer 124 may be free from a LTHC material, which may prevent the second adhesive layer 124 from deteriorating or decomposing when the third adhesive layer 204 is exposed to light in an attempt to release the carrier 202 from the structures formed thereon.

FIG. 2B also shows a plurality of first chips 102 formed over the second adhesive layer 124. As shown in the example of FIG. 2B, at least one first chip 102 may be formed (e.g. using a pick and place process) over the second adhesive layer 124 in the first portion 202-1 of the carrier 202, while at least one first chip 102 may be formed (e.g. using a pick and place process) over the second adhesive layer 124 in the second portion 202-2 of the carrier 202. As illustrated in the example of FIG. 2B, the first surface 102a of the at least one first chip 102 may face away from the carrier 202, while the second surface 102b of the at least one first chip 102 may face the carrier 202 and may be in contact (e.g. physical contact) with the second adhesive layer 124.

Figure 2C:
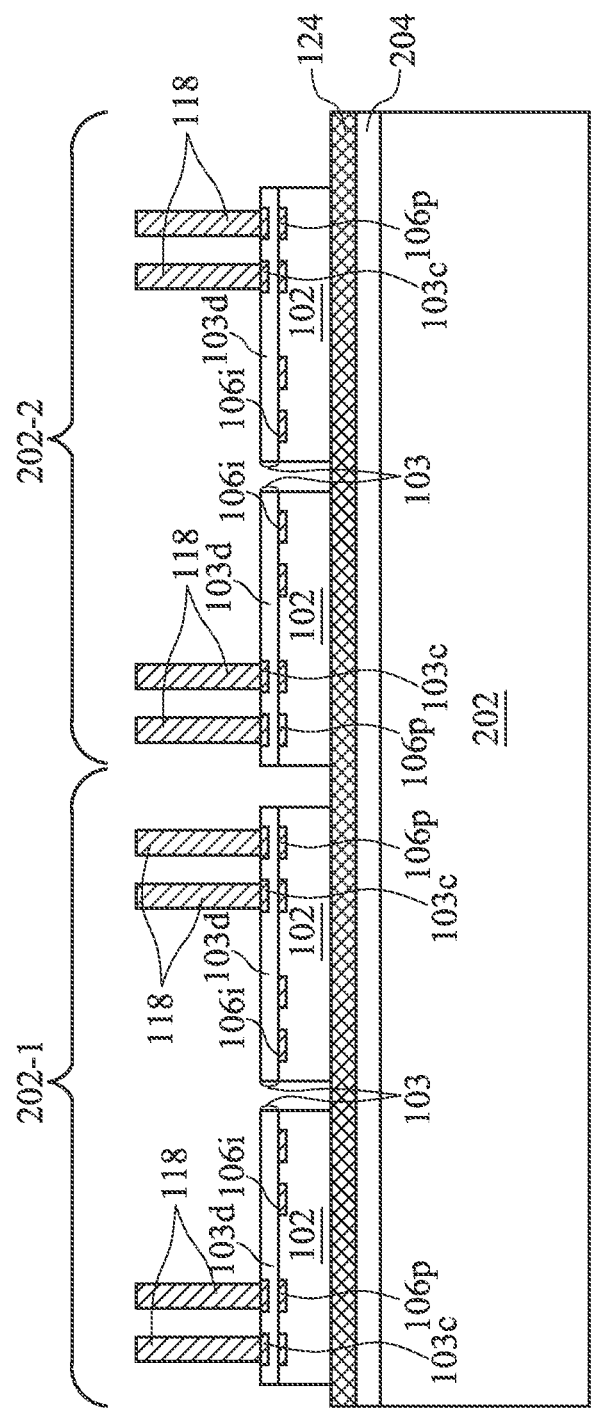

Referring to FIG. 2C, the process flow continues with the formation of the first RDL 103 in each of the first portion 202-1 and the second portion 202-2 of the carrier 202. A respective first RDL 103 may be formed over a respective first chip 102 (e.g. over the first surface 102a of the respective first chip 102). The first RDL 103 may be formed using one or more of the processes described above in relation to FIG. 1. The first RDL 103 may include conductive features 103c formed in one or more first dielectric layers 103d. The plurality of first contact pads 106p, 106i may be coupled (e.g. electrically and/or physically coupled) to the conductive features 103c of the first RDL 103.

Also shown in FIG. 2C, following the formation of the first RDL 103, the at least one second conductive pillar 118 may be formed over the first RDL 103 (e.g. over the conductive features 103c of the first RDL 103). The at least one second conductive pillar 118 may be formed by any suitable techniques such as electroplating. Other processes of formation such as sputtering, evaporation, plasma enhanced chemical vapor deposition (PECVD) and/or the like may alternatively be used depending upon the desired materials.

Figure 2D:
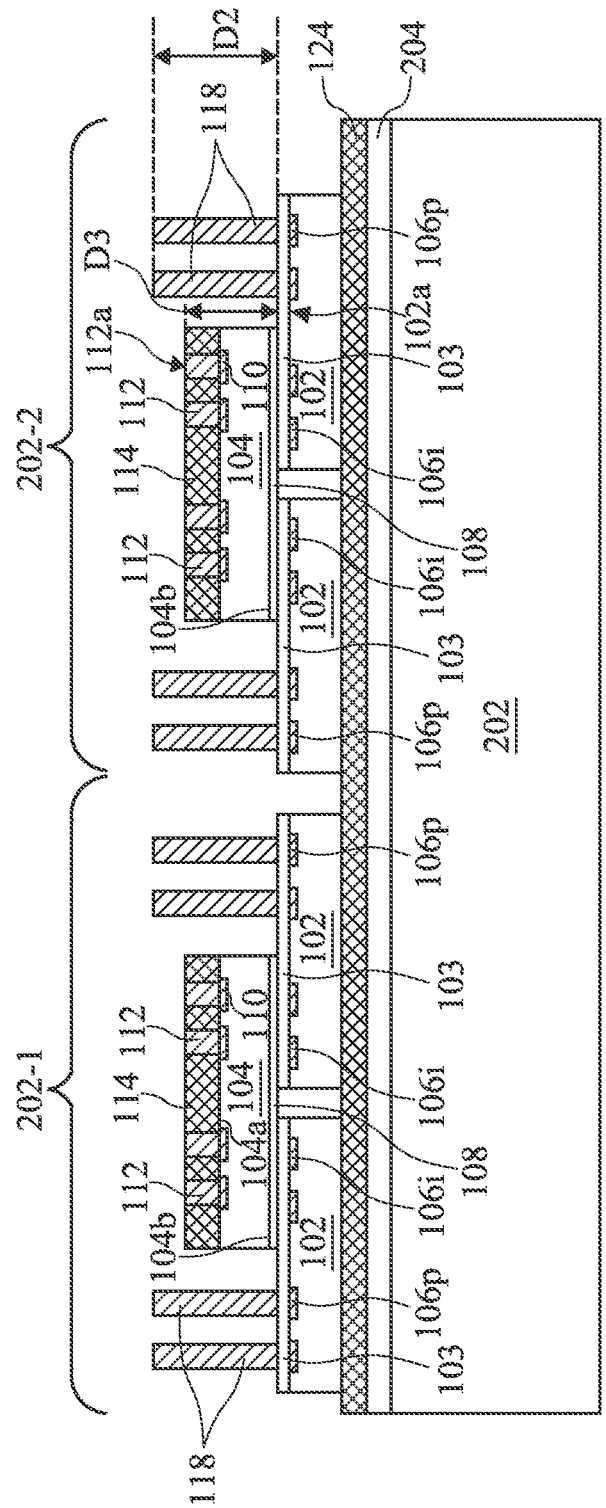

Referring to FIG. 2D, in each of the first portion 202-1 and the second portion 202-2 of the carrier 202, the at least one second chip 104 may be formed over the first RDL 103 (e.g. using a pick and place process). In the example shown in FIG. 2D, in each of the first portion 202-1 and the second portion 202-2 of the carrier 202, the at least one second chip 104 may be disposed over the first contact pads 106i located in the interior regions of the first portion 202-1 and the second portion 202-2 of the carrier 202. As shown in FIG. 2D, the first adhesive layer 108 may be disposed between the first RDL 103 and the at least one second chip 104. In some embodiments, the first adhesive layer 108 may first be formed at the second surface 104b of the at least one second chip 104, and subsequently, the at least one second chip 104 having the first adhesive layer 108 at the second surface 104b thereof may be picked and placed over the first RDL 103 and over the first contact pads 106i located in the interior regions of the first portion 202-1 and the second portion 202-2 of the carrier 202. As shown in FIG. 2D, the at least one second chip 104 may additionally have the plurality of first conductive pillars 112 formed over the plurality of second contact pads 110 of the at least one second chip 104. The plurality of first conductive pillars 112 may additionally be surrounded by the first polymer layer 114. In some embodiments, the plurality of first conductive pillars 112 and the first polymer layer 114 may first be formed over the first surface 104a of the at least one second chip 104, and subsequently, the at least one second chip 104 having the plurality of first conductive pillars 112 and the first polymer layer 114 may be picked and placed over the first contact pads 106i located in the interior regions of the first portion 202-1 and the second portion 202-2 of the carrier 202.

As shown in FIG. 2D, the at least one second conductive pillar 118 may have a second dimension D2 (e.g. a height), which may be measured in a direction substantially perpendicular to the first RDL 103. In like manner, the at least one second chip 104 may have a third dimension D3, which may be measured in a direction substantially perpendicular to the first RDL 103. As an example, the third dimension D3 may be a distance between the first RDL 103 and the surfaces 112a of the plurality of first conductive pillars 112 facing away from the first surface 104a of the at least one second chip 104. In an embodiment, the second dimension D2 may be in a range from about 50 micrometers to about 100 micrometers. As another example, the second dimension D2 may be about 20 percent to 30 percent greater than the third dimension D3. Accordingly, the second dimension D2 of the at least one second conductive pillar 118 may be determined based on the third dimension D3 of the at least one second chip 104, and subsequently, the at least one second conductive pillar 118 may be formed based on the determined second dimension D2.

In the examples shown in FIGS. 2C and 2D, the at least one second conductive pillar 118 is formed prior to placing the at least one second chip 104 over the first RDL 103 and over the at least one first chip 102. However, in another embodiment, this order may be reversed, e.g., the at least one second chip 104 may be placed over the first RDL 103 and over the first contact pads 106i located in the interior regions of the first portion 202-1 and the second portion 202-2 of the carrier 202, and thereafter, the at least one second conductive pillar 118 may be formed over the first RDL 103 and over the first contact pads 106p located in peripheral regions of the first portion 202-1 of the carrier 202 and the second portion 202-2 of the carrier 202.

Figure 2E:
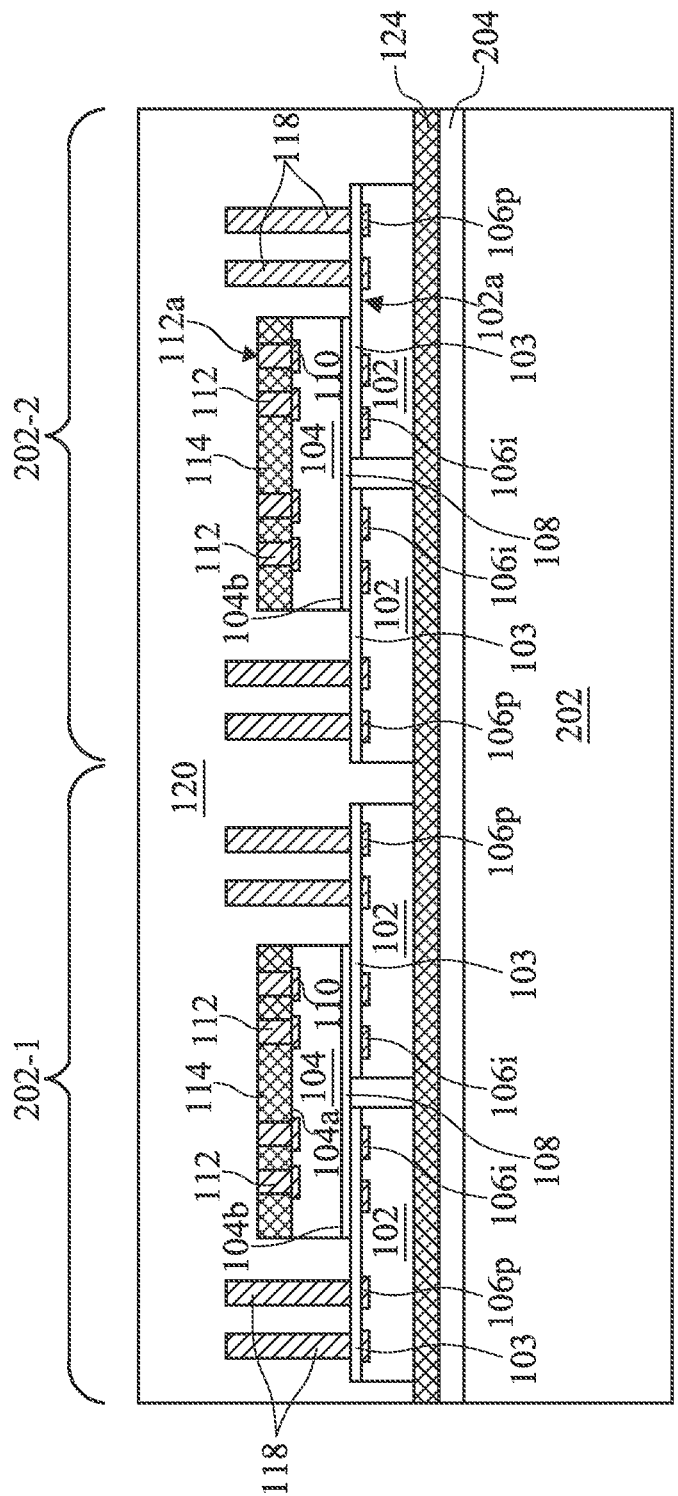

Referring to FIG. 2E, in each of the first portion 202-1 and the second portion 202-2 of the carrier 202, the molding compound 120 may be formed over and at least laterally encapsulate the at least one second chip 104, the first RDL 103, and the at least one first chip 102. The molding compound 120 may additionally be formed around and over the at least one second conductive pillar 118. In some embodiments, the molding compound 120 is shaped or molded using for example, a mold (not shown) which may have a border or other feature for retaining molding compound 120 when applied. Such a mold may be used to pressure mold the molding compound 120 over and/or around at least one first chip 102, the first RDL 103, the at least one second chip 104, and the at least one second conductive pillar 118 to force the molding compound 120 into openings and recesses, eliminating air pockets or the like in the molding compound 120.

Figure 2F:
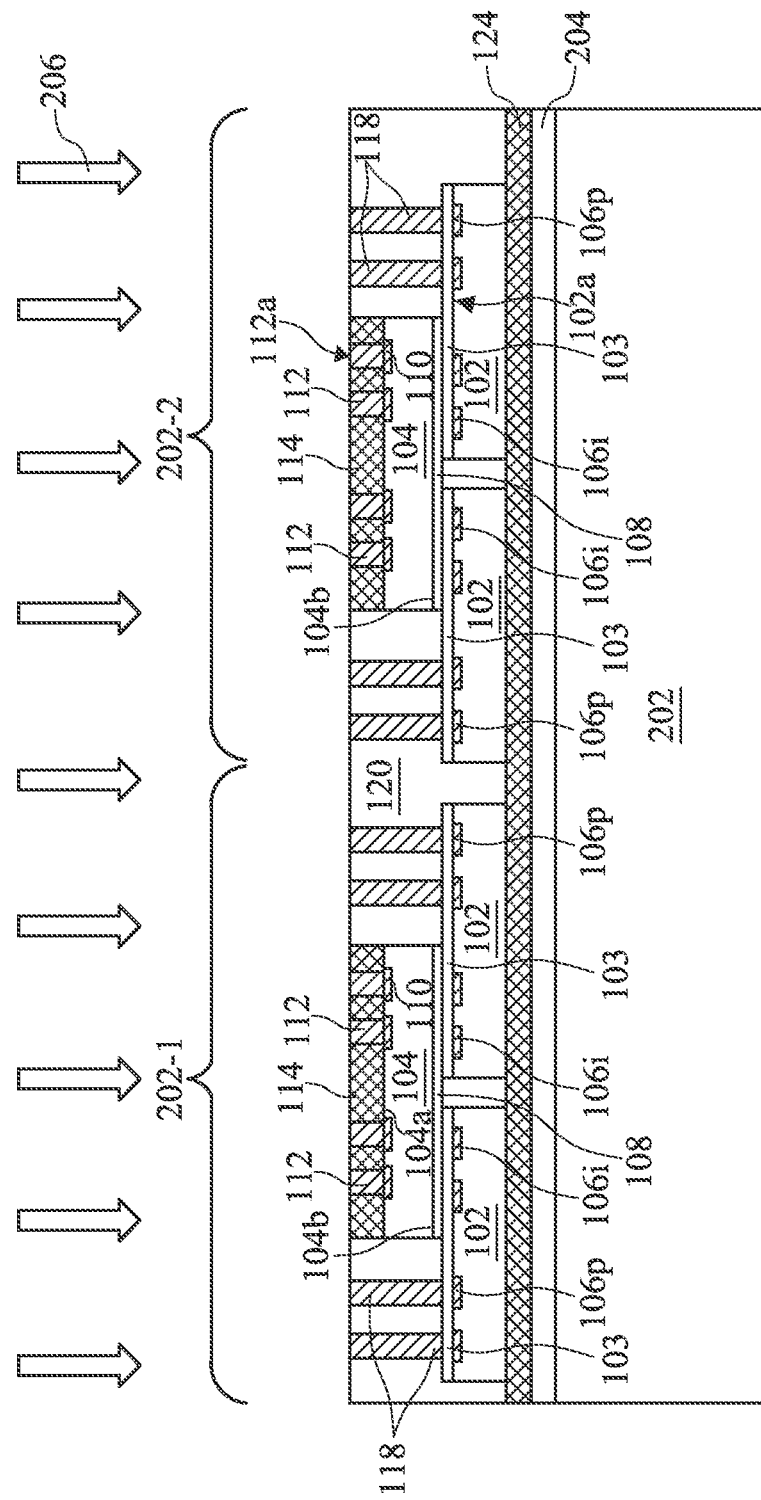

Referring to FIG. 2F, a first thinning process 206 may be performed on the molding compound 120 to expose the at least one second conductive pillar 118 and the plurality of first conductive pillars 112. As a result of the first thinning process 206, the first polymer layer 114 may also be exposed. The first thinning process 206 may be performed using an etching process and/or a planarization process, such as a mechanical grinding process or a CMP process.

Figure 2G:
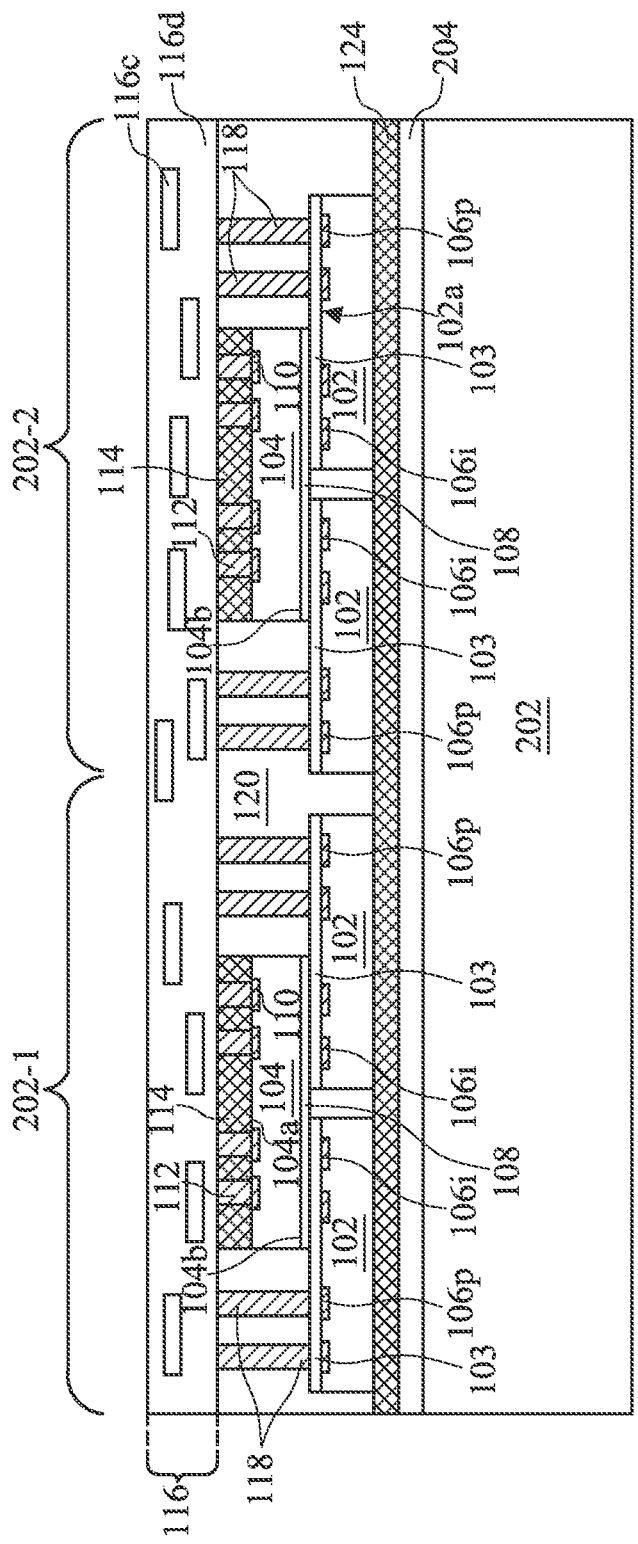

Referring to FIG. 2G, in each of the first portion 202-1 and the second portion 202-2 of the carrier 202, the second RDL 116 may be formed over the molding compound 120, the at least one second conductive pillar 118, the plurality of first conductive pillars 112, and the first polymer layer 114. The second RDL 116 may be formed using one or more of the processes described above in relation to FIG. 1. The conductive features 116c of the second RDL 116 may be coupled (e.g. electrically and/or physically coupled) to the at least one second conductive pillar 118 and the plurality of first conductive pillars 112.

Figure 2H:
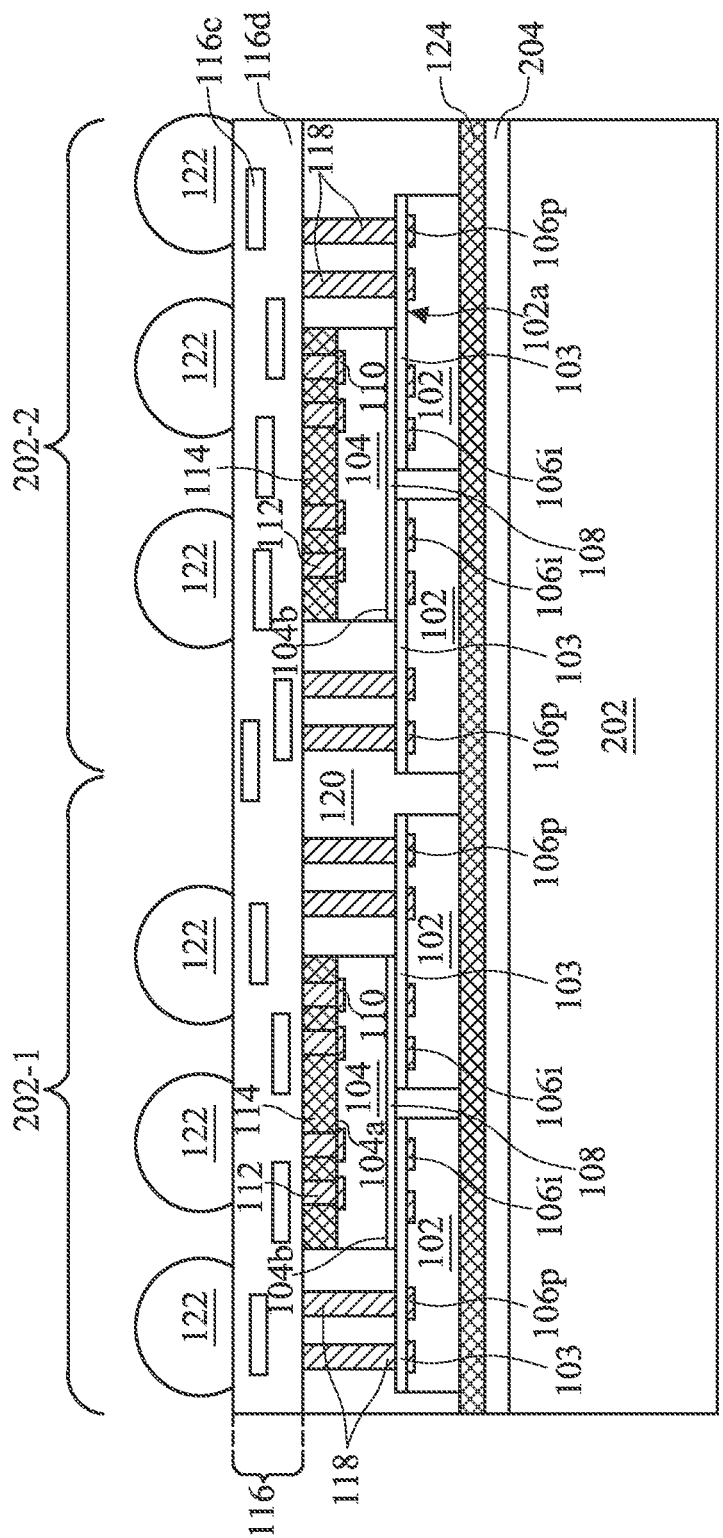

Referring to FIG. 2H, in each of the first portion 202-1 and the second portion 202-2 of the carrier 202, some of the conductive features 116c of the second RDL 116 may be exposed (e.g. by a laser opening process and/or etching process), and the external connectors 122 may thereafter be formed over the exposed conductive features 116c of the second RDL 116 (e.g. by a BGA mounting process).

Figure 2I:
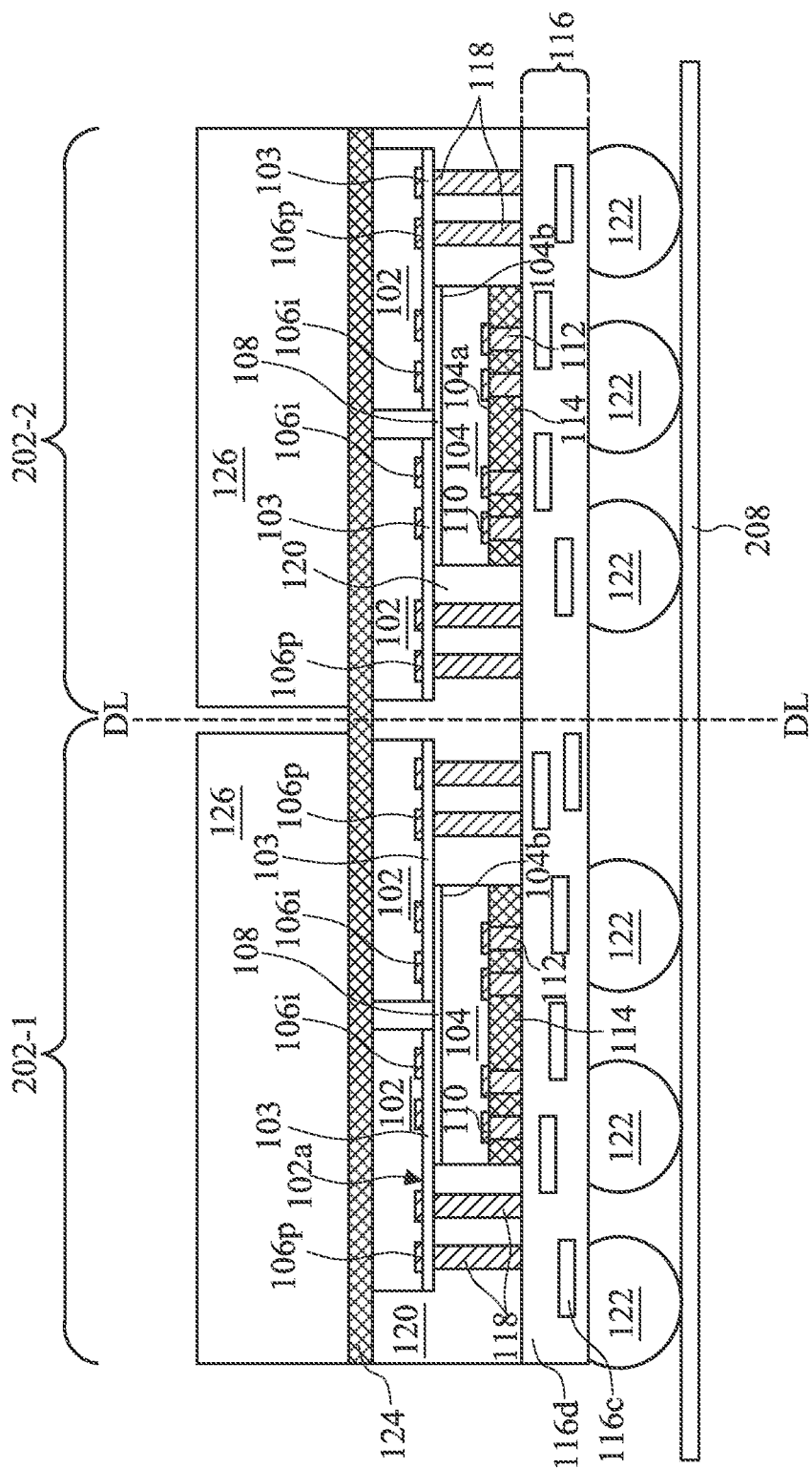

Referring to FIG. 2I, the carrier 202 may be inverted and the external connectors 122 may be mounted (e.g. frame mounted) onto a dicing tape 208. Additionally, the carrier 202 may be debonded from the second adhesive layer 124, e.g. by decomposing the third adhesive layer 204 under the heat of light, thereby releasing the carrier 202 from the second adhesive layer 124. Since the second adhesive layer 124 is free from the LTHC material, exposure to the heat of light does not decompose the second adhesive layer 124. In other embodiments, a thermal debonding process or a laser debonding process may be utilized, depending upon the precise adhesive chosen for the third adhesive layer 204.

Figure 2J:
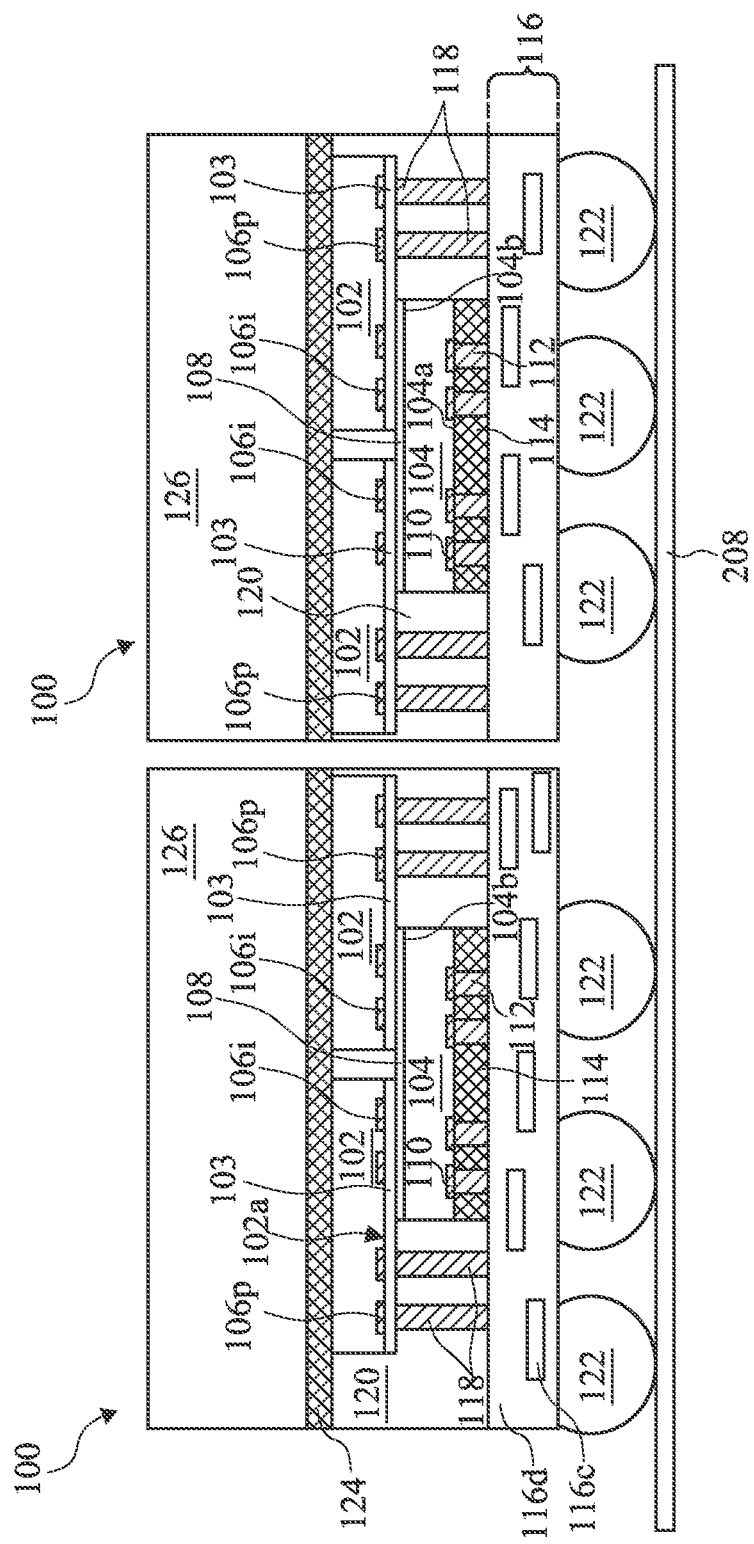

Referring to FIG. 2J, a first one of the heat sink 126 may be attached to the second adhesive layer 124 in the first portion 202-1 of the carrier 202, while a second one of the heat sink 126 may be attached to the second adhesive layer 124 in the second portion 202-2 of the carrier 202. Following this, the structure shown in FIG. 2I may be singulated or diced (e.g. along dicing line DL), thereby forming a plurality of packages 100 (as shown in FIG. 2J), each of which may be substantially identical to the package 100 shown in FIG. 1. Following this, dimensions of the plurality of packages 100 may be inspected (e.g. optically inspected).

Figure 3A:
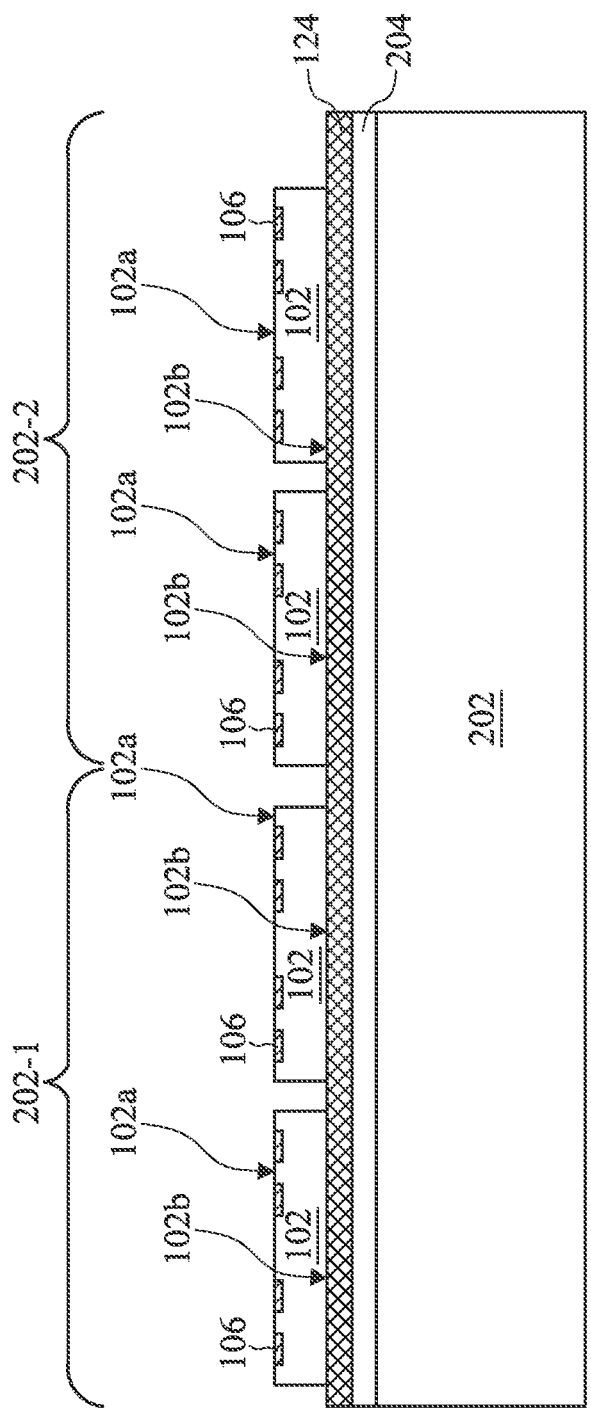

FIGS. 3A to 3K show a process flow illustrating some of the steps of another method of forming the multi-chip package shown in FIG. 1, in accordance with an embodiment. Referring to FIG. 3A, the plurality of first chips 102 formed over the second adhesive layer 124. As shown in the example of FIG. 3A, at least one first chip 102 may be formed (e.g. using a pick and place process) over the second adhesive layer 124 in the first portion 202-1 of the carrier 202, while at least one first chip 102 may be formed (e.g. using a pick and place process) over the second adhesive layer 124 in the second portion 202-2 of the carrier 202. As illustrated in the example of FIG. 3A, the first surface 102a of the at least one first chip 102 may face away from the carrier 202, while the second surface 102b of the at least one first chip 102 may face the carrier 202 and may be in contact (e.g. physical contact) with the second adhesive layer 124. For the sake of simplicity, the plurality of first contact pads 106p, 106i is denoted with reference numeral 106 in FIG. 3A.

Figure 3B:
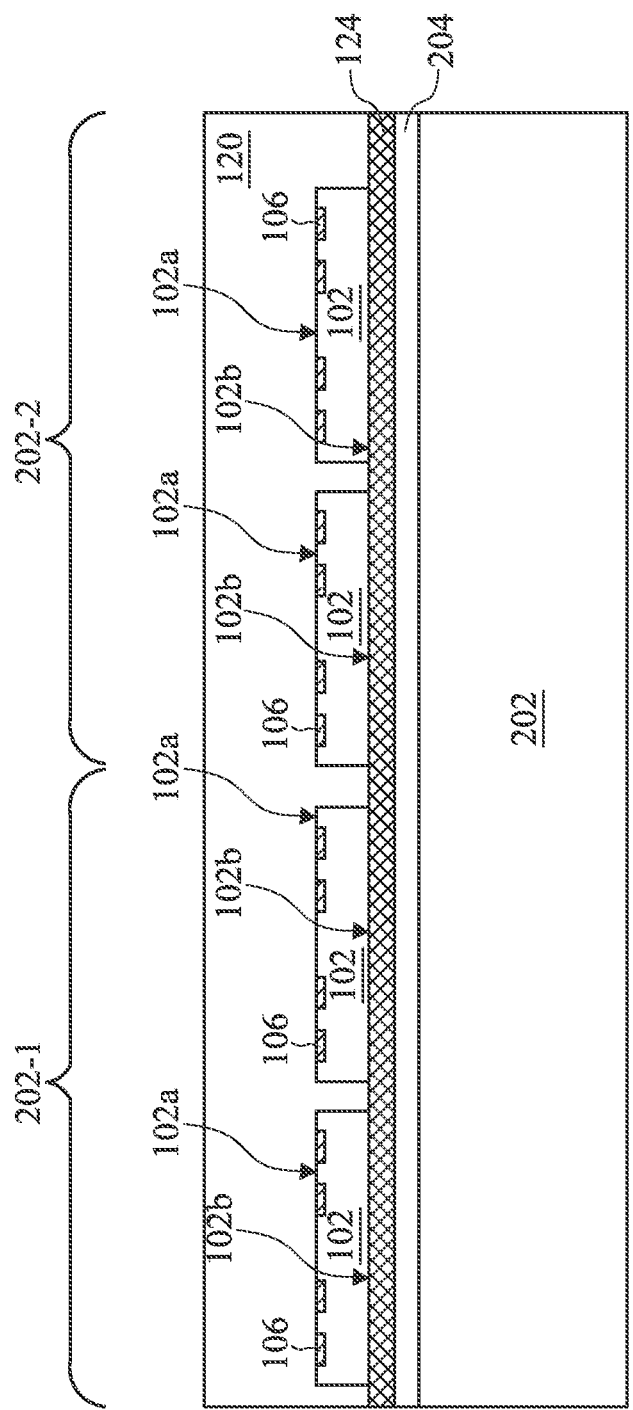

Referring to FIG. 3B, in each of the first portion 202-1 and the second portion 202-2 of the carrier 202, the molding compound 120 may be formed over and encapsulate the at least one first chip 102. In some embodiments, the molding compound 120 is shaped or molded using for example, a mold (not shown) which may have a border or other feature for retaining molding compound 120 when applied. Such a mold may be used to pressure mold the molding compound 120 over and around at least one first chip 102 and into openings and recesses, eliminating air pockets or the like in the molding compound 120.

Figure 3C:
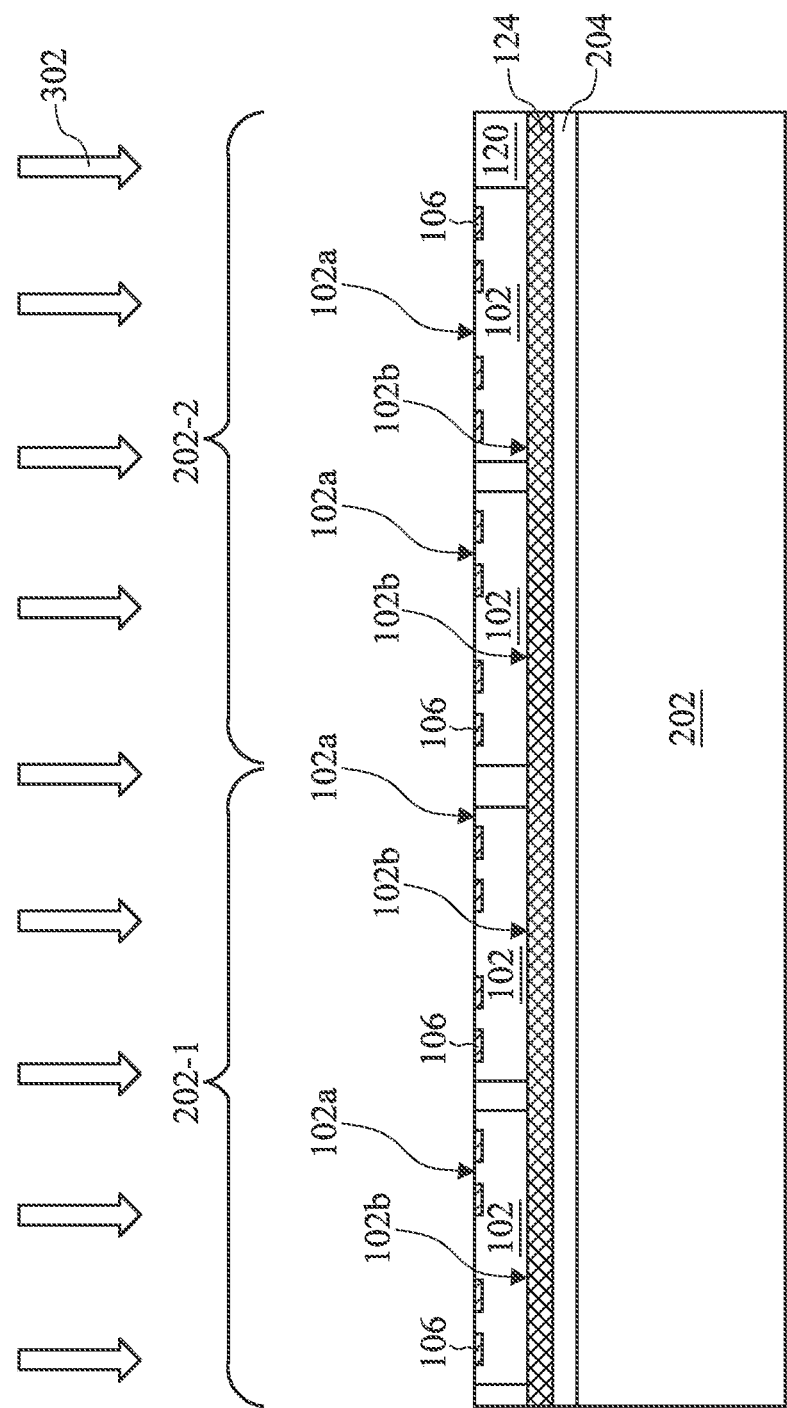

Referring to FIG. 3C, a second thinning process 302 may be performed on the molding compound 120 to expose the plurality of first contact pads 106. As a result of the second thinning process 302, the first surface 102a of the at least one first chip 102 may also be exposed. The second thinning process 302 may be performed using an etching process and/or a planarization process, such as a mechanical grinding process or a CMP process.

Figure 3D:
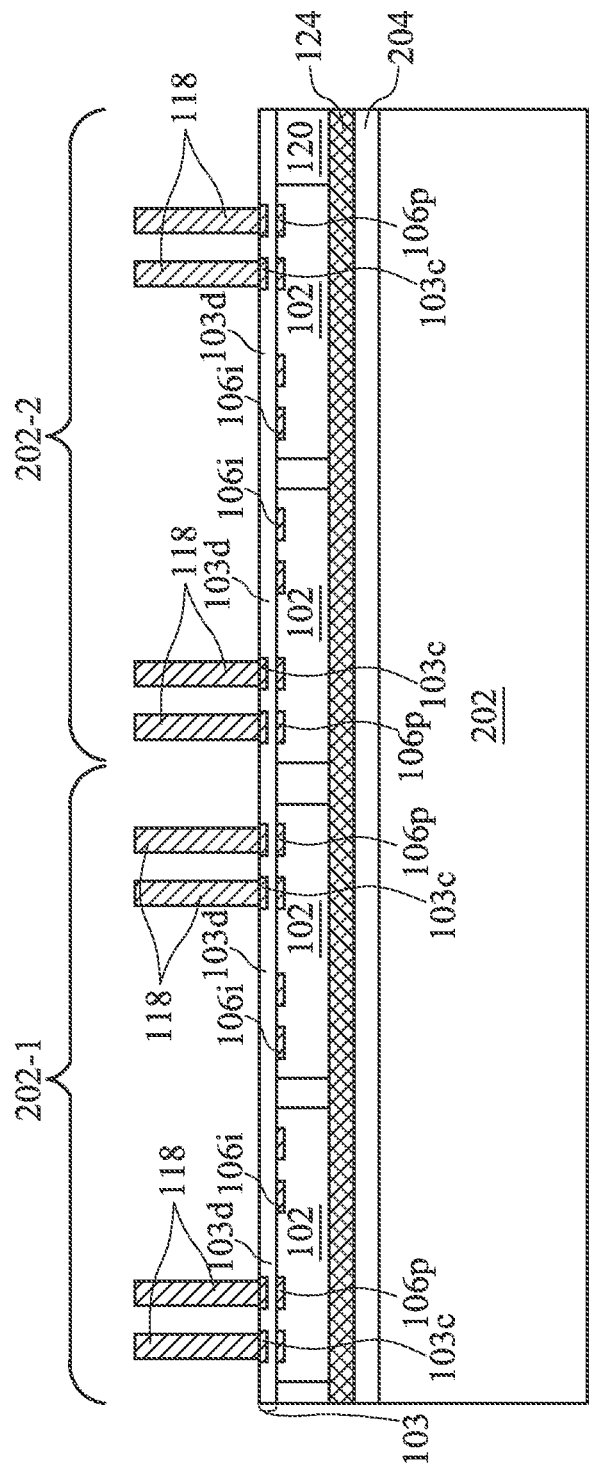

Referring to FIG. 3D, the process flow continues with the formation of the first RDL 103 over the at least one first chip 102, and the formation of the at least one second conductive pillar 118 over the first RDL 103. The plurality of first contact pads 106p, 106i may be electrically coupled to the first RDL 103 (e.g. to the conductive features 103c of the first RDL 103). The first RDL 103 may additionally be electrically coupled to the at least one second conductive pillar 118. The at least one second conductive pillar 118 may be formed by one or more of the processes described above in relation to FIG. 2C. The one or more first dielectric layers 103d may be formed by a spin coating process. This may be followed by the formation of the conductive features 103c in the one or more first dielectric layers 103d of the first RDL 103, which may include patterning the one or more first dielectric layers 103d (e.g. using a combination of photolithography and etching processes) and forming the conductive features 103c in the patterned one or more first dielectric layers (e.g. by a damascene and/or dual damascene process).

Figure 3E:
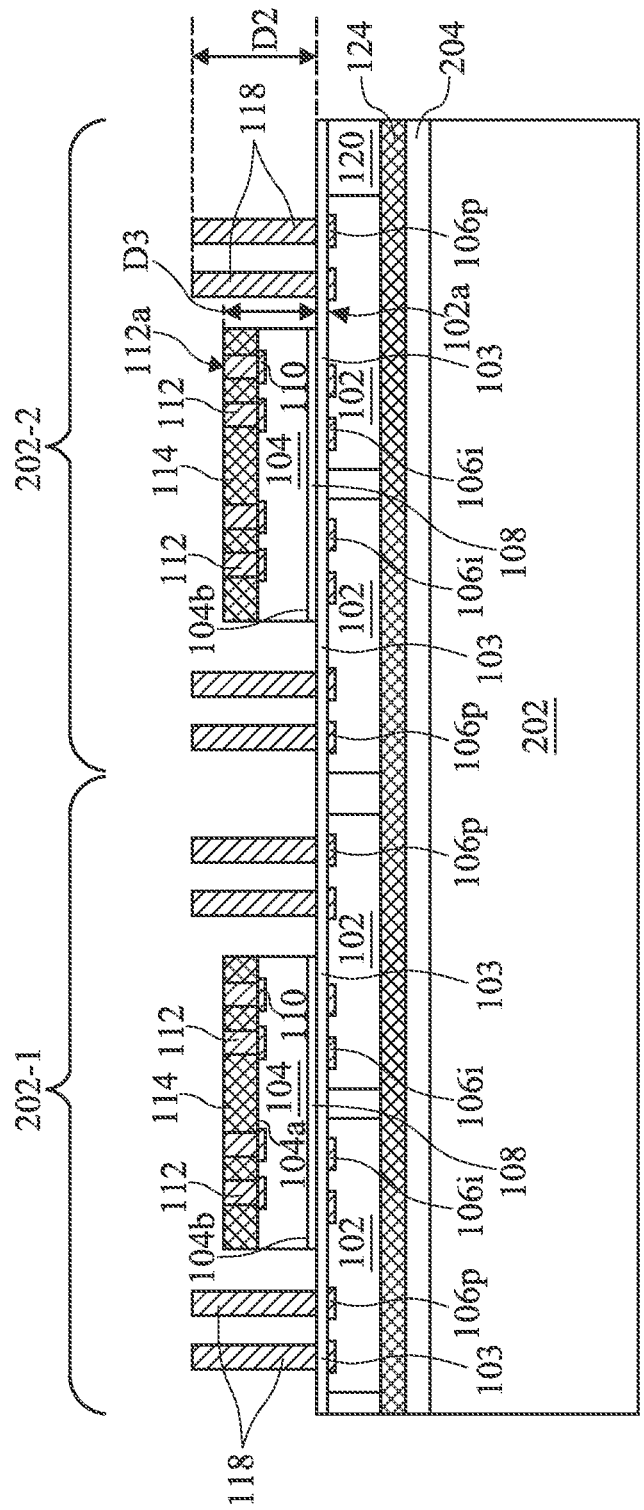

Referring to FIG. 3E, in each of the first portion 202-1 and the second portion 202-2 of the carrier 202, the at least one second chip 104 may be formed over the first RDL 103 (e.g. using a pick and place process). In the example shown in FIG. 3E, in each of the first portion 202-1 and the second portion 202-2 of the carrier 202, the at least one second chip 104 may be disposed over the first contact pads 106i located in the interior regions of the first portion 202-1 and the second portion 202-2 of the carrier 202. As shown in FIG. 3E, the first adhesive layer 108 may be disposed between the first RDL 103 and the at least one second chip 104. In some embodiments, the first adhesive layer 108 may first be formed at the second surface 104b of the at least one second chip 104, and subsequently, the at least one second chip 104 having the first adhesive layer 108 at the second surface 104b thereof may be picked and placed over the first contact pads 106i located in the interior regions of the first portion 202-1 and the second portion 202-2 of the carrier 202. As shown in FIG. 3E, the at least one second chip 104 may additionally have the plurality of first conductive pillars 112 formed over the plurality of second contact pads 110 of the at least one second chip 104. The plurality of first conductive pillars 112 may additionally be surrounded by the first polymer layer 114. In some embodiments, the plurality of first conductive pillars 112 and the first polymer layer 114 may first be formed over the first surface 104a of the at least one second chip 104, and subsequently, the at least one second chip 104 having the plurality of first conductive pillars 112 and the first polymer layer 114 may be picked and placed over the first contact pads 106i located in the interior regions of the first portion 202-1 and the second portion 202-2 of the carrier 202.

As shown in FIG. 3E, the at least one second conductive pillar 118 may have the second dimension D2 (e.g. a height), while the at least one second chip 104 may have the third dimension D3, which may be measured in a direction substantially perpendicular to the first surface 102a of the at least one first chip 102. As described above in respect of FIG. 2D, the second dimension D2 of the at least one second conductive pillar 118 may be determined based on the third dimension D3 of the at least one second chip 104, and subsequently, the at least one second conductive pillar 118 may be formed based on the determined second dimension D2.

In the examples shown in FIGS. 3D and 3E, the at least one second conductive pillar 118 is formed prior to placing the at least one second chip 104 over the at least one first chip 102. However, in another embodiment, this order may be reversed, e.g., the at least one first chip 102 may be placed over the first contact pads 106i located in the interior regions of the first portion 202-1 and the second portion 202-2 of the carrier 202, and thereafter, the at least one second conductive pillar 118 may be formed over the first contact pads 106p located in peripheral regions of the first portion 202-1 of the carrier 202 and the second portion 202-2 of the carrier 202.

Figure 3F:
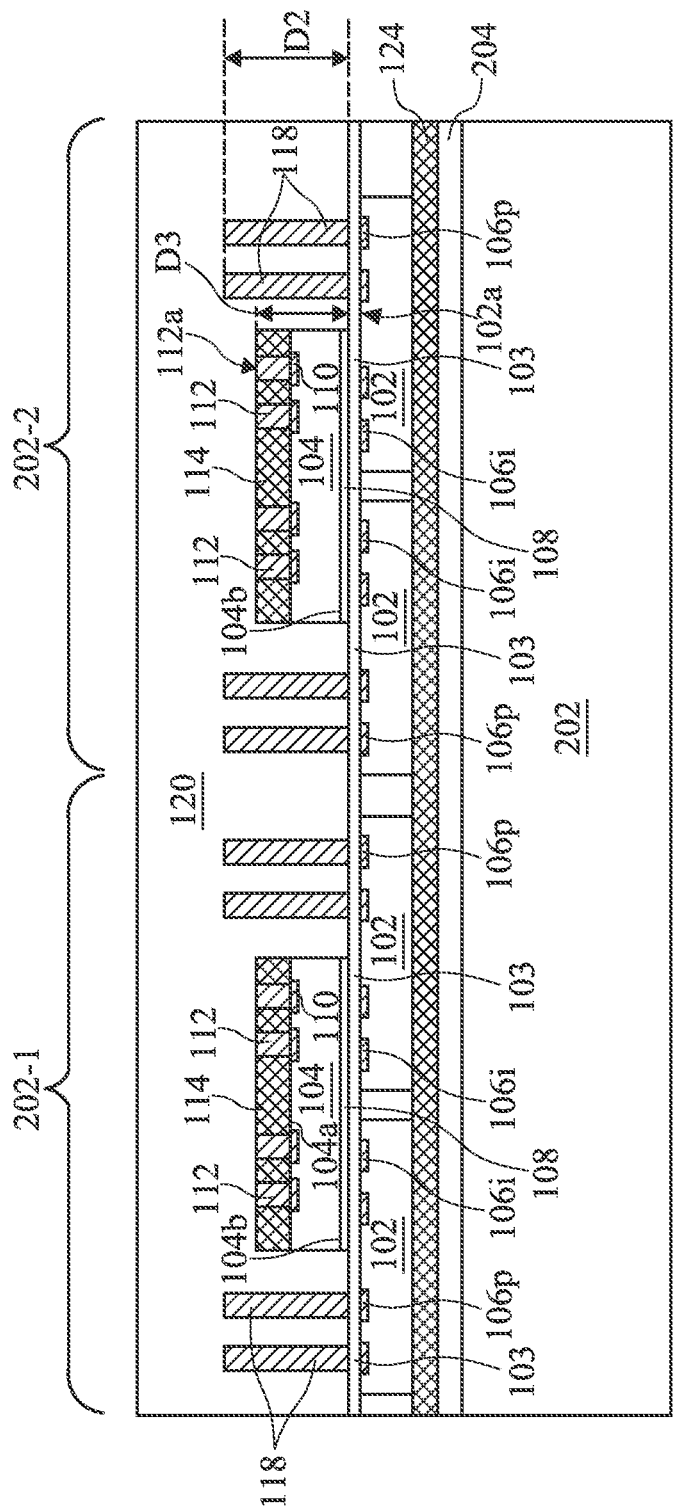
Figure 3G:
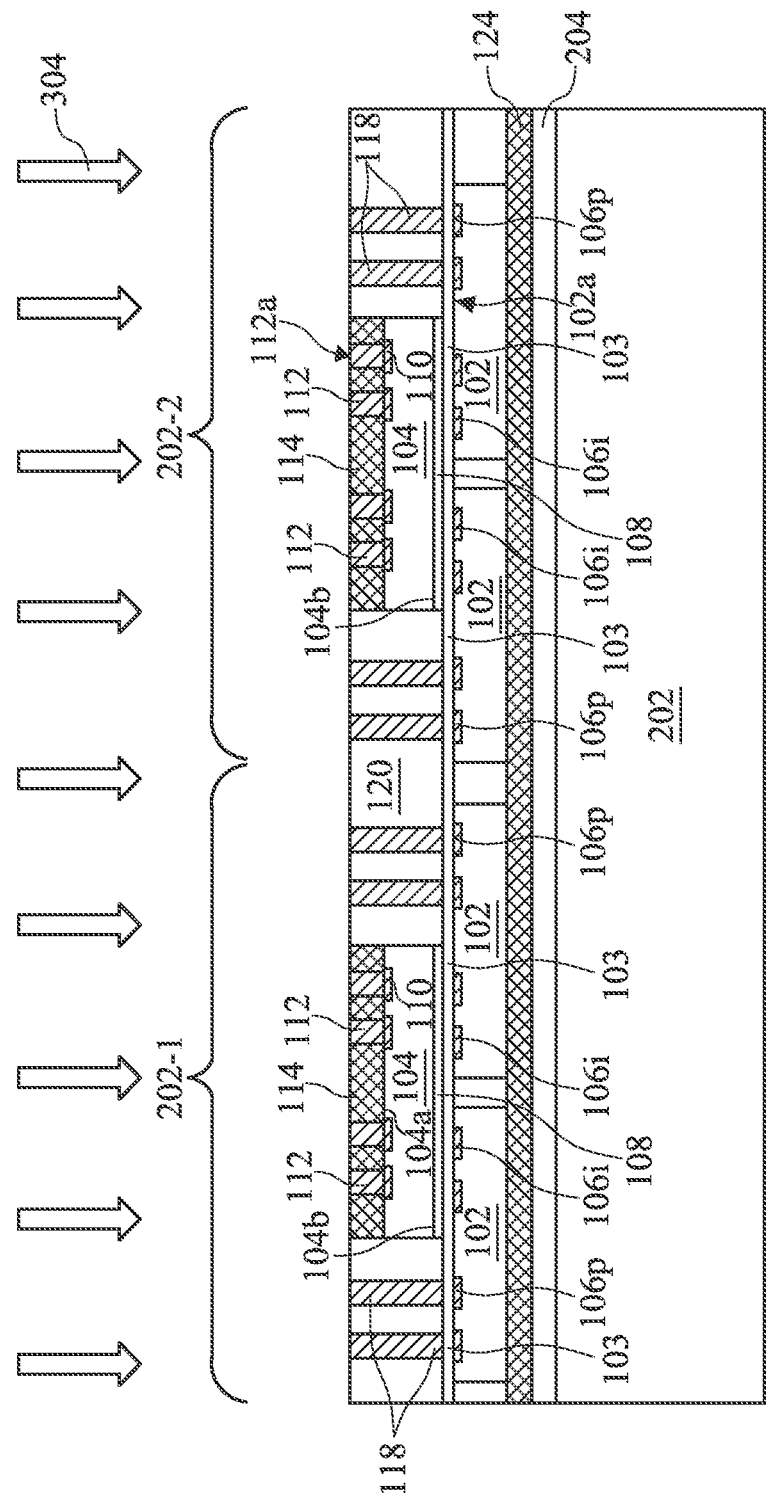

Referring to FIG. 3F, in each of the first portion 202-1 and the second portion 202-2 of the carrier 202, the molding compound 120 may be extended (e.g. vertically extended) to encapsulate (e.g. fully encapsulate) the at least one second chip 104 and the at least one second conductive pillar 118. In some embodiments, the molding compound 120 is shaped or molded using similar processes described above in respect of FIG. 3B. Referring to FIG. 3G, a third thinning process 304 may be performed on the molding compound 120 to expose the at least one second conductive pillar 118 and the plurality of first conductive pillars 112. As a result of the third thinning process 304, the first polymer layer 114 may also be exposed. The third thinning process 304 may comprise similar processes as described above in respect of the second thinning process 302.

Figure 3H:
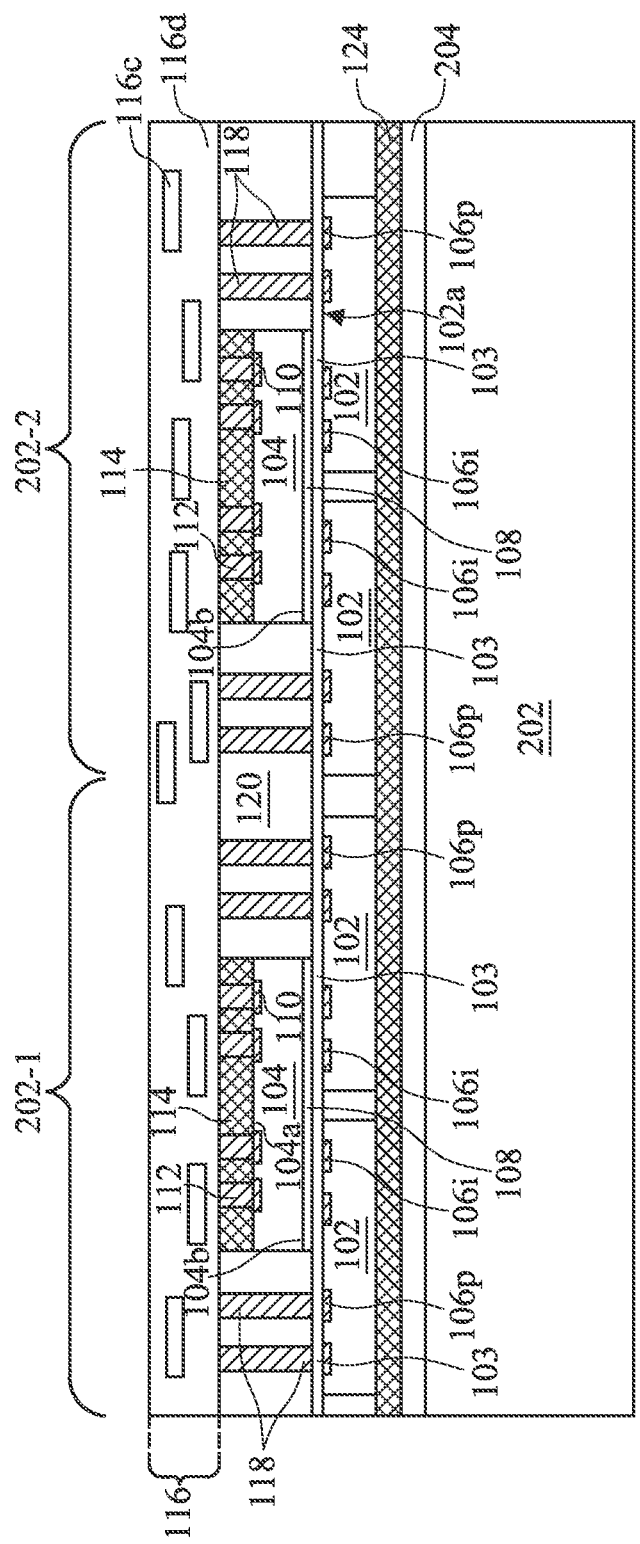

Referring to FIG. 3H, in each of the first portion 202-1 and the second portion 202-2 of the carrier 202, the second RDL 116 may be formed over the molding compound 120, the at least one second conductive pillar 118, the plurality of first conductive pillars 112, and the first polymer layer 114. The second RDL 116 may be formed using one or more of the processes described above in relation to FIG. 1. The conductive features 116c of the second RDL 116 may be coupled (e.g. electrically and/or physically coupled) to the at least one second conductive pillar 118 and the plurality of first conductive pillars 112.

Figure 3I:
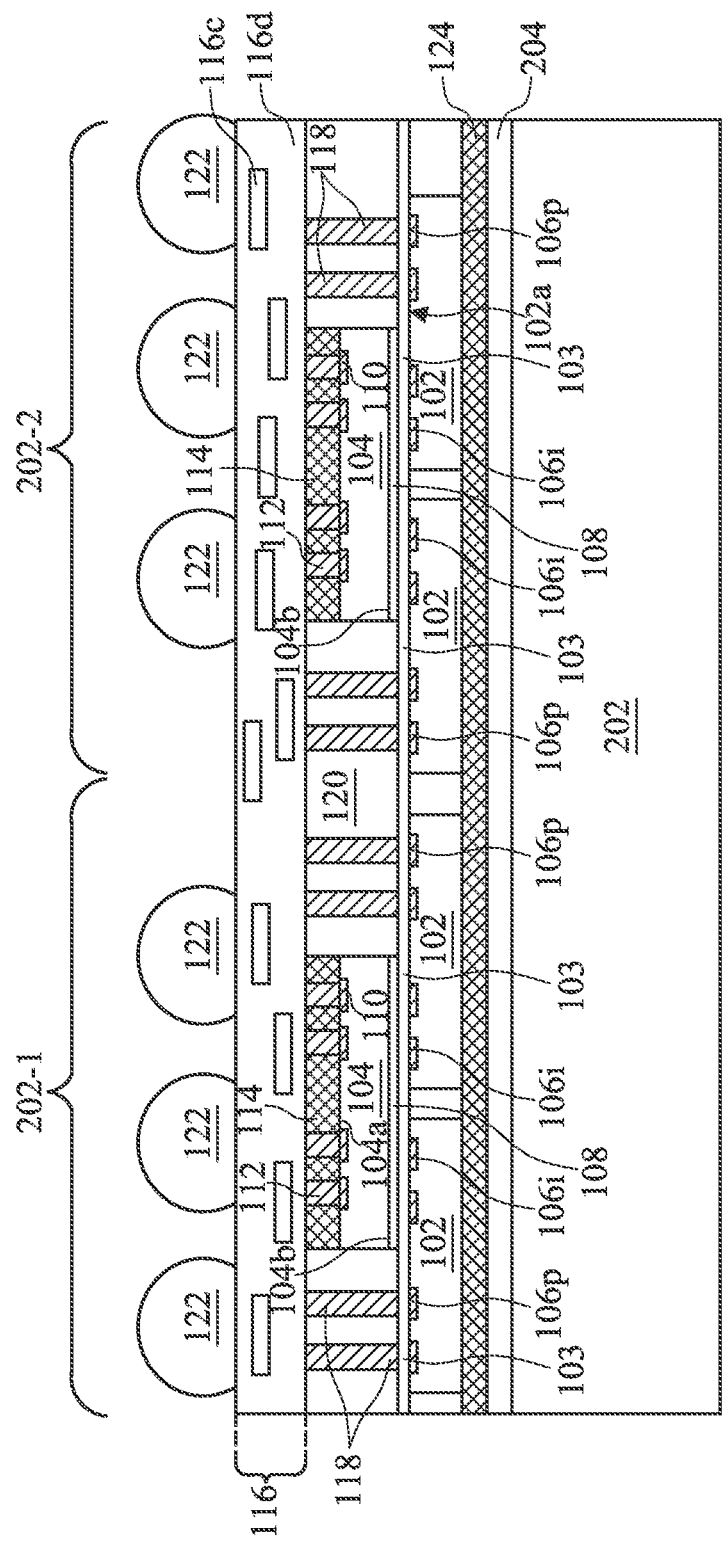

Referring to FIG. 3I, in each of the first portion 202-1 and the second portion 202-2 of the carrier 202, some of the conductive features 116c of the second RDL 116 may be exposed (e.g. by a laser opening process and/or etching process), and the external connectors 122 may thereafter be formed over the exposed conductive features 116c of the second RDL 116 (e.g. by a BGA mounting process).

Figure 3J:
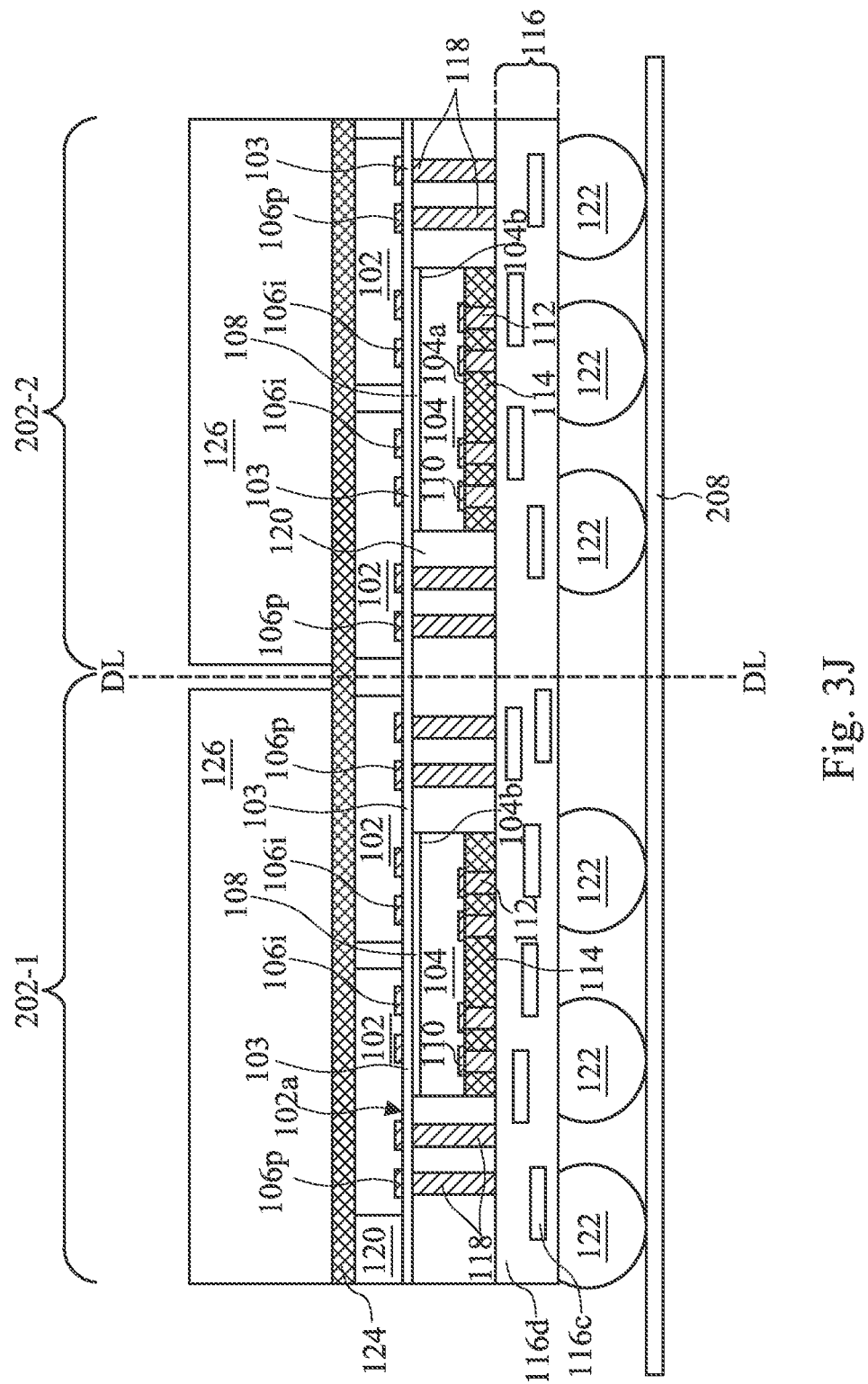

Referring to FIG. 3J, the carrier 202 may be inverted and the external connectors 122 may be mounted (e.g. frame mounted) onto the dicing tape 208. Additionally, the carrier 202 may be debonded from the second adhesive layer 124, e.g. by decomposing the third adhesive layer 204 under the heat of light, thereby releasing the carrier 202 from the second adhesive layer 124. Since the second adhesive layer 124 is free from the LTHC material, exposure to the heat of light does not decompose the second adhesive layer 124. In other embodiments, a thermal debonding process or a laser debonding process may be utilized, depending upon the precise adhesive chosen for the third adhesive layer 204.

As shown in FIG. 3J, the first one of the heat sink 126 may be attached to the second adhesive layer 124 in the first portion 202-1 of the carrier 202, while the second one of the heat sink 126 may be attached to the second adhesive layer 124 in the second portion 202-2 of the carrier 202. Following this, the structure shown in FIG. 3J may be singulated or diced (e.g. along dicing line DL), thereby forming a plurality of packages 100 (as shown in FIG. 3K), each of which may be substantially identical to the package 100 shown in FIG. 1. Following this, dimensions of the plurality of packages 100 may be inspected (e.g. optically inspected).

In the process flows shown in FIGS. 2A to 2J and 3A to 3K, a first one of the at least one first chip 102 may be placed in the first portion 202-1 of the carrier 202, while a second one of the at least one first chip 102 may be placed in the second portion 202-2 of the carrier 202. This may be accomplished by initially dicing a wafer including the first and second ones of the at least one first chip 102 and subsequently placing the diced first chips 102 over the carrier 202 in the first portion 202-1 and the second portion 202-2 of the carrier 202. As shown in the examples of FIGS. 2A to 2J and 3A to 3K, this may be followed by the formation of the first RDL 103 and the at least one second conductive pillar 118 over each of the diced first chips 102.

Figure 4A:
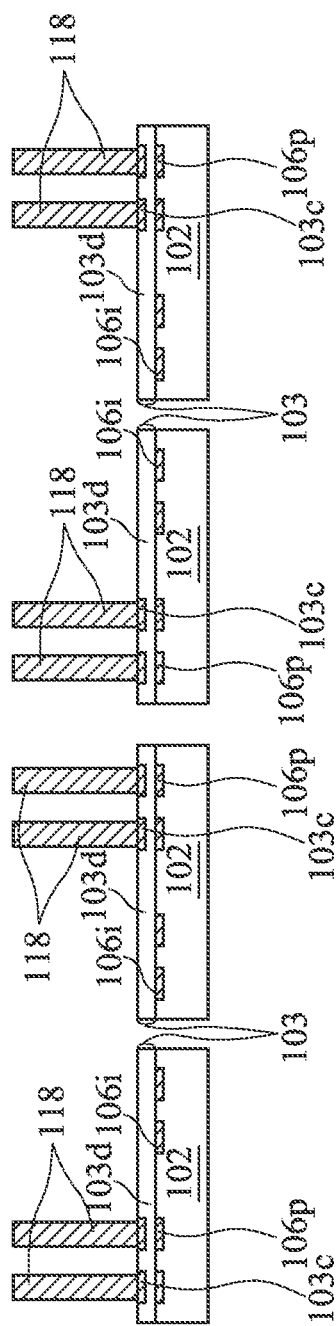
FIGS. 4A to 4I show a process flow illustrating some of the steps of yet another method of forming the multi-chip package shown in FIG. 1, in accordance with an embodiment.
Figure 4B:
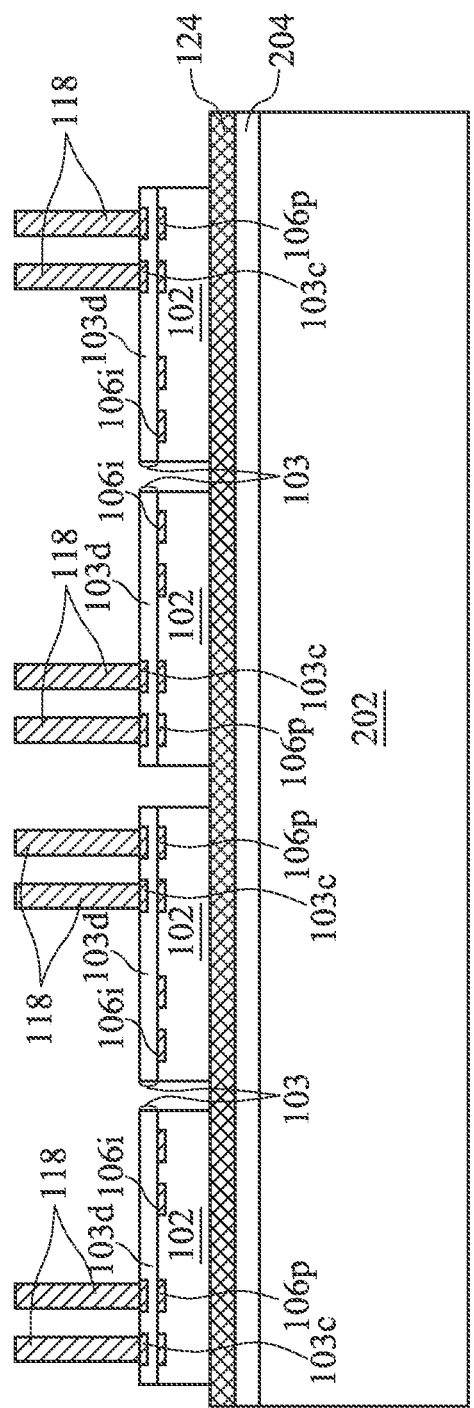
Figure 4C:
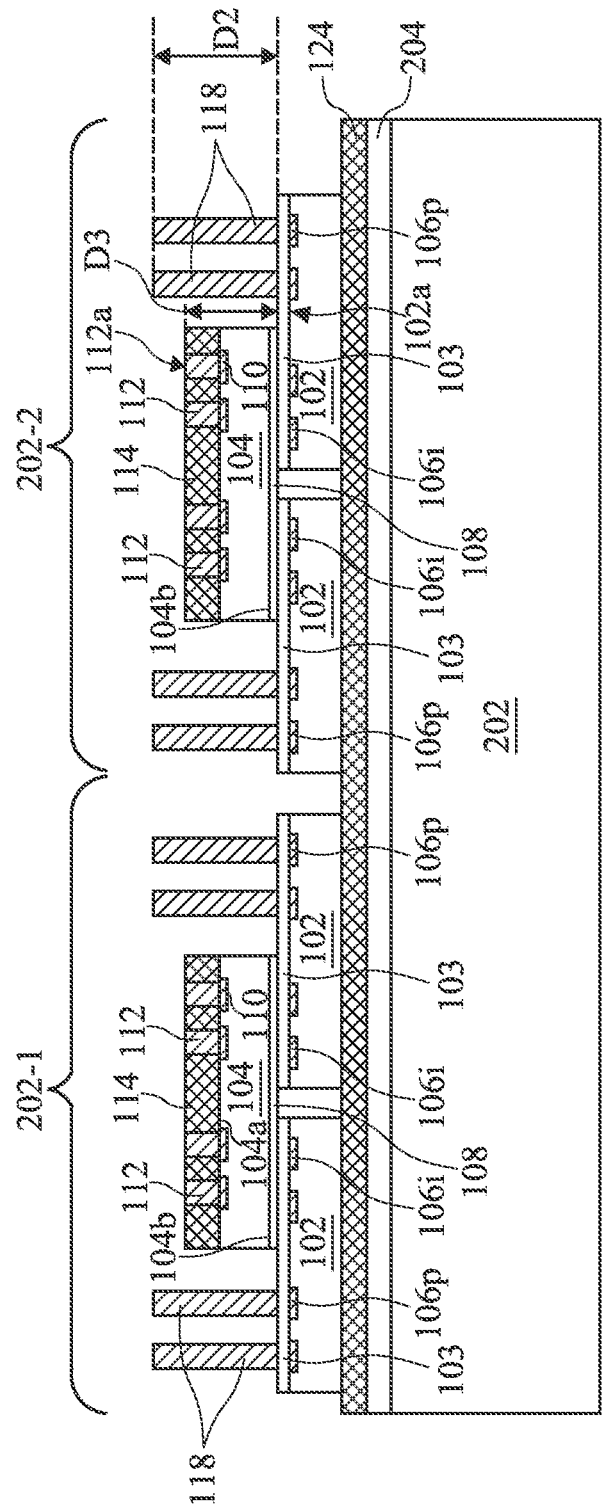

FIGS. 4A to 4I show a process flow illustrating some of the steps of yet another method of forming the multi-chip package shown in FIG. 1, in accordance with an embodiment. In the process flow shown in FIGS. 4A to 4I, the first RDL 103 and the at least one second conductive pillar 118 are formed over each of the first chips 102 prior to bonding the first chips 102 to the carrier 202, e.g. using one or more of the processes described above in respect of FIG. 3D. Referring to FIG. 4B, the first chips 102 having the first RDL 103 and the at least one second conductive pillar 118 are bonded to the carrier 202, e.g. by the second adhesive layer 124 and the third adhesive layer 204. Following this, the process flow may proceed in a similar manner as described above in relation to FIGS. 2D to 2J. For example, referring to FIG. 4C, in each of the first portion 202-1 and the second portion 202-2 of the carrier 202, the at least one second chip 104 may be formed over the first RDL 103 (e.g. using a pick and place process). In the example shown in FIG. 4C, in each of the first portion 202-1 and the second portion 202-2 of the carrier 202, the at least one second chip 104 may be disposed over the first contact pads 106i located in the interior regions of the first portion 202-1 and the second portion 202-2 of the carrier 202. As shown in FIG. 4C, the first adhesive layer 108 may be disposed between the first RDL 103 and the at least one second chip 104.

As shown in FIG. 4C, the at least one second chip 104 may additionally have the plurality of first conductive pillars 112 formed over the plurality of second contact pads 110 of the at least one second chip 104. The plurality of first conductive pillars 112 may additionally be surrounded by the first polymer layer 114. In some embodiments, the plurality of first conductive pillars 112 and the first polymer layer 114 may first be formed over the first surface 104a of the at least one second chip 104, and subsequently, the at least one second chip 104 having the plurality of first conductive pillars 112 and the first polymer layer 114 may be picked and placed over the first contact pads 106i located in the interior regions of the first portion 202-1 and the second portion 202-2 of the carrier 202.

Figure 4D:
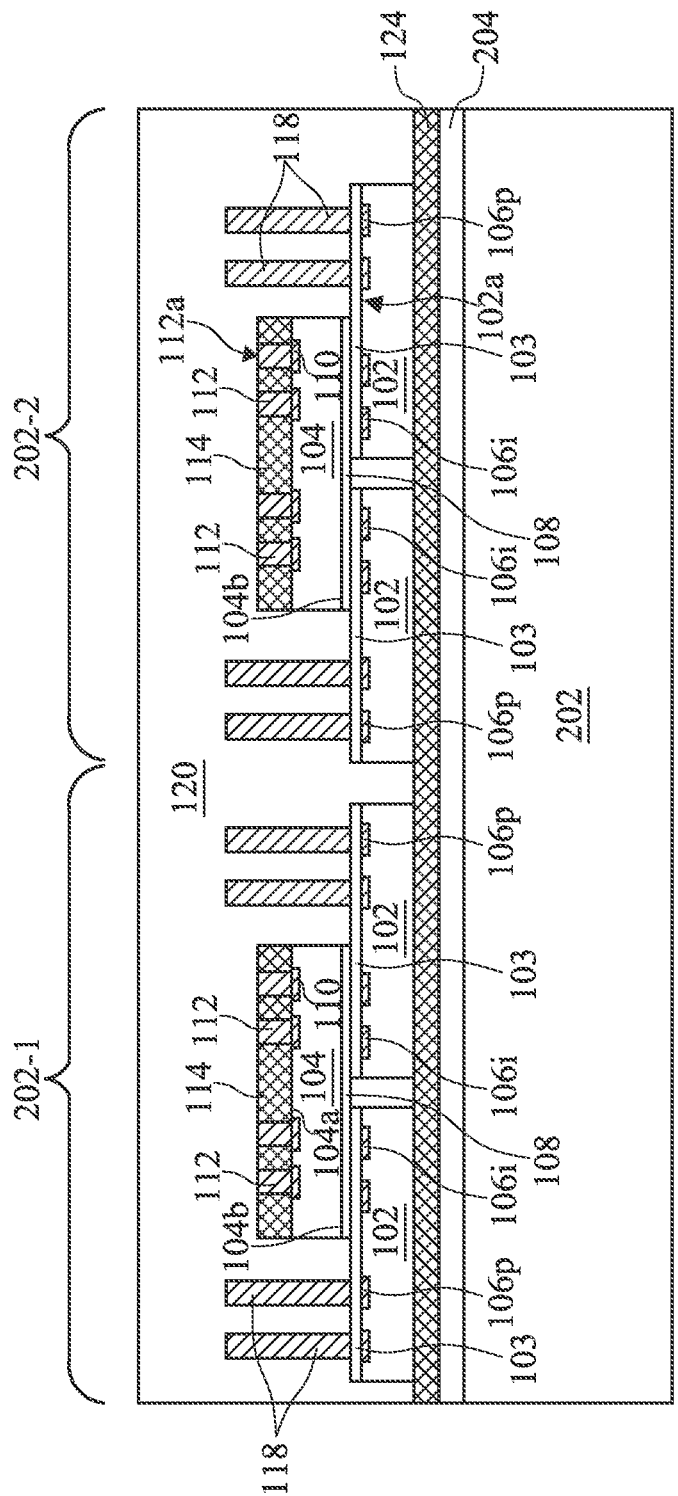

Referring to FIG. 4D, in each of the first portion 202-1 and the second portion 202-2 of the carrier 202, the molding compound 120 may be formed over and at least laterally encapsulate the at least one second chip 104, the first RDL 103, and the at least one first chip 102, e.g. using one or more processes described above in respect of FIG. 2E.

Figure 4E:
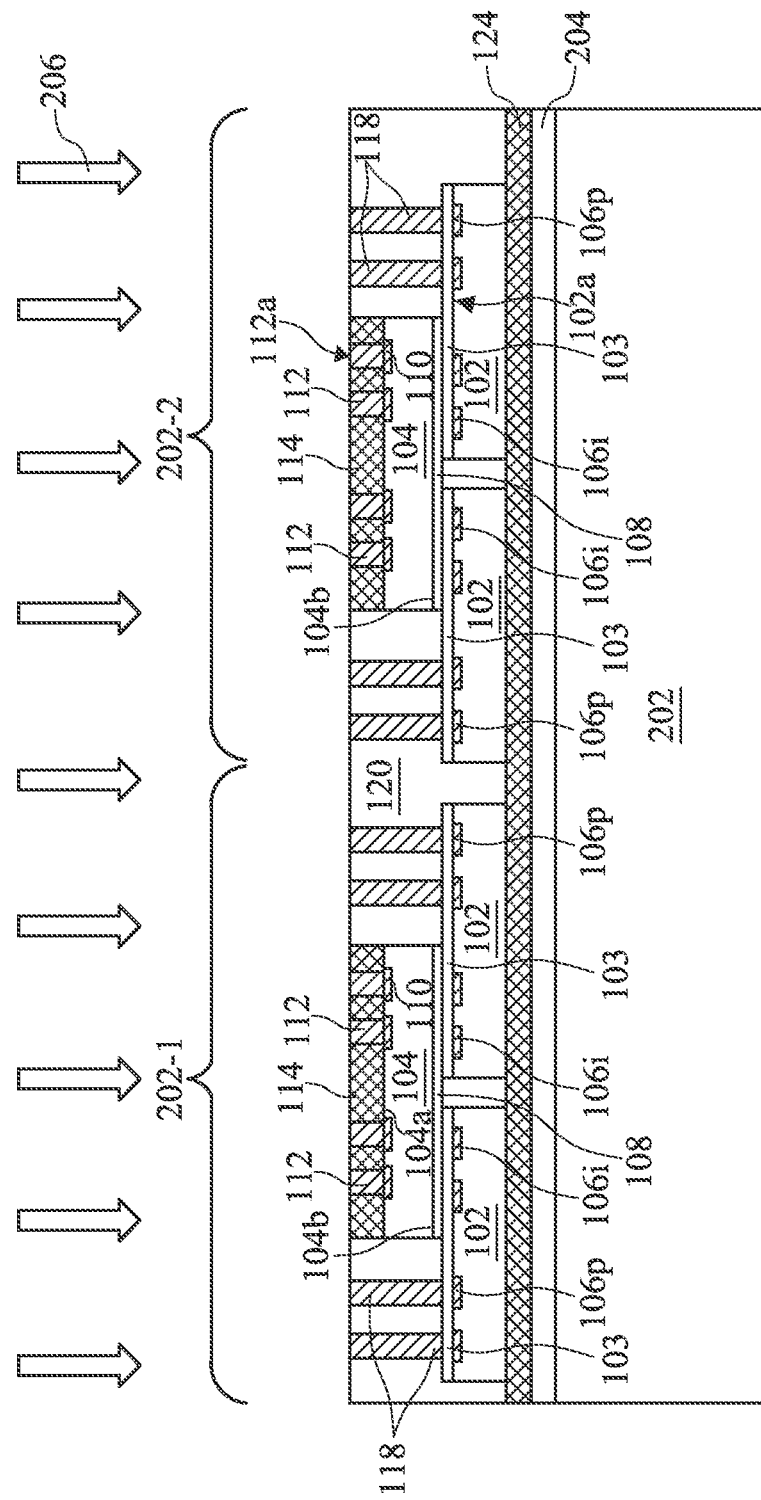
Figure 4F:
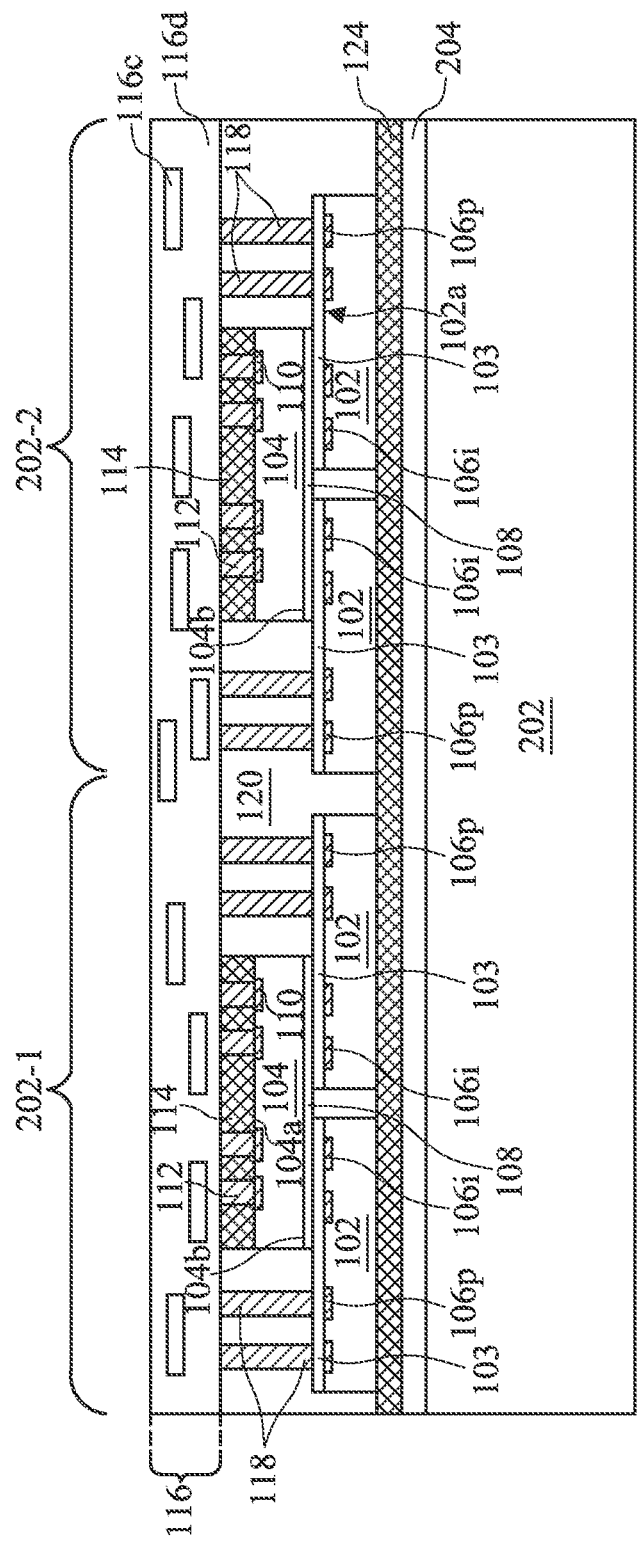

Referring to FIG. 4E, the first thinning process 206 may be performed on the molding compound 120 to expose the at least one second conductive pillar 118 and the plurality of first conductive pillars 112. Referring to FIG. 4F, in each of the first portion 202-1 and the second portion 202-2 of the carrier 202, the second RDL 116 may be formed over the molding compound 120, the at least one second conductive pillar 118, the plurality of first conductive pillars 112, and the first polymer layer 114. The second RDL 116 may be formed using one or more of the processes described above in relation to FIG. 1. The conductive features 116c of the second RDL 116 may be coupled (e.g. electrically and/or physically coupled) to the at least one second conductive pillar 118 and the plurality of first conductive pillars 112.

Figure 4G:
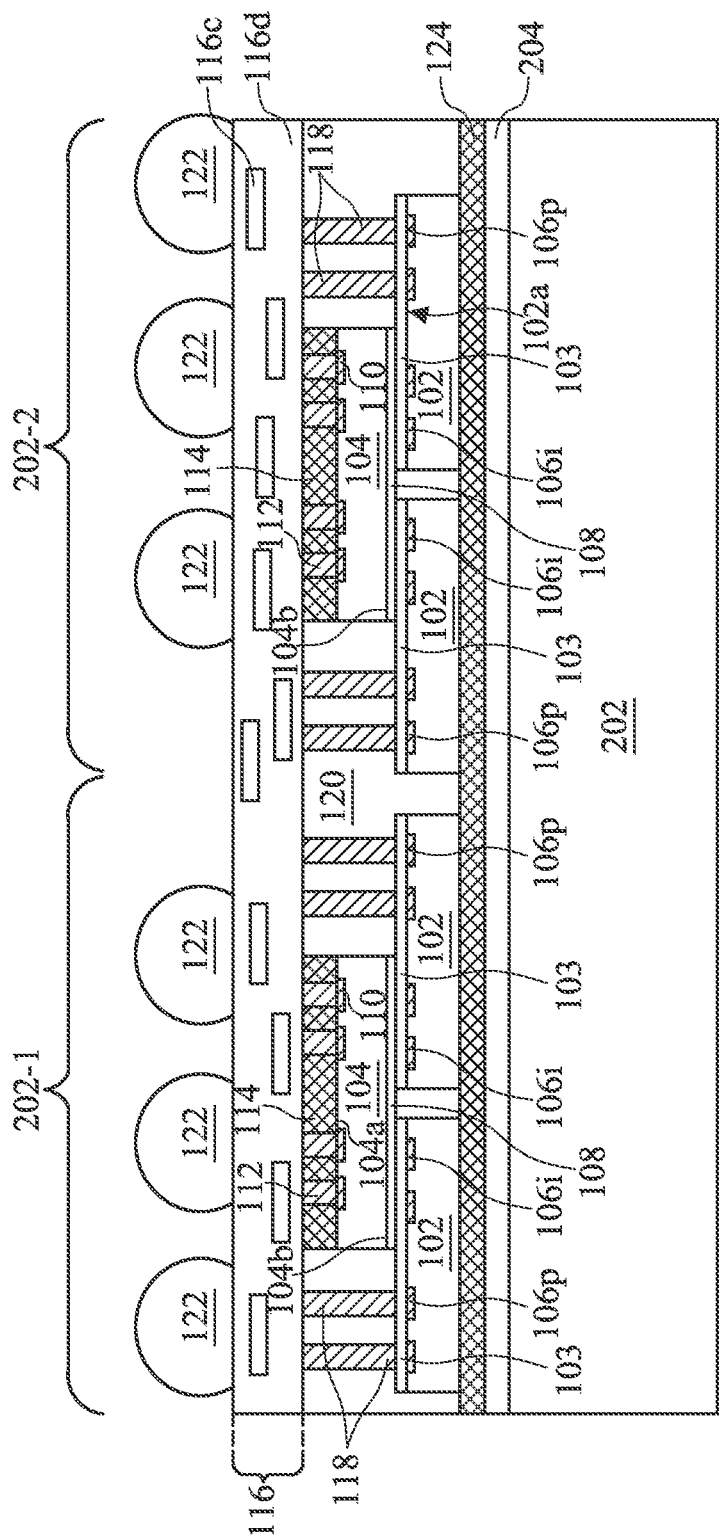

Referring to FIG. 4G, in each of the first portion 202-1 and the second portion 202-2 of the carrier 202, some of the conductive features 116c of the second RDL 116 may be exposed (e.g. by a laser opening process and/or etching process), and the external connectors 122 may thereafter be formed over the exposed conductive features 116c of the second RDL 116 (e.g. by a BGA mounting process).

Figure 4H:
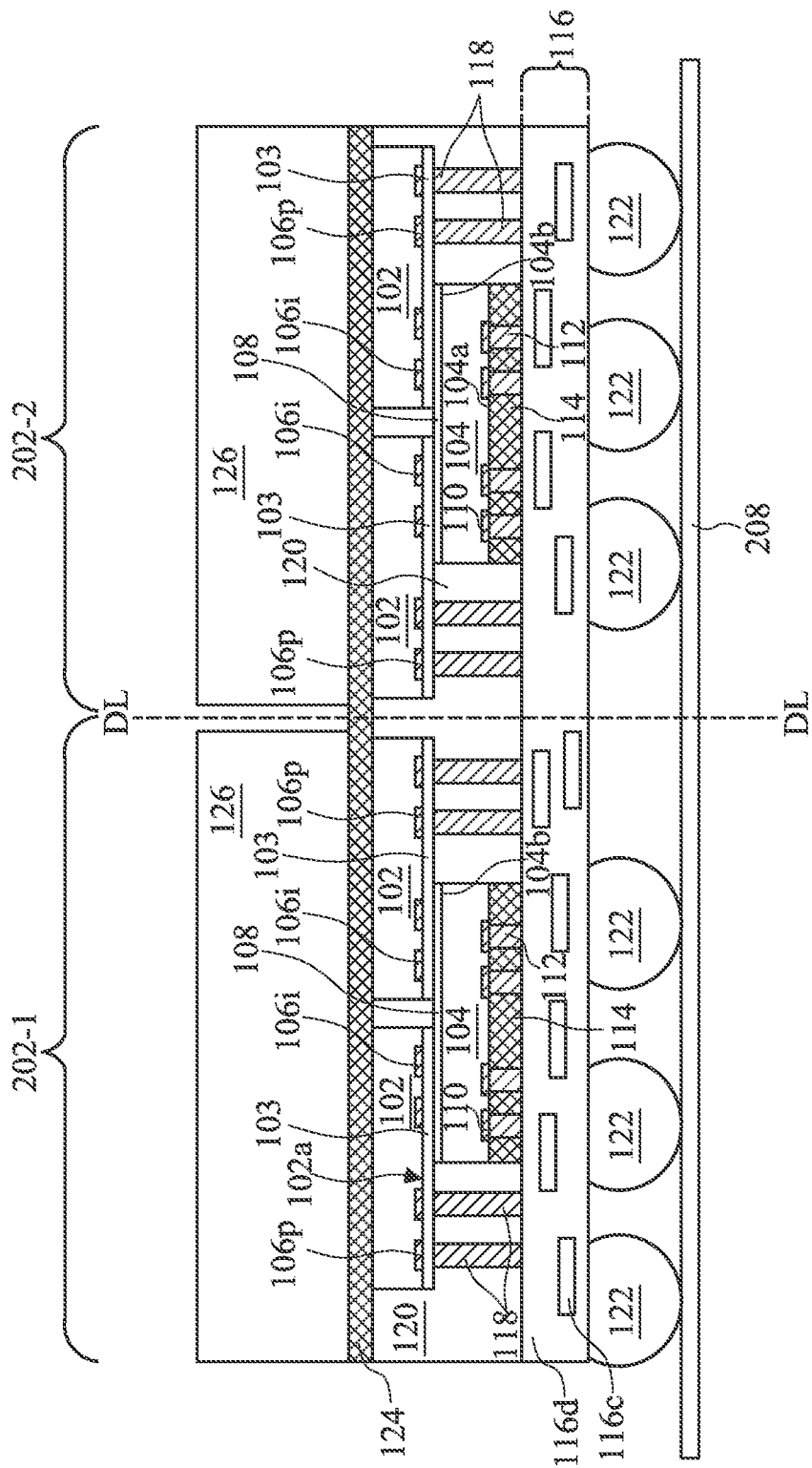

Referring to FIG. 4H, the carrier 202 may be inverted and the external connectors 122 may be mounted (e.g. frame mounted) onto the dicing tape 208. Additionally, the carrier 202 may be debonded from the second adhesive layer 124, e.g. by decomposing the third adhesive layer 204 under the heat of light, thereby releasing the carrier 202 from the second adhesive layer 124. Since the second adhesive layer 124 is free from the LTHC material, exposure to the heat of light does not decompose the second adhesive layer 124. In other embodiments, a thermal debonding process or a laser debonding process may be utilized, depending upon the precise adhesive chosen for the third adhesive layer 204.

Figure 4I:
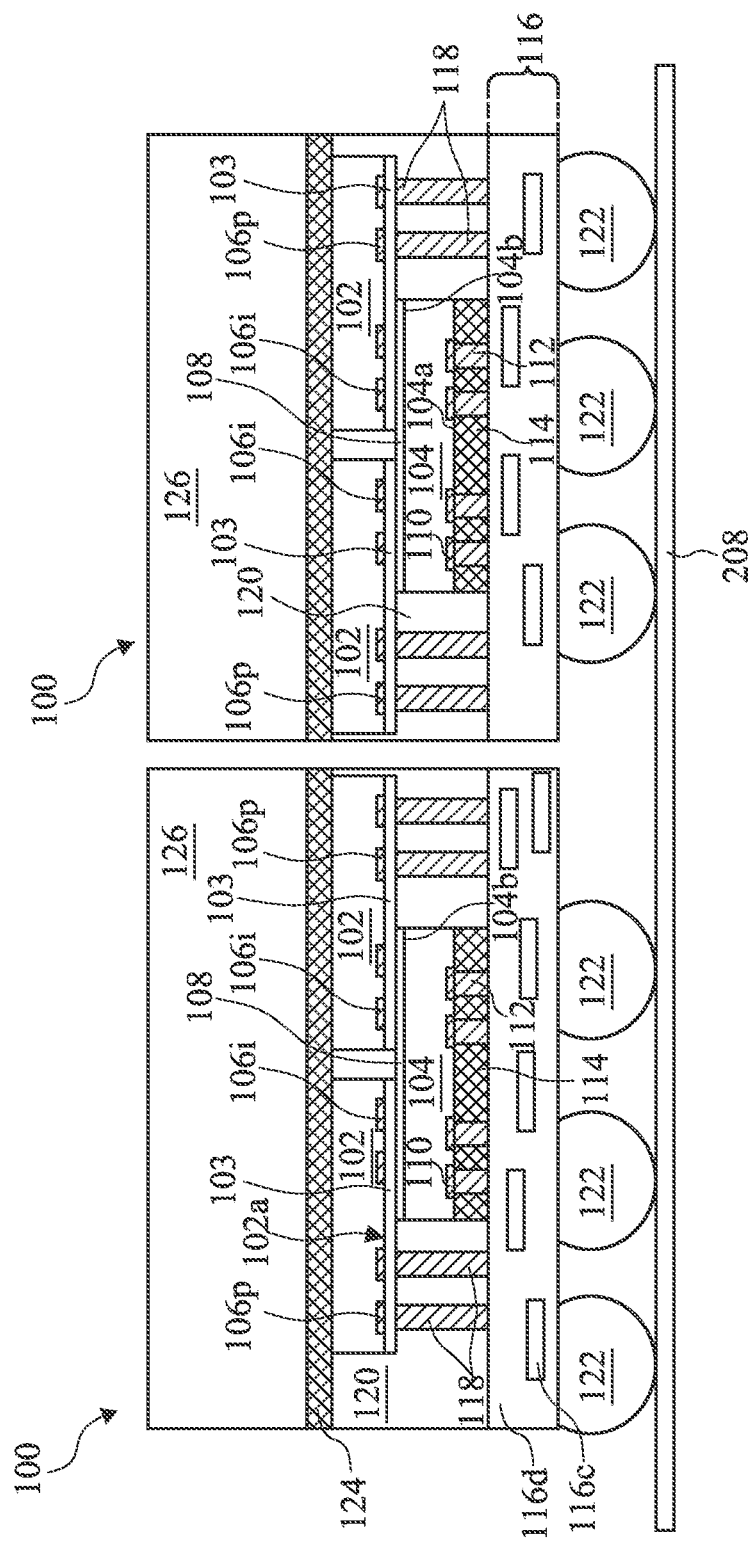

The step shown in FIG. 4H shows the first one of the heat sink 126 attached to the second adhesive layer 124 in the first portion 202-1 of the carrier 202, and the second one of the heat sink 126 attached to the second adhesive layer 124 in the second portion 202-2 of the carrier 202. Following this, the structure shown in FIG. 4H may be singulated or diced (e.g. along dicing line DL), thereby forming a plurality of packages 100 (as shown in FIG. 4I), each of which may be substantially identical to the package 100 shown in FIG. 1. Following this, dimensions of the plurality of packages 100 may be inspected (e.g. optically inspected).

FIG. 5 shows a package 101 comprising a plurality of chips, in accordance with one or more embodiments. The package 101 may be another multi-chip fan-out package, as an example. In comparison with the package 100 shown in FIG. 1, the package 101 shown in FIG. 5 is free from the third RDL 103 at the first surface 102a of the at least one first chip 102. In practice, routing for the plurality of first contact pads 106p, 106i for the package 101 may be formed at a front-end wafer metallization interconnect process for the at least one first chip 102. This routing is not shown in FIG. 5 for the sake of simplicity. Consequently, the second group of first contact pads 106i may be electrically coupled to the at least one second conductive pillar 118 by the routing formed at the first surface 102a of the at least one first chip 102 without a need for the third RDL 103 shown in FIG. 1. The package 101 shown in FIG. 5 may be formed using similar processes as described above in respect of FIGS. 2A to 2J, 3A to 3K, and 4A to 4I.

Figure 6A:
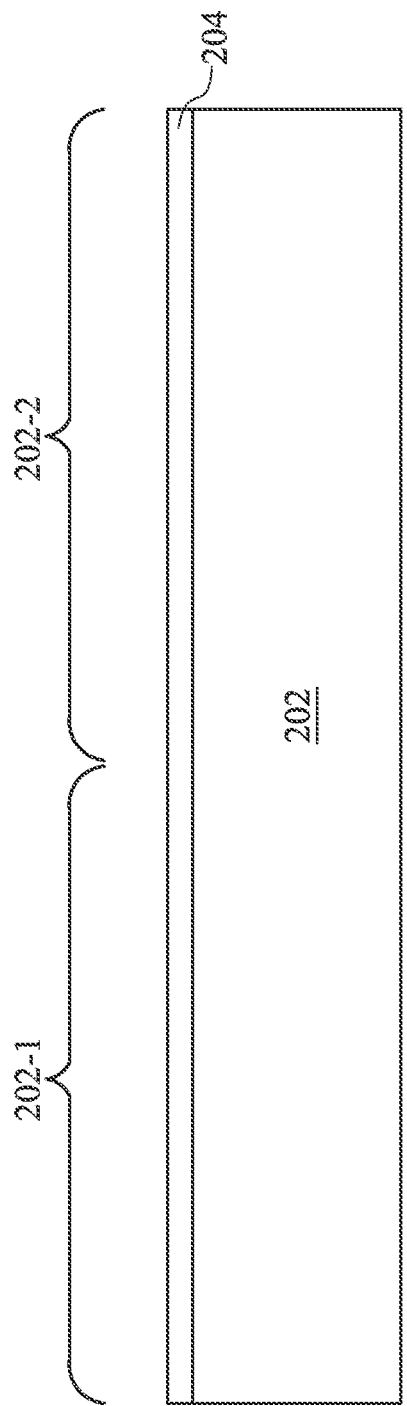

FIGS. 6A to 6J show a process flow illustrating some of the steps of a method of forming the package 101 shown in FIG. 5, in accordance with one or more embodiments. FIG. 6A shows the carrier 202, which may provide temporary mechanical and structural support to the features of the package 101 that are formed during subsequent processing steps. A first one of the package 101 may be formed in the first portion 202-1 of the carrier 202, while a second one of the package 101 may be formed (e.g. simultaneously formed) in the second portion 202-2 of the carrier 202.

Figure 6B:
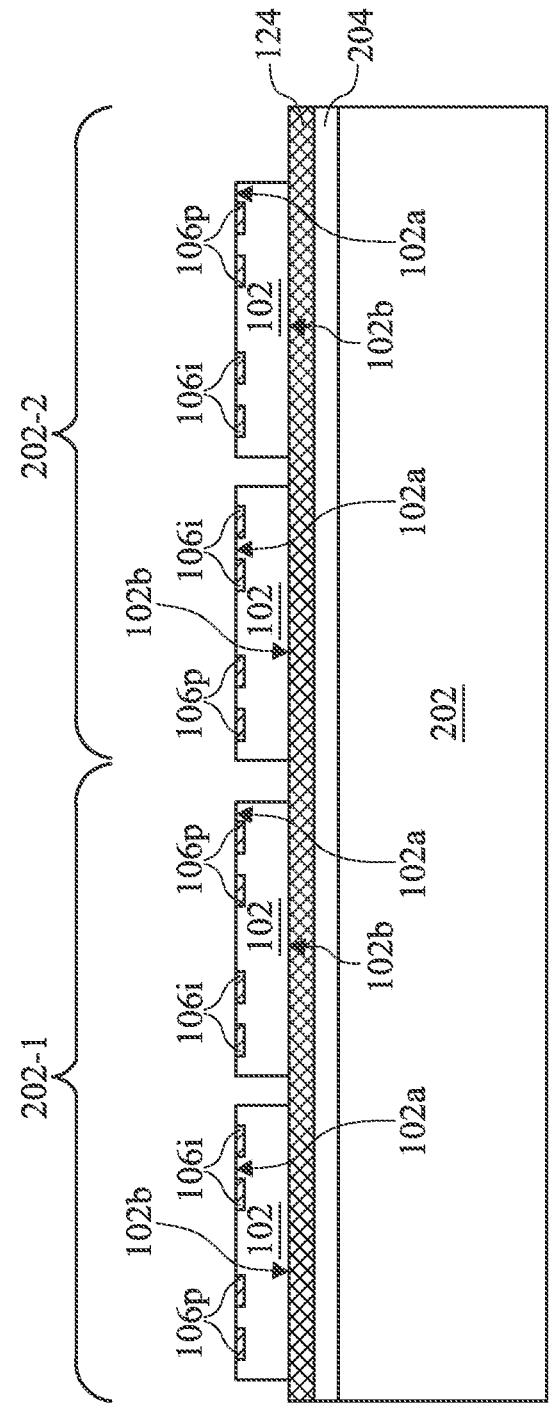

FIG. 6A also shows the optional third adhesive layer 204 formed over the carrier 202 (e.g. by a process that rolls and attaches the third adhesive layer 204 to the carrier 202). Referring to FIG. 6B, the second adhesive layer 124 may be formed over the third adhesive layer 204 (e.g. by a process that rolls and attaches the second adhesive layer 124 to the third adhesive layer 204). In an embodiment, the second adhesive layer 124 may differ in composition from the third adhesive layer 204. As an example, the second adhesive layer 124 may be free from a LTHC material, which may prevent the second adhesive layer 124 from deteriorating or decomposing when the third adhesive layer 204 is exposed to light in an attempt to release the carrier 202 from the structures formed thereon.

FIG. 6B also shows the plurality of first chips 102 formed over the second adhesive layer 124. As shown in the example of FIG. 6B, at least one first chip 102 may be formed (e.g. using a pick and place process) over the second adhesive layer 124 in the first portion 202-1 of the carrier 202, while at least one first chip 102 may be formed (e.g. using a pick and place process) over the second adhesive layer 124 in the second portion 202-2 of the carrier 202.

Figure 6C:
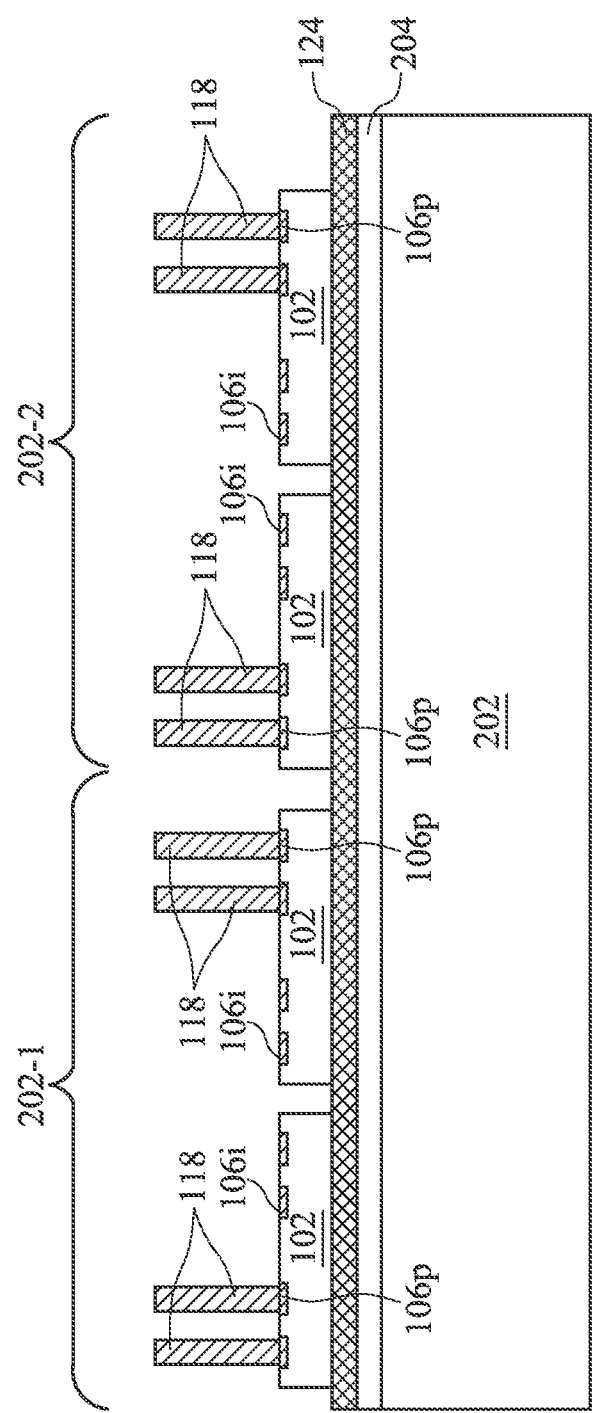

Referring to FIG. 6C, the process flow continues with the formation of the at least one second conductive pillar 118 over the first group of first contact pads 106p. As shown in the example of FIG. 6C, the second group of first contact pads 106i may be free from the at least one second conductive pillar 118. However, the second group of first contact pads 106i may be electrically coupled to the at least one second conductive pillar 118 by the routing formed at the first surface 102a of the at least one first chip 102. The at least one second conductive pillar 118 may be formed by any suitable techniques such as electroplating. Other processes of formation such as sputtering, evaporation, plasma enhanced chemical vapor deposition (PECVD) and/or the like may alternatively be used depending upon the desired materials.

Figure 6D:
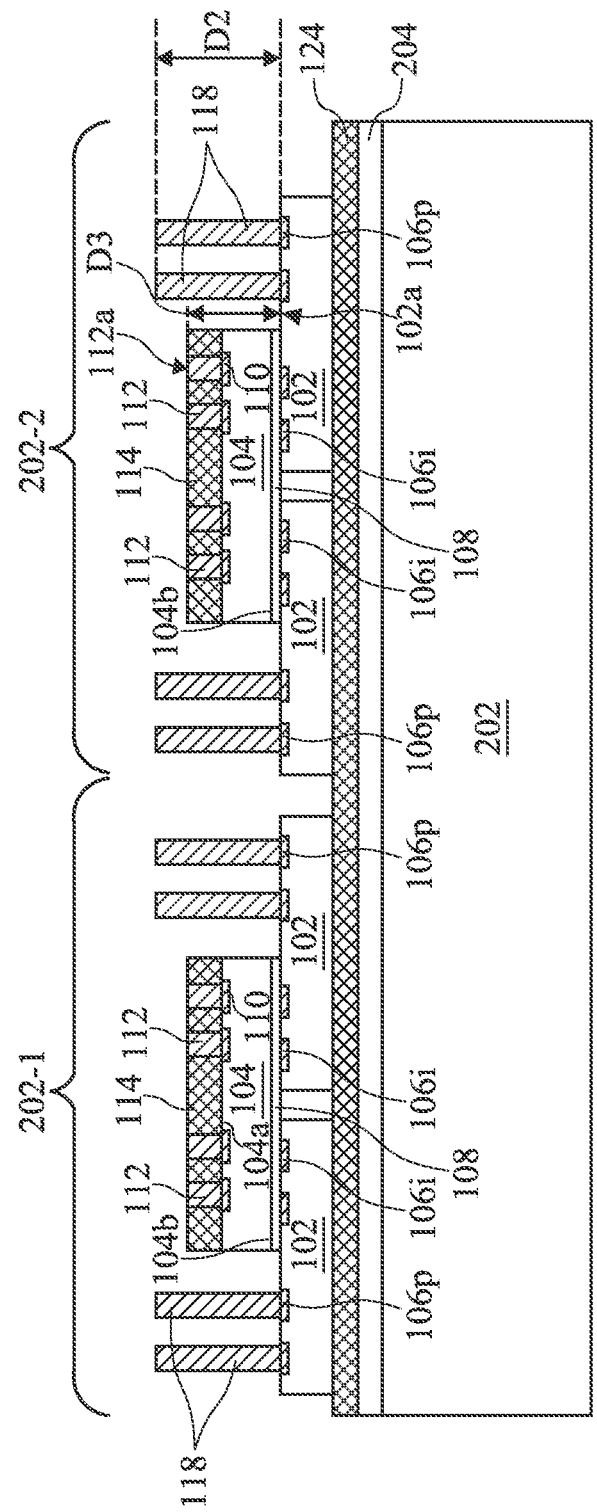

Referring to FIG. 6D, in each of the first portion 202-1 and the second portion 202-2 of the carrier 202, the at least one second chip 104 may be formed over the at least one first chip 102 (e.g. using a pick and place process). In the example shown in FIG. 6D, in each of the first portion 202-1 and the second portion 202-2 of the carrier 202, the at least one second chip 104 may be disposed over the first contact pads 106i located in the interior regions of the first portion 202-1 and the second portion 202-2 of the carrier 202. As shown in FIG. 6D, the first adhesive layer 108 may be disposed between the at least one first chip 102 and the at least one second chip 104. The at least one second chip 104 may additionally have the plurality of first conductive pillars 112 formed over the plurality of second contact pads 110 of the at least one second chip 104. The plurality of first conductive pillars 112 may additionally be surrounded by the first polymer layer 114. In some embodiments, the plurality of first conductive pillars 112 and the first polymer layer 114 may first be formed over the first surface 104a of the at least one second chip 104, and subsequently, the at least one second chip 104 having the plurality of first conductive pillars 112 and the first polymer layer 114 may be picked and placed over the first contact pads 106i located in the interior regions of the first portion 202-1 and the second portion 202-2 of the carrier 202.

In the examples shown in FIGS. 6C and 6D, the at least one second conductive pillar 118 is formed prior to placing the at least one second chip 104 over the at least one first chip 102. However, in another embodiment, this order may be reversed, e.g., the at least one first chip 102 may be placed over the first contact pads 106i located in the interior regions of the first portion 202-1 and the second portion 202-2 of the carrier 202, and thereafter, the at least one second conductive pillar 118 may be formed over the first contact pads 106p located in peripheral regions of the first portion 202-1 of the carrier 202 and the second portion 202-2 of the carrier 202.

Figure 6E:
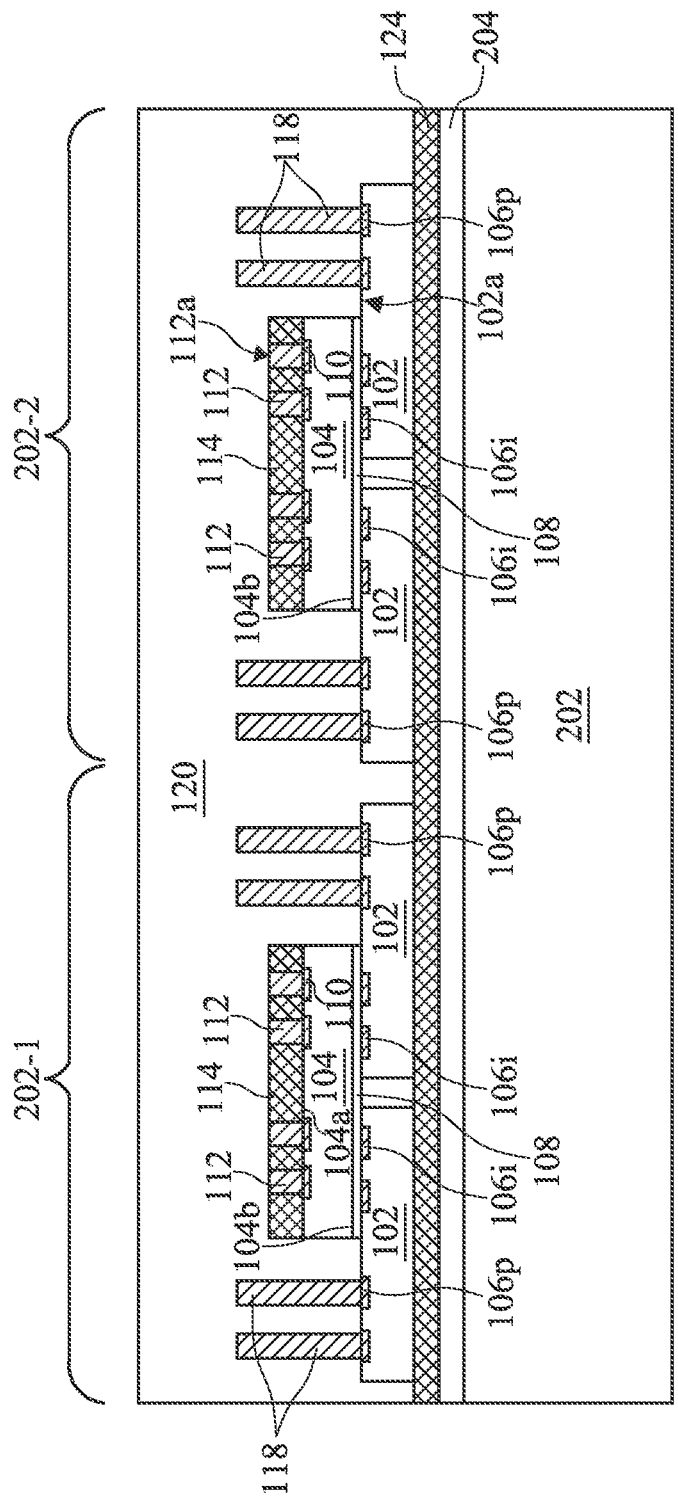
Figure 6F:
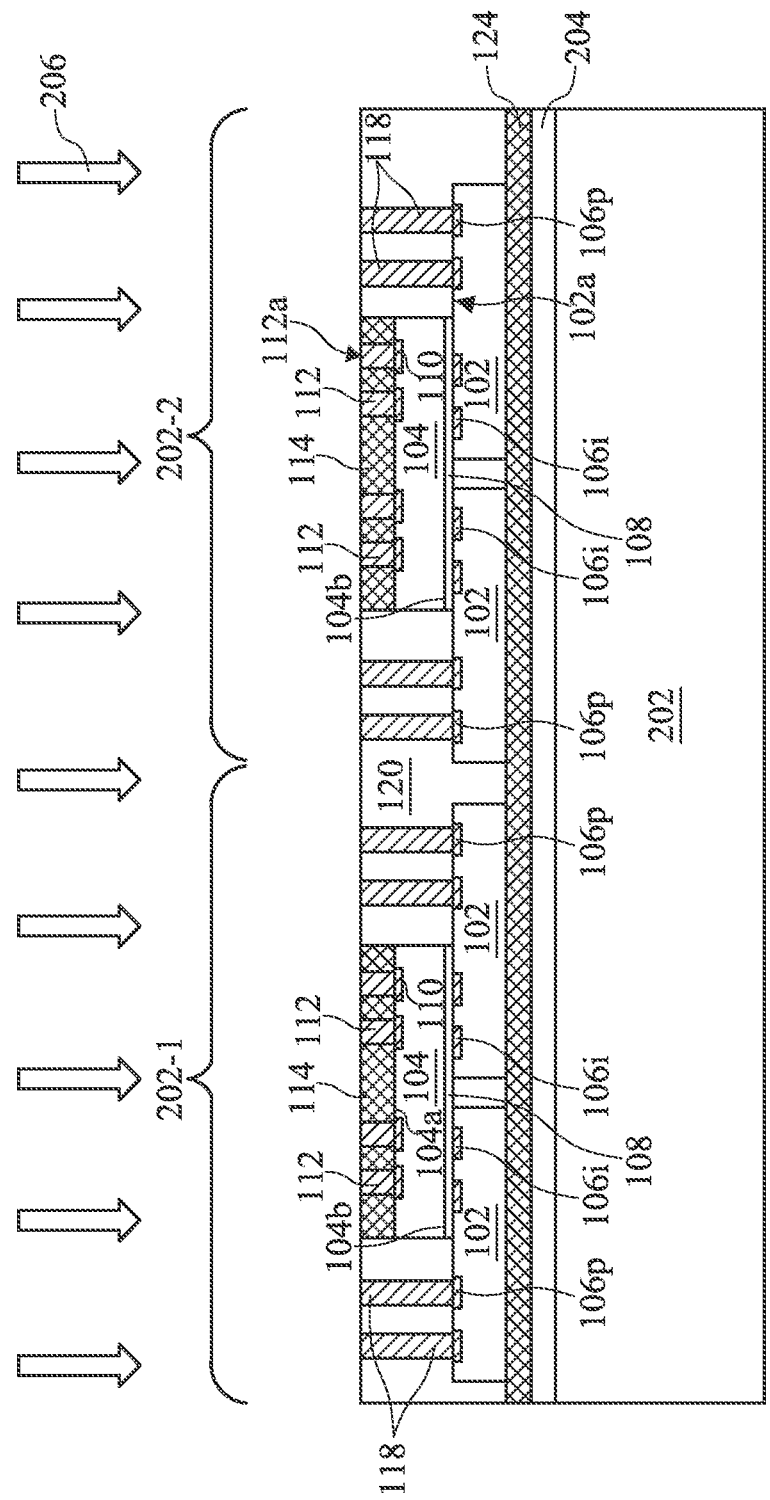
Figure 6G:
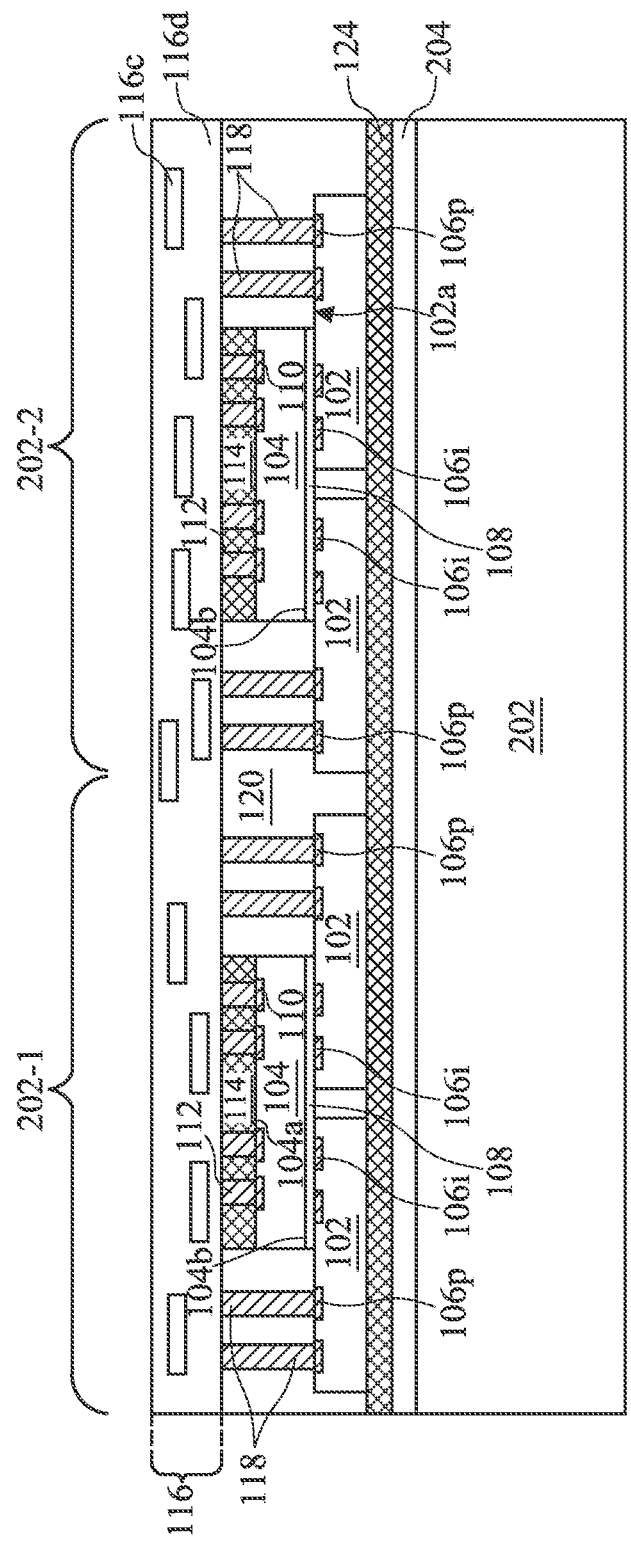

Referring to FIG. 6E, in each of the first portion 202-1 and the second portion 202-2 of the carrier 202, the molding compound 120 may be formed over and encapsulate the at least one second chip 104 and the at least one first chip 102, e.g. using one or more of the processes described above in respect of FIG. 2E. Referring to FIG. 6F, the first thinning process 206 may be performed on the molding compound 120 to expose the at least one second conductive pillar 118 and the plurality of first conductive pillars 112. As a result of the first thinning process 206, the first polymer layer 114 may also be exposed. Referring to FIG. 6G, in each of the first portion 202-1 and the second portion 202-2 of the carrier 202, the RDL 116 may be formed over the molding compound 120, the at least one second conductive pillar 118, the plurality of first conductive pillars 112, and the first polymer layer 114. The RDL 116 may be formed using one or more of the processes described above in relation to FIG. 1. The conductive features 116c of the RDL 116 may be coupled (e.g. electrically and/or physically coupled) to the at least one second conductive pillar 118 and the plurality of first conductive pillars 112.

Figure 6H:
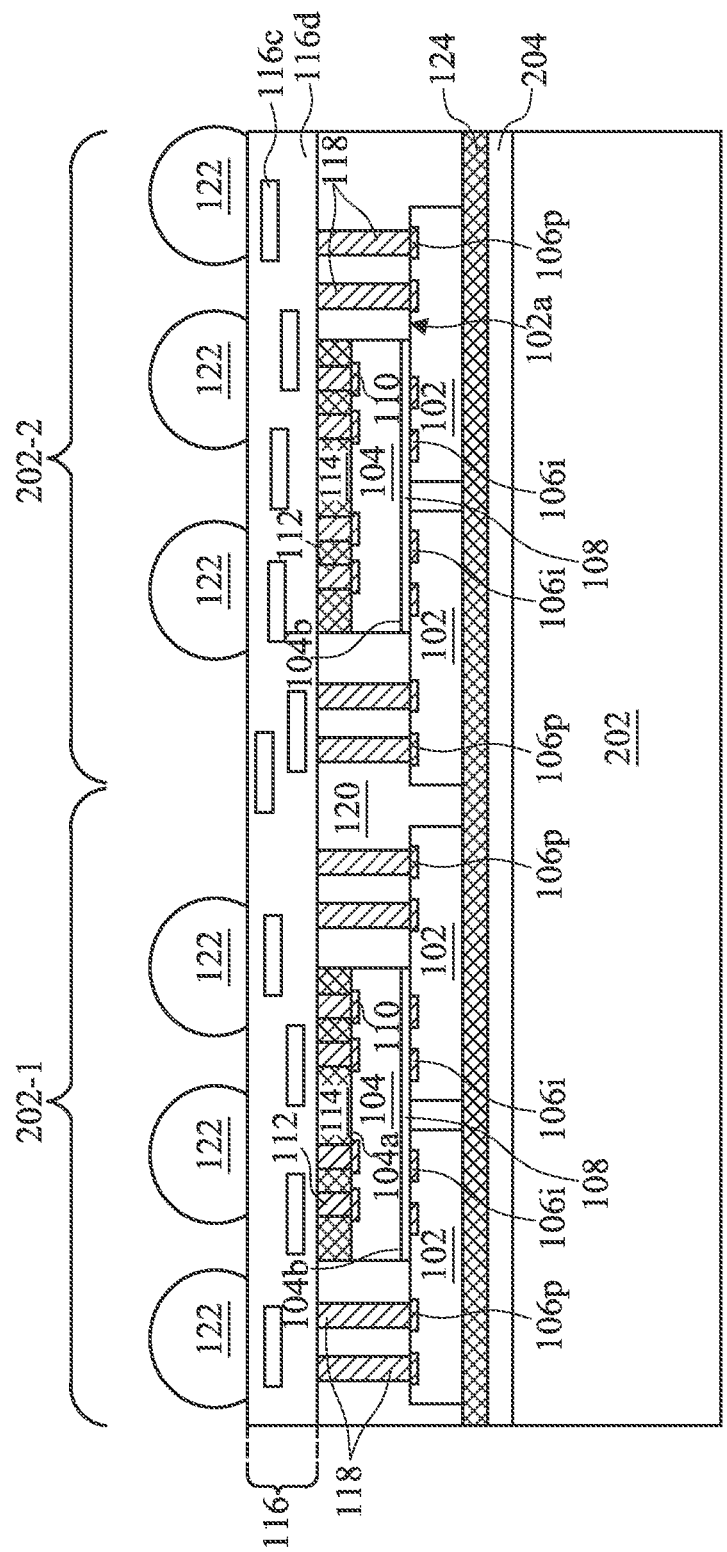
Figure 61:
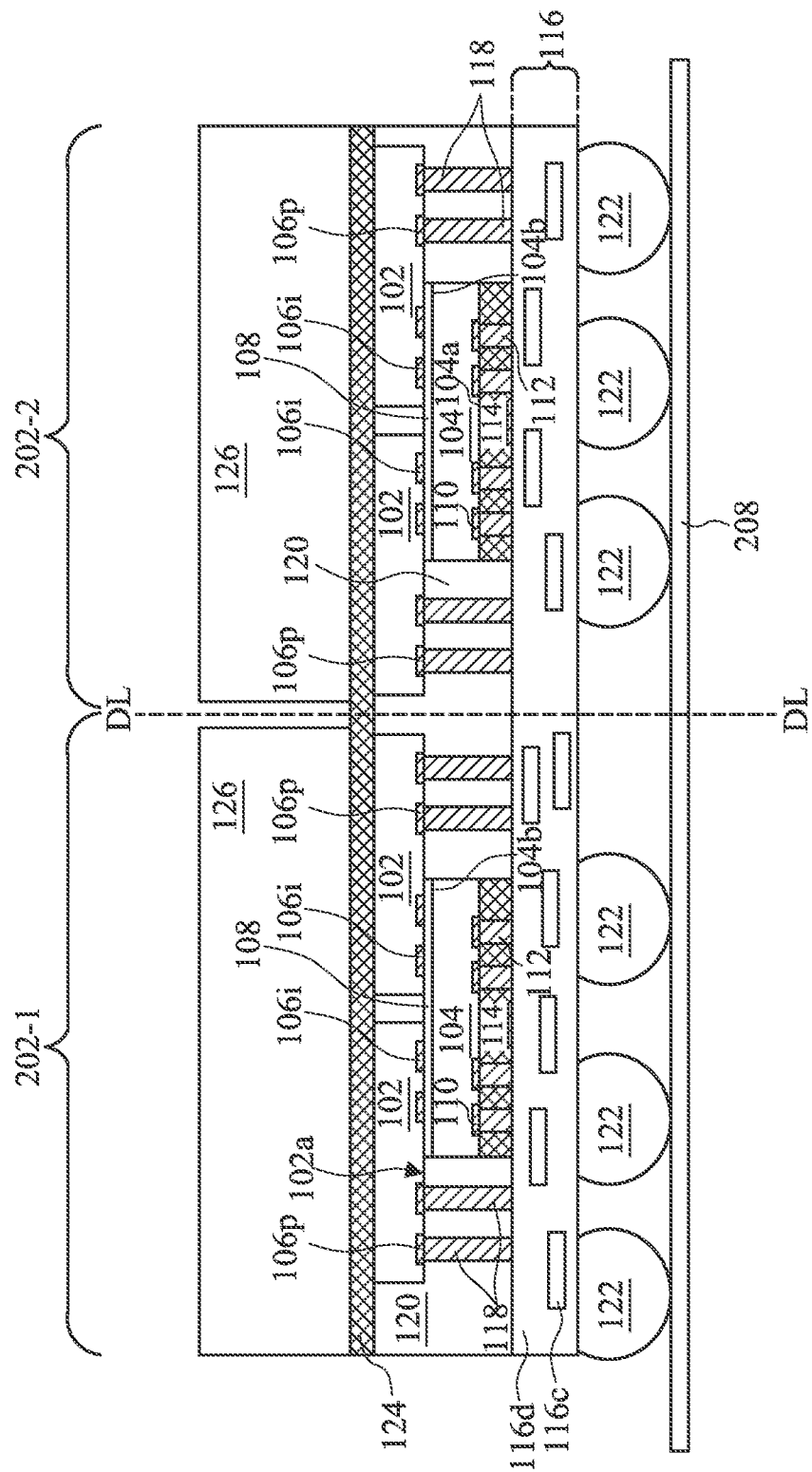

Referring to FIG. 6H, in each of the first portion 202-1 and the second portion 202-2 of the carrier 202, some of the conductive features 116c of the RDL 116 may be exposed (e.g. by a laser opening process and/or etching process), and the external connectors 122 may thereafter be formed over the exposed conductive features 116c of RDL 116 (e.g. by a BGA mounting process).

Referring to FIG. 6I, the carrier 202 may be inverted and the external connectors 122 may be mounted (e.g. frame mounted) onto the dicing tape 208. Additionally, the carrier 202 may be debonded from the second adhesive layer 124, e.g. by decomposing the third adhesive layer 204 under the heat of light, thereby releasing the carrier 202 from the second adhesive layer 124. Since the second adhesive layer 124 is free from the LTHC material, exposure to the heat of light does not decompose the second adhesive layer 124. In other embodiments, a thermal debonding process or a laser debonding process may be utilized, depending upon the precise adhesive chosen for the third adhesive layer 204.

Figure 6J:
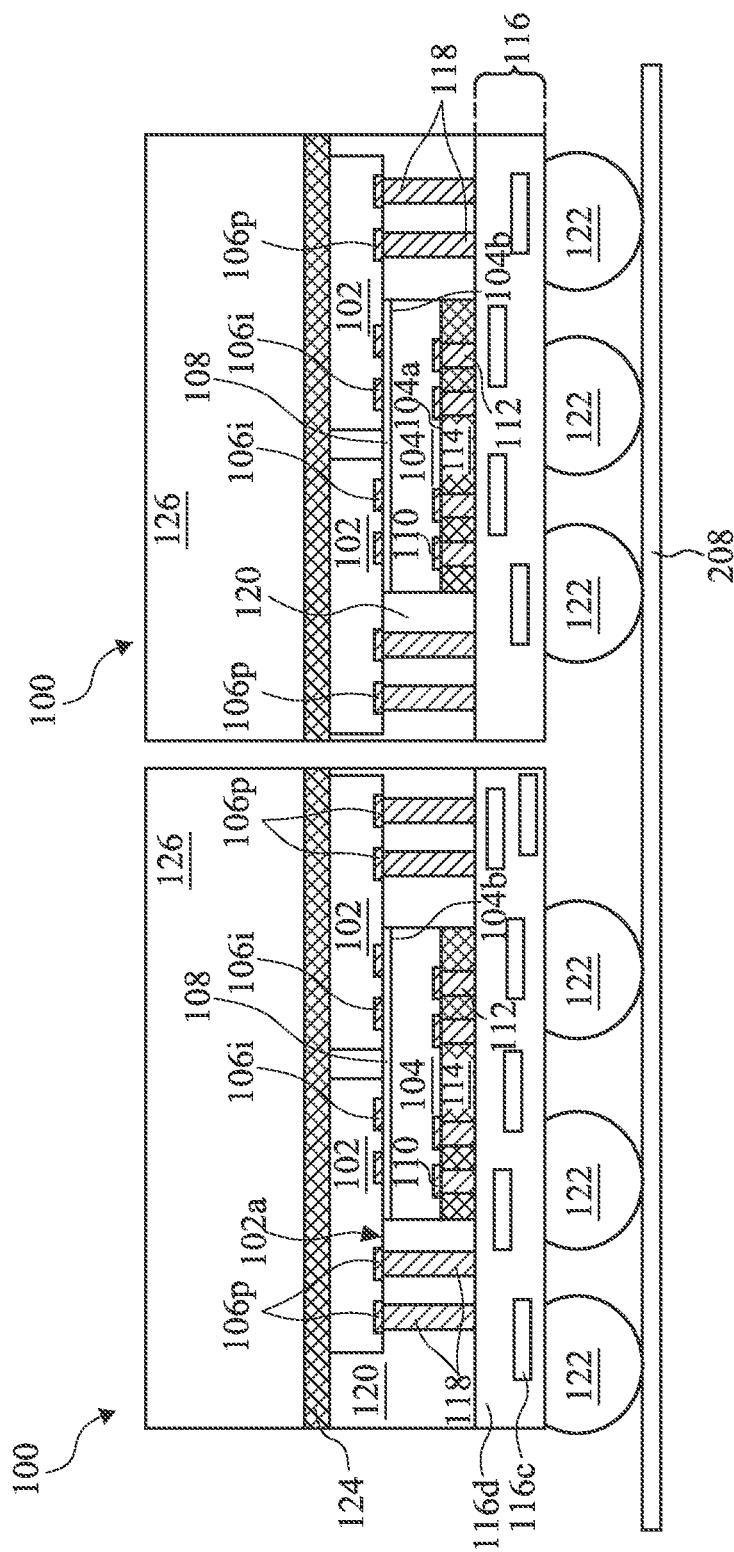

Referring to FIG. 6I, the first one of the heat sink 126 may be attached to the second adhesive layer 124 in the first portion 202-1 of the carrier 202, while the second one of the heat sink 126 may be attached to the second adhesive layer 124 in the second portion 202-2 of the carrier 202. Following this, the structure shown in FIG. 6I may be singulated or diced (e.g. along dicing line DL), thereby forming a plurality of packages 101 (as shown in FIG. 6J), each of which may be substantially identical to the package 101 shown in FIG. 5. Following this, dimensions of the plurality of packages 101 may be inspected (e.g. optically inspected).

Figure 7A:
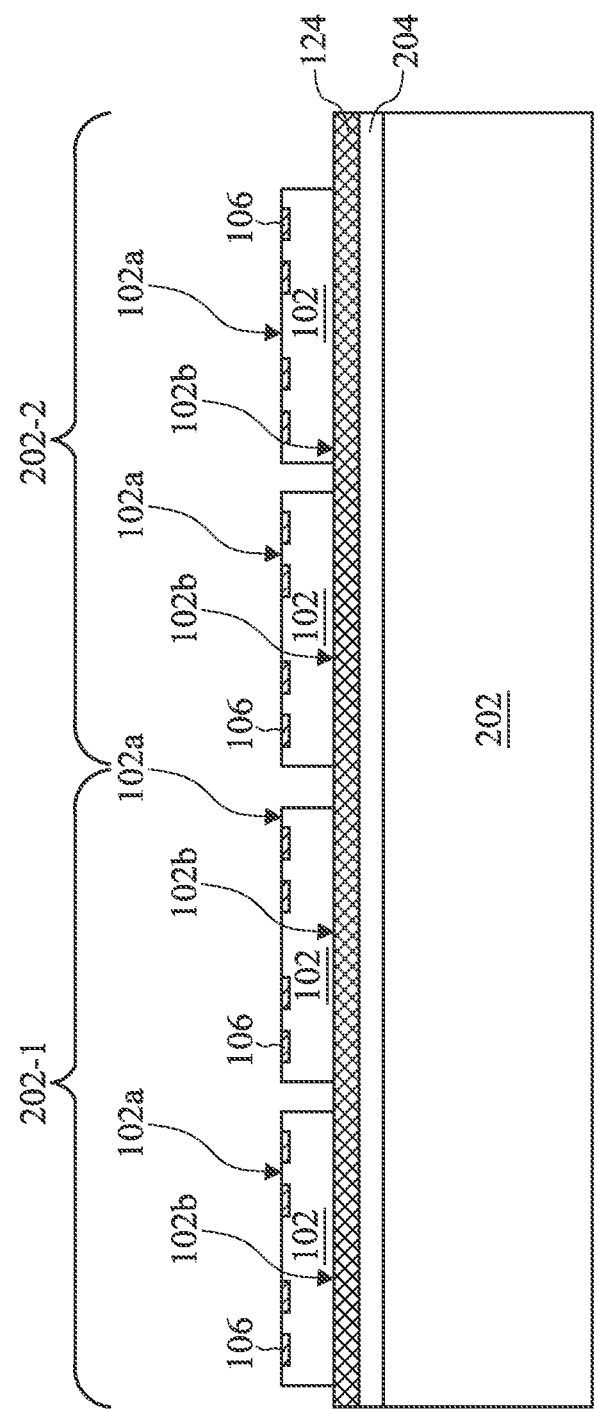
FIGS. 7A to 7K show a process flow illustrating some of the steps of another method of forming the multi-chip package shown in FIG. 5, in accordance with an embodiment.

FIGS. 7A to 7K show a process flow illustrating some of the steps of another method of forming the multi-chip package shown in FIG. 5, in accordance with an embodiment. Referring to FIG. 7A, the plurality of first chips 102 formed over the second adhesive layer 124. As shown in the example of FIG. 7A, at least one first chip 102 may be formed (e.g. using a pick and place process) over the second adhesive layer 124 in the first portion 202-1 of the carrier 202, while at least one first chip 102 may be formed (e.g. using a pick and place process) over the second adhesive layer 124 in the second portion 202-2 of the carrier 202. As illustrated in the example of FIG. 7A, the first surface 102a of the at least one first chip 102 may face away from the carrier 202, while the second surface 102b of the at least one first chip 102 may face the carrier 202 and may be in contact (e.g. physical contact) with the second adhesive layer 124. For the sake of simplicity, the plurality of first contact pads 106p, 106i is denoted with reference numeral 106 in FIG. 7A.

Figure 7B:
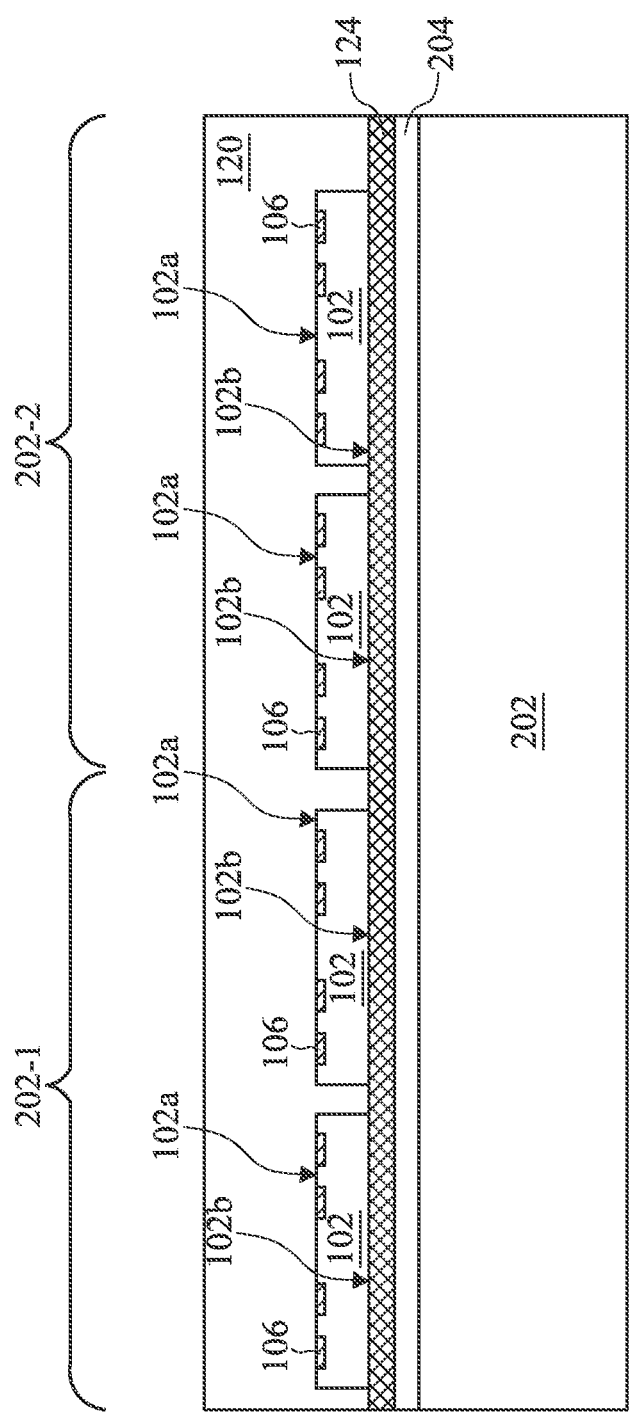

Referring to FIG. 7B, in each of the first portion 202-1 and the second portion 202-2 of the carrier 202, the molding compound 120 may be formed over and encapsulate the at least one first chip 102. In some embodiments, the molding compound 120 is shaped or molded using for example, a mold (not shown) which may have a border or other feature for retaining molding compound 120 when applied. Such a mold may be used to pressure mold the molding compound 120 over and around at least one first chip 102 and into openings and recesses, eliminating air pockets or the like in the molding compound 120.

Figure 7C:
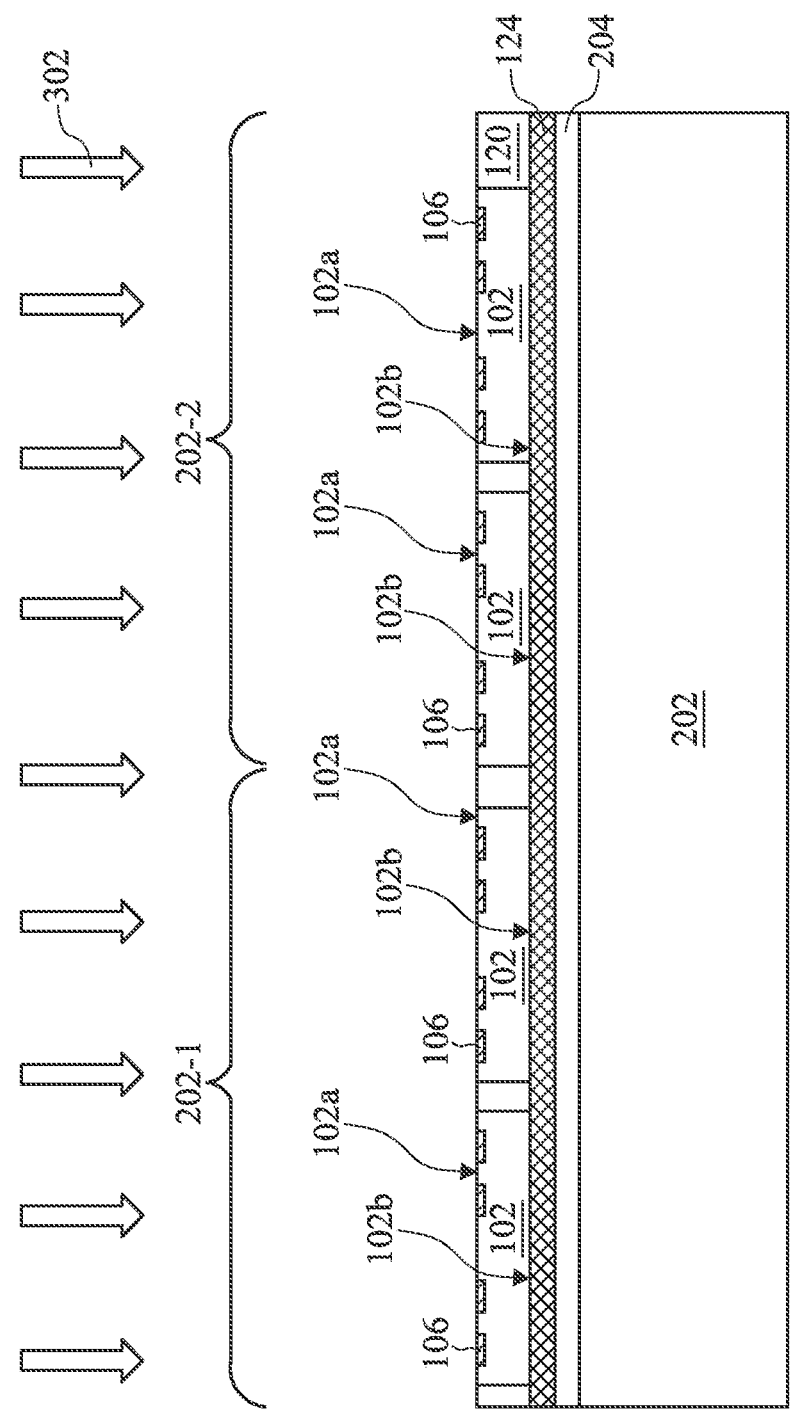

Referring to FIG. 7C, the second thinning process 302 may be performed on the molding compound 120 to expose the plurality of first contact pads 106. As a result of the second thinning process 302, the first surface 102a of the at least one first chip 102 may also be exposed. The second thinning process 302 may be performed using an etching process and/or a planarization process, such as a mechanical grinding process or a CMP process.

Figure 7D:
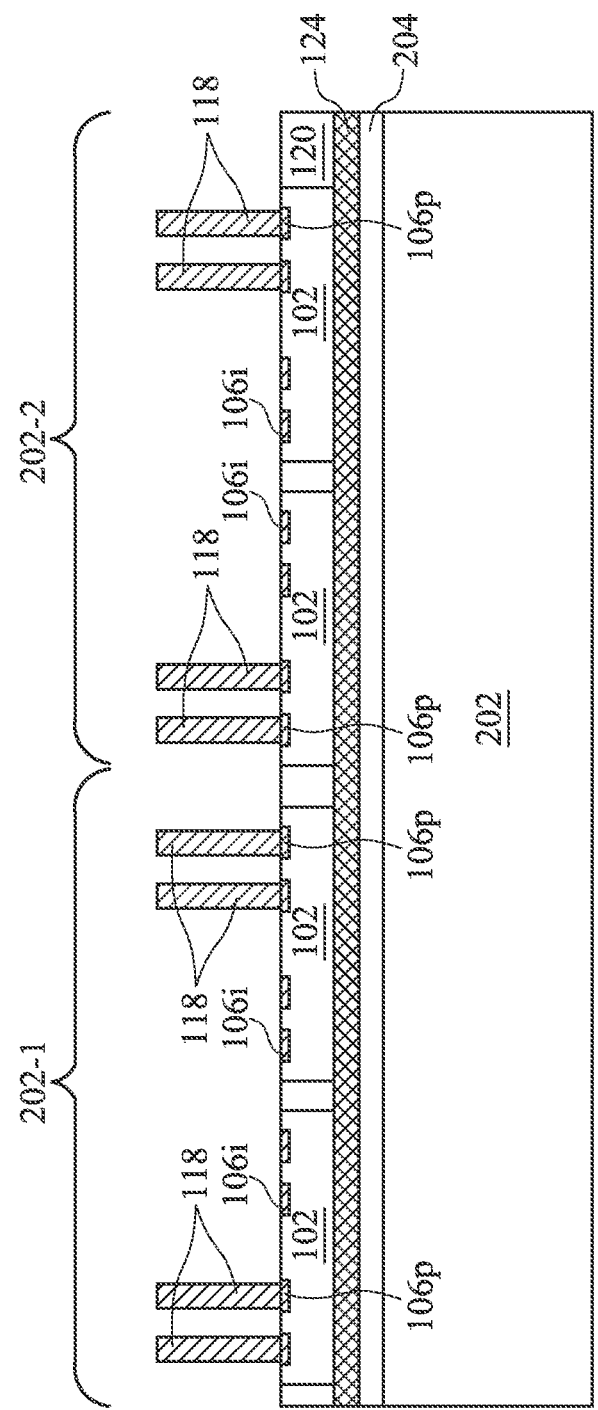

Referring to FIG. 7D, the process flow continues with the formation of the at least one second conductive pillar 118 over some of the plurality of first contact pads 106 of the at least one first chip 102. As an example, first contact pads 106p located in peripheral regions of the first portion 202-1 of the carrier 202 and the second portion 202-2 of the carrier 202 may have the at least one second conductive pillar 118 formed thereon. Consequently, as shown in the example of FIG. 7D, first contact pads 106i located in interior regions of the first portion 202-1 and the second portion 202-2 of the carrier 202 may be free from the at least one second conductive pillar 118. The at least one second conductive pillar 118 may be formed by one or more of the processes described above in relation to FIG. 2C.

Figure 7E:
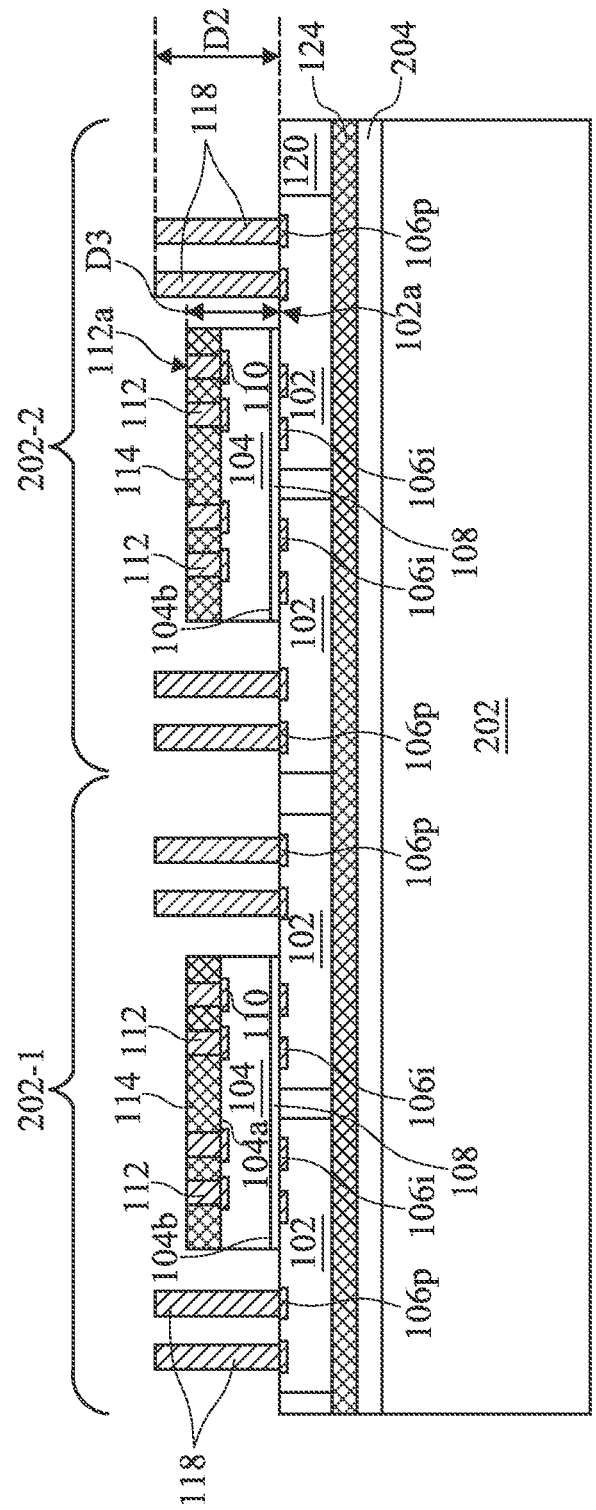

Referring to FIG. 7E, in each of the first portion 202-1 and the second portion 202-2 of the carrier 202, the at least one second chip 104 may be formed over the at least one first chip 102 (e.g. using a pick and place process). In the example shown in FIG. 7E, in each of the first portion 202-1 and the second portion 202-2 of the carrier 202, the at least one second chip 104 may be disposed over the first contact pads 106i located in the interior regions of the first portion 202-1 and the second portion 202-2 of the carrier 202. As shown in FIG. 7E, the first adhesive layer 108 may be disposed between the at least one first chip 102 and the at least one second chip 104. In some embodiments, the first adhesive layer 108 may first be formed at the second surface 104b of the at least one second chip 104, and subsequently, the at least one second chip 104 having the first adhesive layer 108 at the second surface 104b thereof may be picked and placed over the first contact pads 106i located in the interior regions of the first portion 202-1 and the second portion 202-2 of the carrier 202. As shown in FIG. 7E, the at least one second chip 104 may additionally have the plurality of first conductive pillars 112 formed over the plurality of second contact pads 110 of the at least one second chip 104. The plurality of first conductive pillars 112 may additionally be surrounded by the first polymer layer 114. In some embodiments, the plurality of first conductive pillars 112 and the first polymer layer 114 may first be formed over the first surface 104a of the at least one second chip 104, and subsequently, the at least one second chip 104 having the plurality of first conductive pillars 112 and the first polymer layer 114 may be picked and placed over the first contact pads 106i located in the interior regions of the first portion 202-1 and the second portion 202-2 of the carrier 202.

In the examples shown in FIGS. 7D and 7E, the at least one second conductive pillar 118 is formed prior to placing the at least one second chip 104 over the at least one first chip 102. However, in another embodiment, this order may be reversed, e.g., the at least one first chip 102 may be placed over the first contact pads 106i located in the interior regions of the first portion 202-1 and the second portion 202-2 of the carrier 202, and thereafter, the at least one second conductive pillar 118 may be formed over the first contact pads 106p located in peripheral regions of the first portion 202-1 of the carrier 202 and the second portion 202-2 of the carrier 202.

Figure 7F:
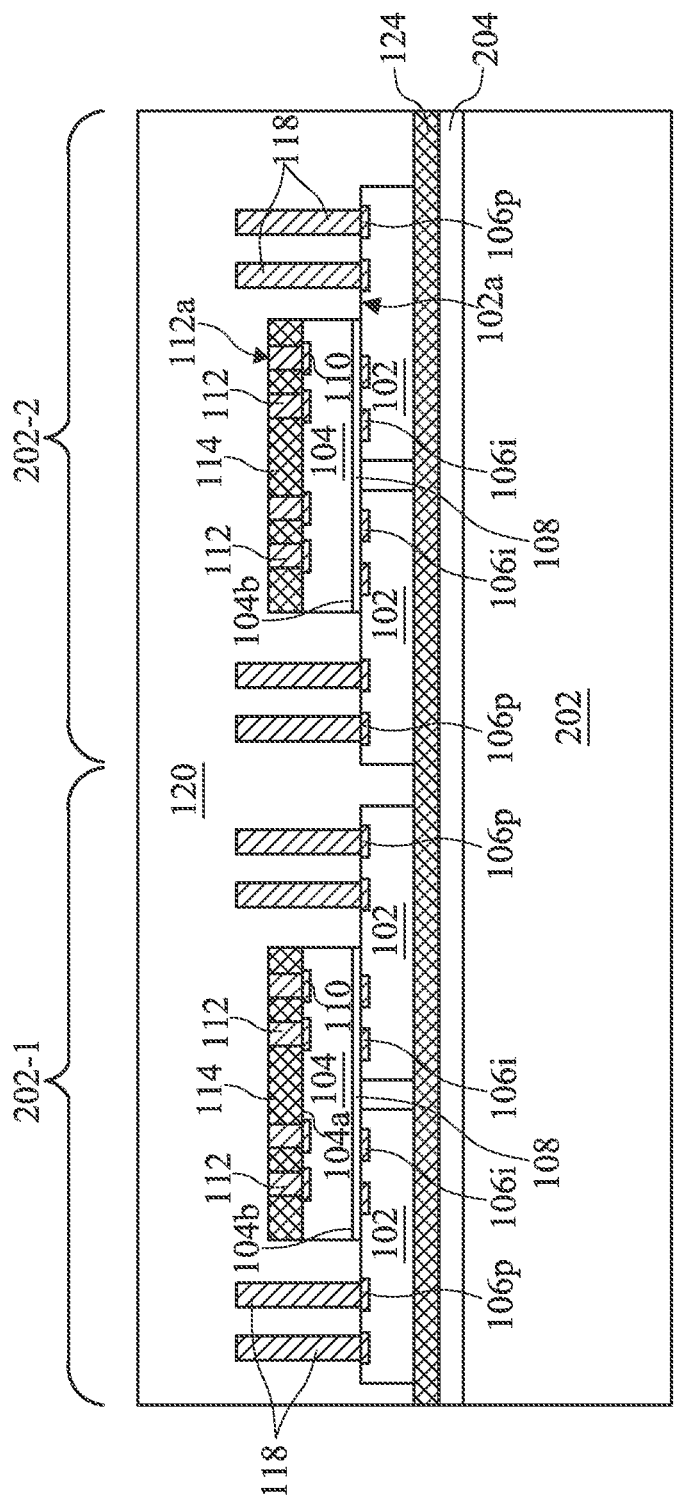
Figure 7G:
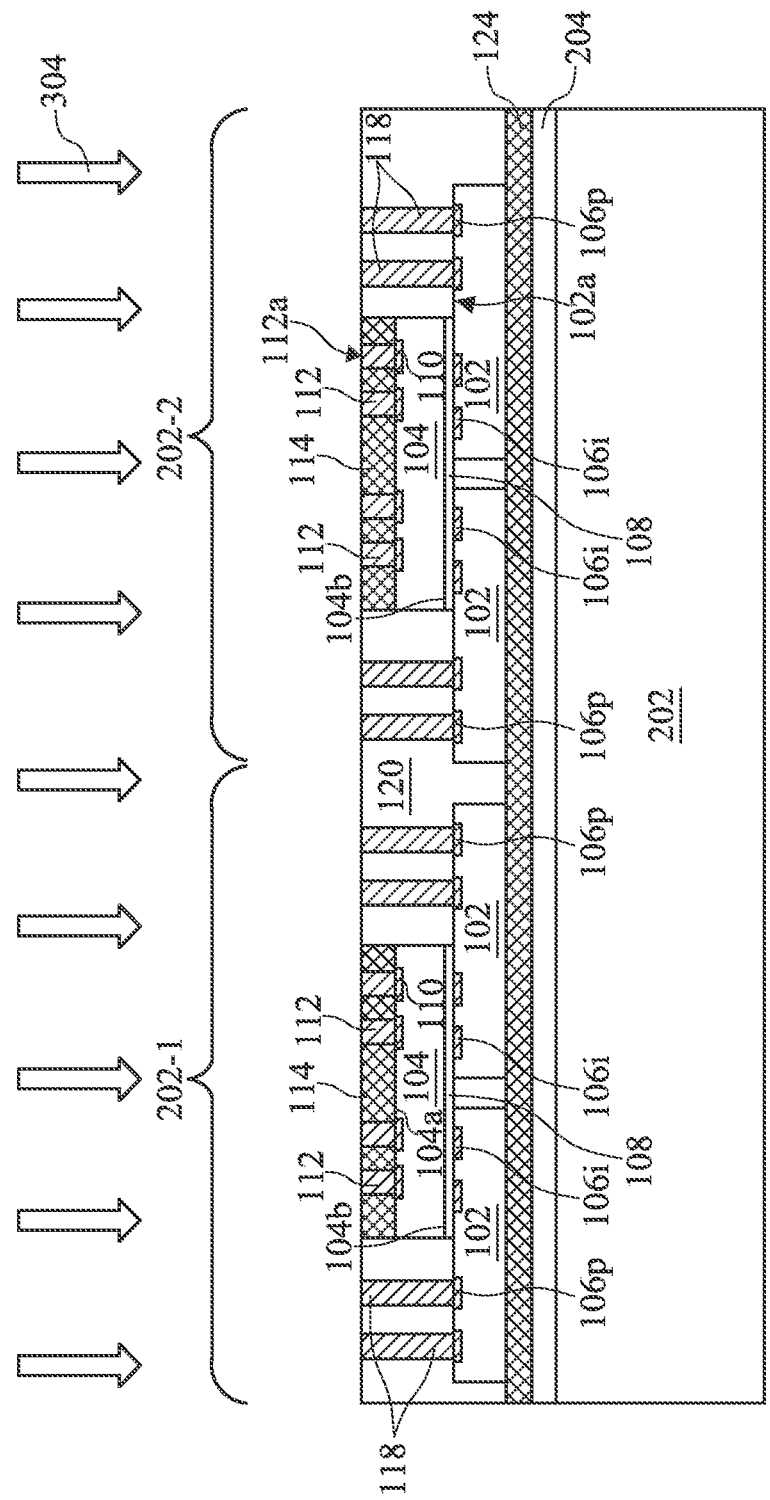

Referring to FIG. 7F, in each of the first portion 202-1 and the second portion 202-2 of the carrier 202, the molding compound 120 may be extended (e.g. vertically extended) to encapsulate (e.g. fully encapsulate) the at least one second chip 104 and the at least one second conductive pillar 118. In some embodiments, the molding compound 120 is shaped or molded using similar processes described above in respect of FIG. 3B. Referring to FIG. 7G, the third thinning process 304 may be performed on the molding compound 120 to expose the at least one second conductive pillar 118 and the plurality of first conductive pillars 112. As a result of the third thinning process 304, the first polymer layer 114 may also be exposed. The third thinning process 304 may comprise similar processes as described above in respect of the second thinning process 302.

Figure 7H:
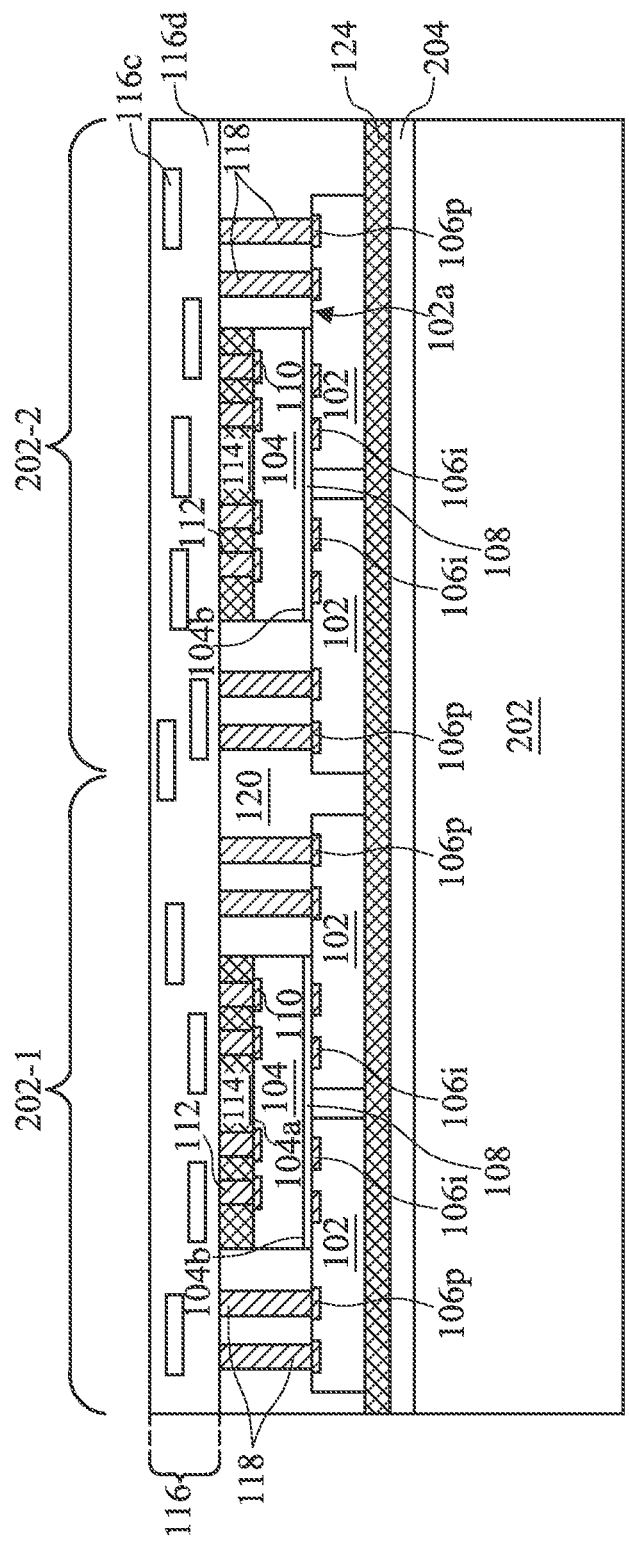

Referring to FIG. 7H, in each of the first portion 202-1 and the second portion 202-2 of the carrier 202, the RDL 116 may be formed over the molding compound 120, the at least one second conductive pillar 118, the plurality of first conductive pillars 112, and the first polymer layer 114. The RDL 116 may be formed using one or more of the processes described above in relation to FIG. 1. The conductive features 116c of the RDL 116 may be coupled (e.g. electrically and/or physically coupled) to the at least one second conductive pillar 118 and the plurality of first conductive pillars 112.

Figure 7I:
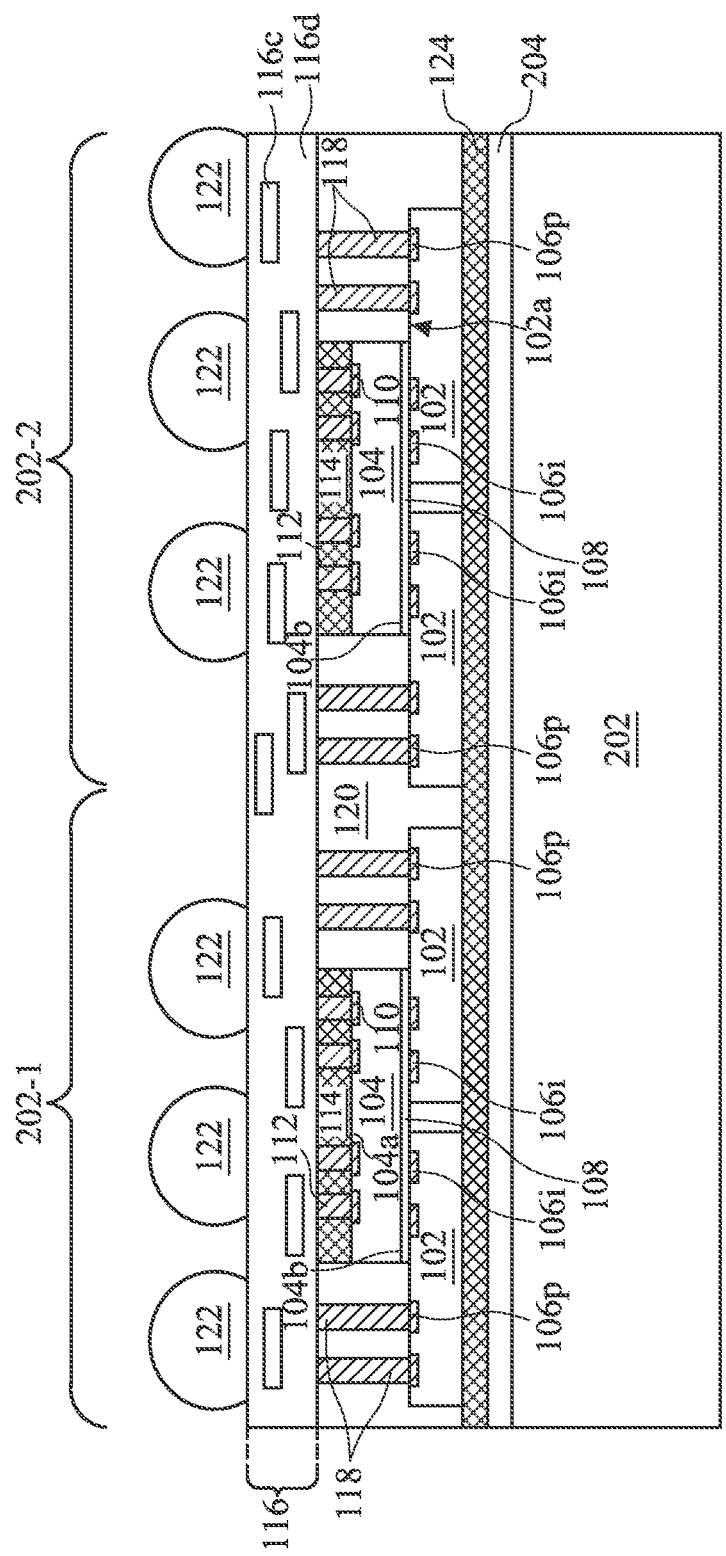

Referring to FIG. 7I, in each of the first portion 202-1 and the second portion 202-2 of the carrier 202, some of the conductive features 116c of the RDL 116 may be exposed (e.g. by a laser opening process and/or etching process), and the external connectors 122 may thereafter be formed over the exposed conductive features 116c of RDL 116 (e.g. by a BGA mounting process).

Figure 7J:
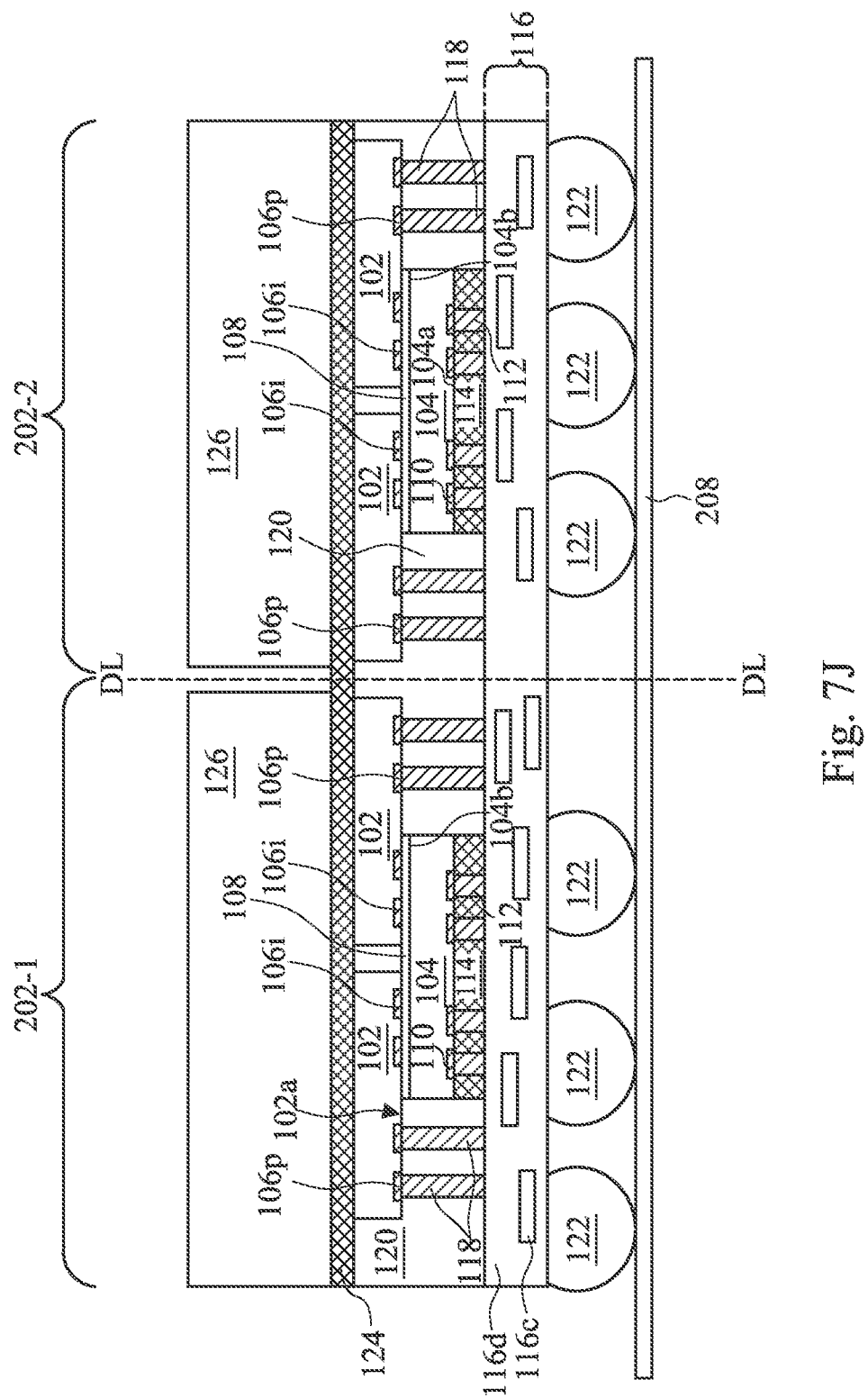

Referring to FIG. 7J, the carrier 202 may be inverted and the external connectors 122 may be mounted (e.g. frame mounted) onto the dicing tape 208. Additionally, the carrier 202 may be debonded from the second adhesive layer 124, e.g. by decomposing the third adhesive layer 204 under the heat of light, thereby releasing the carrier 202 from the second adhesive layer 124. Since the second adhesive layer 124 is free from the LTHC material, exposure to the heat of light does not decompose the second adhesive layer 124. In other embodiments, a thermal debonding process or a laser debonding process may be utilized, depending upon the precise adhesive chosen for the third adhesive layer 204.

Figure 7K:
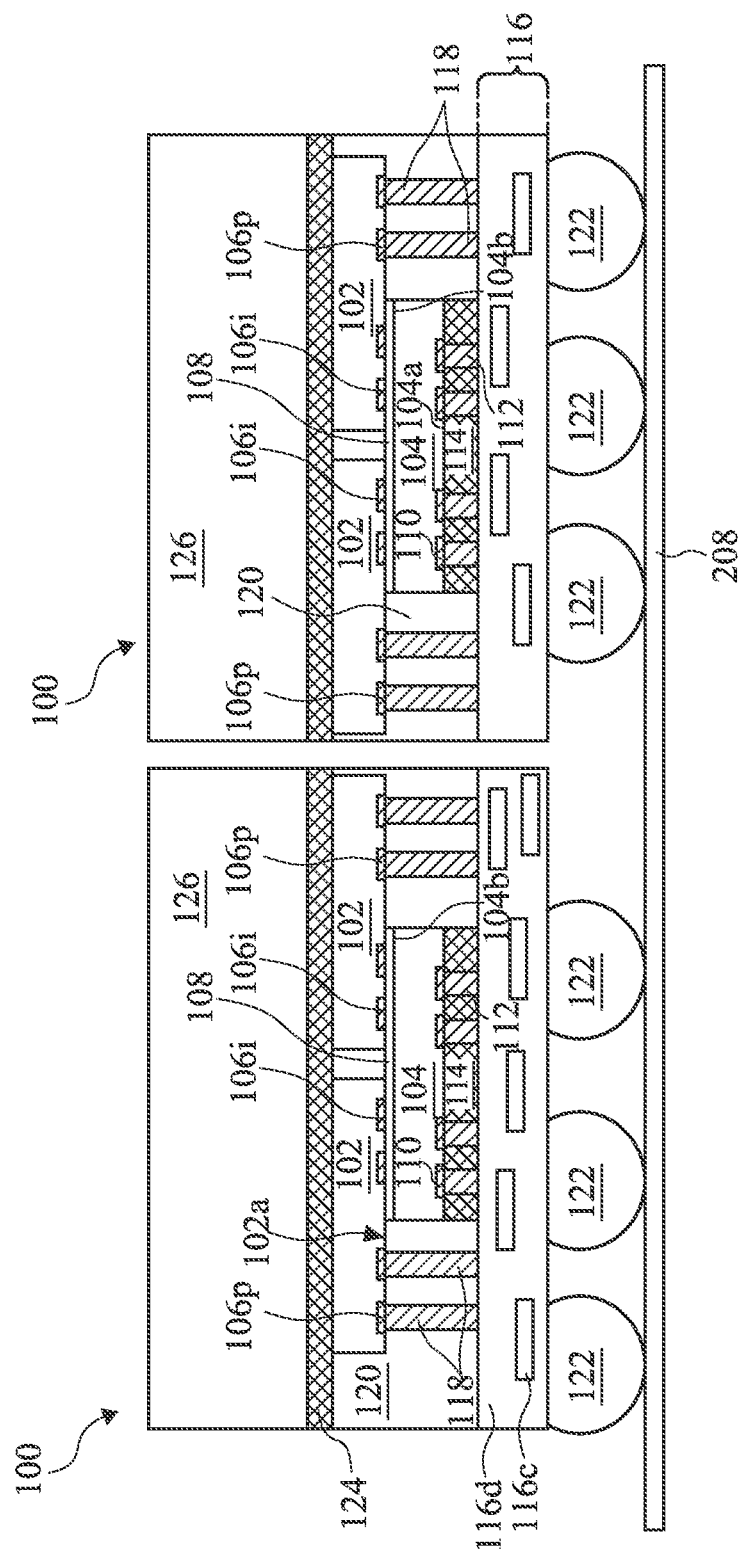

As shown in FIG. 7J, the first one of the heat sink 126 may be attached to the second adhesive layer 124 in the first portion 202-1 of the carrier 202, while the second one of the heat sink 126 may be attached to the second adhesive layer 124 in the second portion 202-2 of the carrier 202. Following this, the structure shown in FIG. 7J may be singulated or diced (e.g. along dicing line DL), thereby forming a plurality of packages 100 (as shown in FIG. 7K), each of which may be substantially identical to the package 101 shown in FIG. 5. Following this, dimensions of the plurality of packages 100 may be inspected (e.g. optically inspected).

In the process flows shown in FIGS. 6A to 6J and 7A to 7K, a first one of the at least one first chip 102 may be placed in the first portion 202-1 of the carrier 202, while a second one of the at least one first chip 102 may be placed in the second portion 202-2 of the carrier 202. This may be accomplished by initially dicing a wafer including the first and second ones of the at least one first chip 102 and subsequently placing the diced first chips 102 over the carrier 202 in the first portion 202-1 and the second portion 202-2 of the carrier 202. As shown in the examples of FIGS. 6A to 6J and 7A to 7K, this may be followed by the formation of the at least one second conductive pillar 118 over each of the diced first chips 102.

Figure 8A:
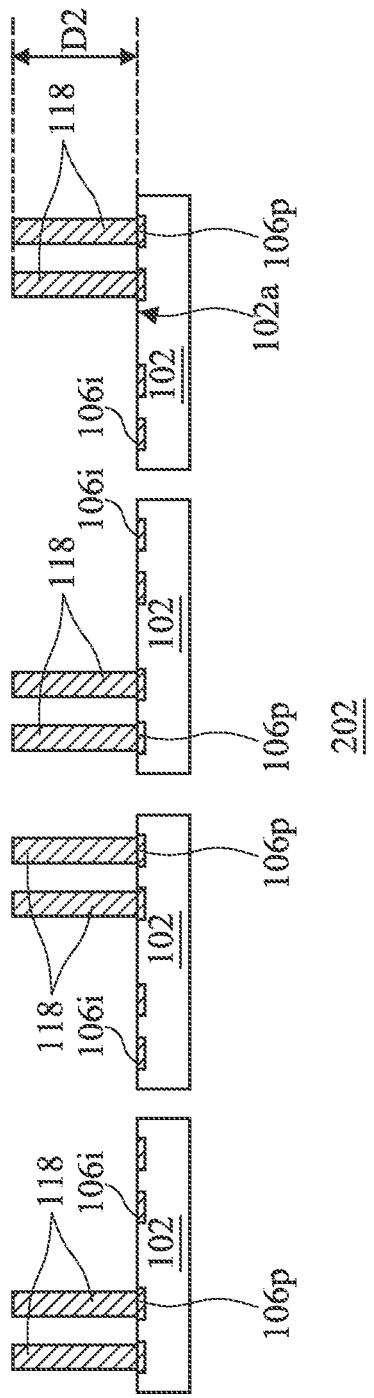
FIGS. 8A to 8I show a process flow illustrating some of the steps of yet another method of forming the multi-chip package shown in FIG. 5, in accordance with an embodiment.
Figure 8B:
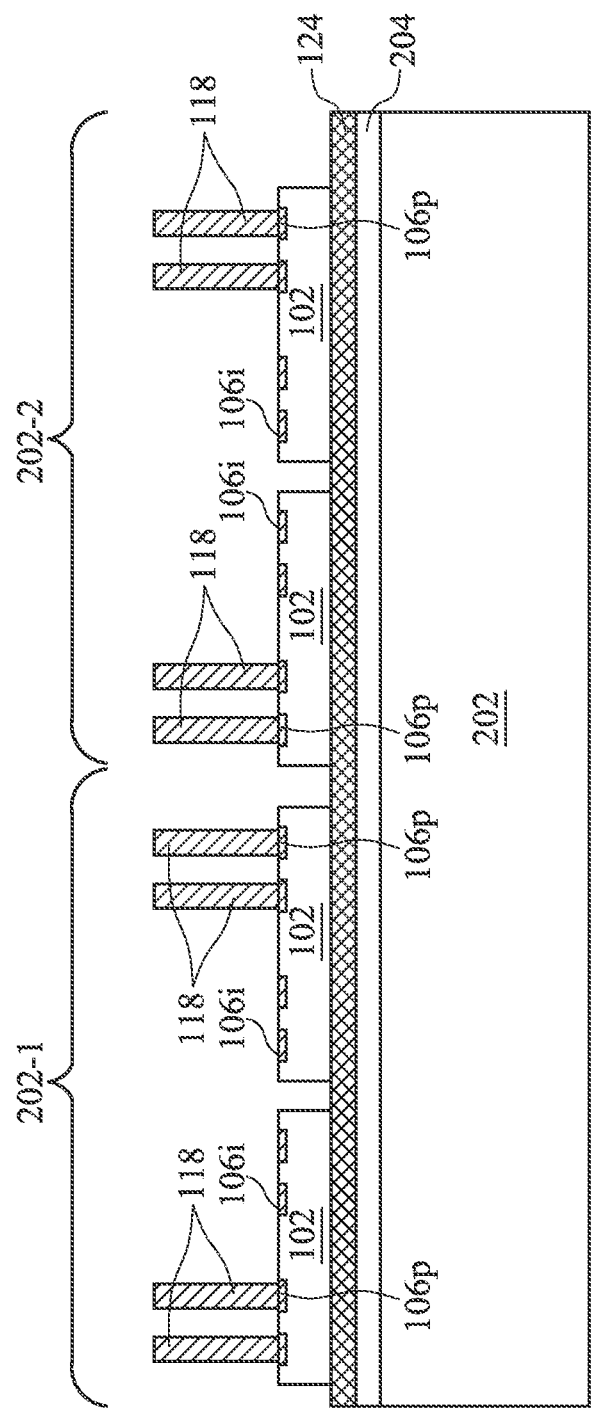

FIGS. 8A to 8I show a process flow illustrating some of the steps of yet another method of forming the multi-chip package shown in FIG. 5, in accordance with an embodiment. In the process flow shown in FIGS. 8A to 8I, the at least one second conductive pillar 118 may be formed over the at least one first chip 102 prior to bonding the first chip 102 to the carrier 202 (e.g. as shown in FIG. 8A) using one or more of the processes described above in respect of FIG. 6C. Referring to FIG. 8B, the first chips 102 and the at least one second conductive pillar 118 are bonded to the carrier 202, e.g. by the second adhesive layer 124 and the third adhesive layer 204. Following this, the process flow may proceed in a similar manner as described above in relation to FIGS. 6D to 6J. For example, referring to FIG. 8C, in each of the first portion 202-1 and the second portion 202-2 of the carrier 202, the at least one second chip 104 may be formed over the at least one first chip 102 and laterally adjacent to the at least one second conductive pillar 118.

Figure 8C:
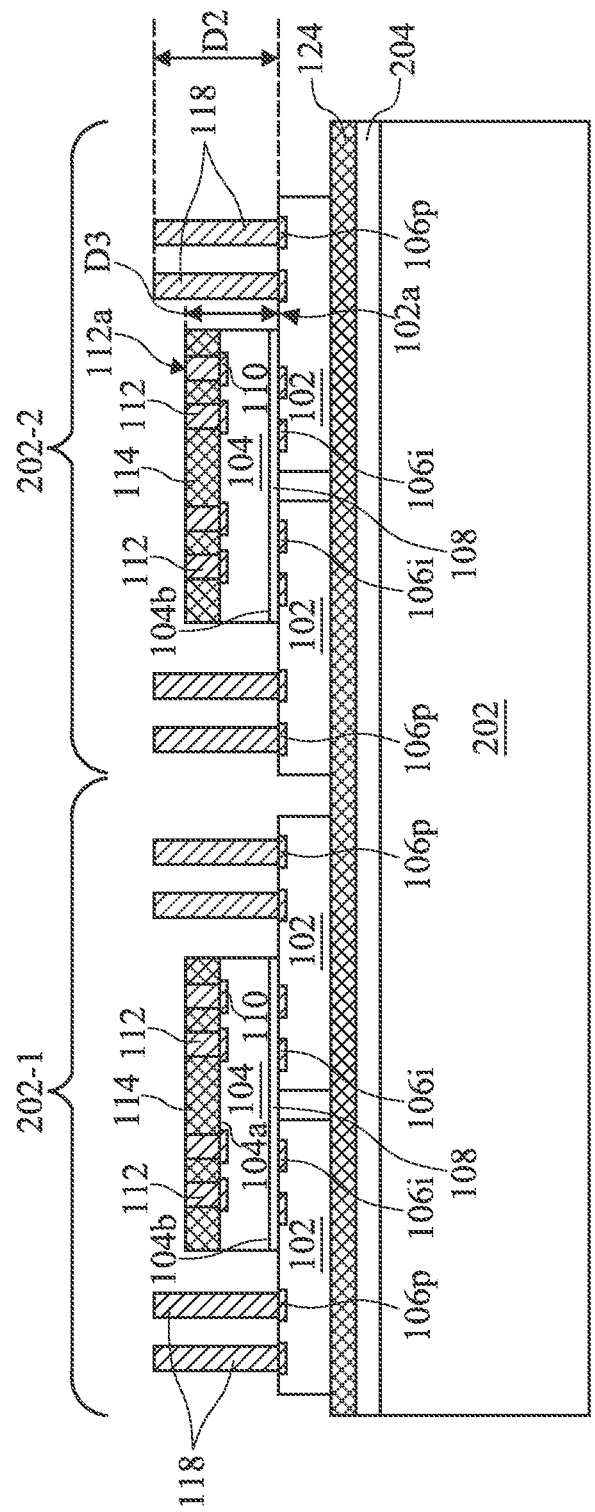

As shown in FIG. 8C, the at least one second chip 104 may additionally have the plurality of first conductive pillars 112 formed over the plurality of second contact pads 110 of the at least one second chip 104. The plurality of first conductive pillars 112 may additionally be surrounded by the first polymer layer 114. In some embodiments, the plurality of first conductive pillars 112 and the first polymer layer 114 may first be formed over the first surface 104a of the at least one second chip 104, and subsequently, the at least one second chip 104 having the plurality of first conductive pillars 112 and the first polymer layer 114 may be picked and placed over the first contact pads 106i located in the interior regions of the first portion 202-1 and the second portion 202-2 of the carrier 202.

Figure 8D:
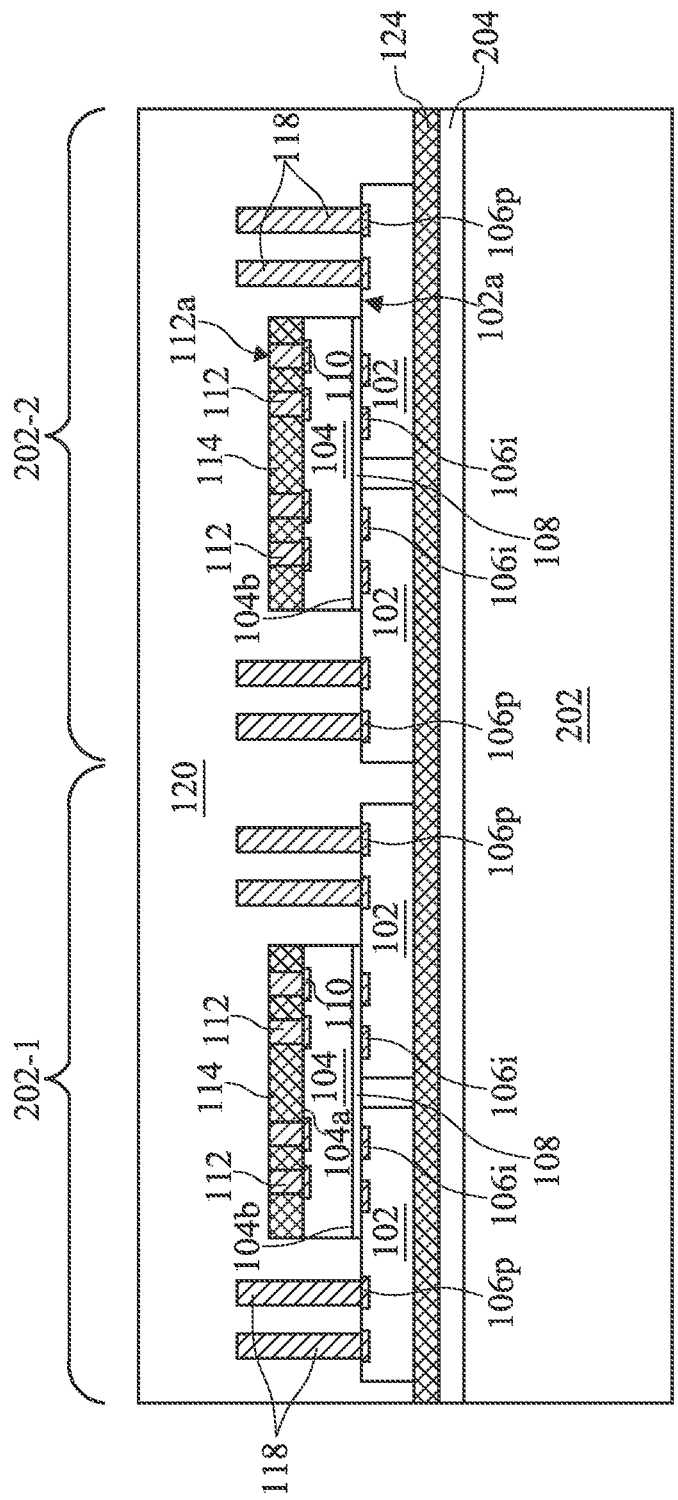

Referring to FIG. 8D, in each of the first portion 202-1 and the second portion 202-2 of the carrier 202, the molding compound 120 may be formed over and at least laterally encapsulate the at least one second chip 104 and the at least one first chip 102, e.g. using one or more processes described above in respect of FIG. 2E.

Figure 8E:
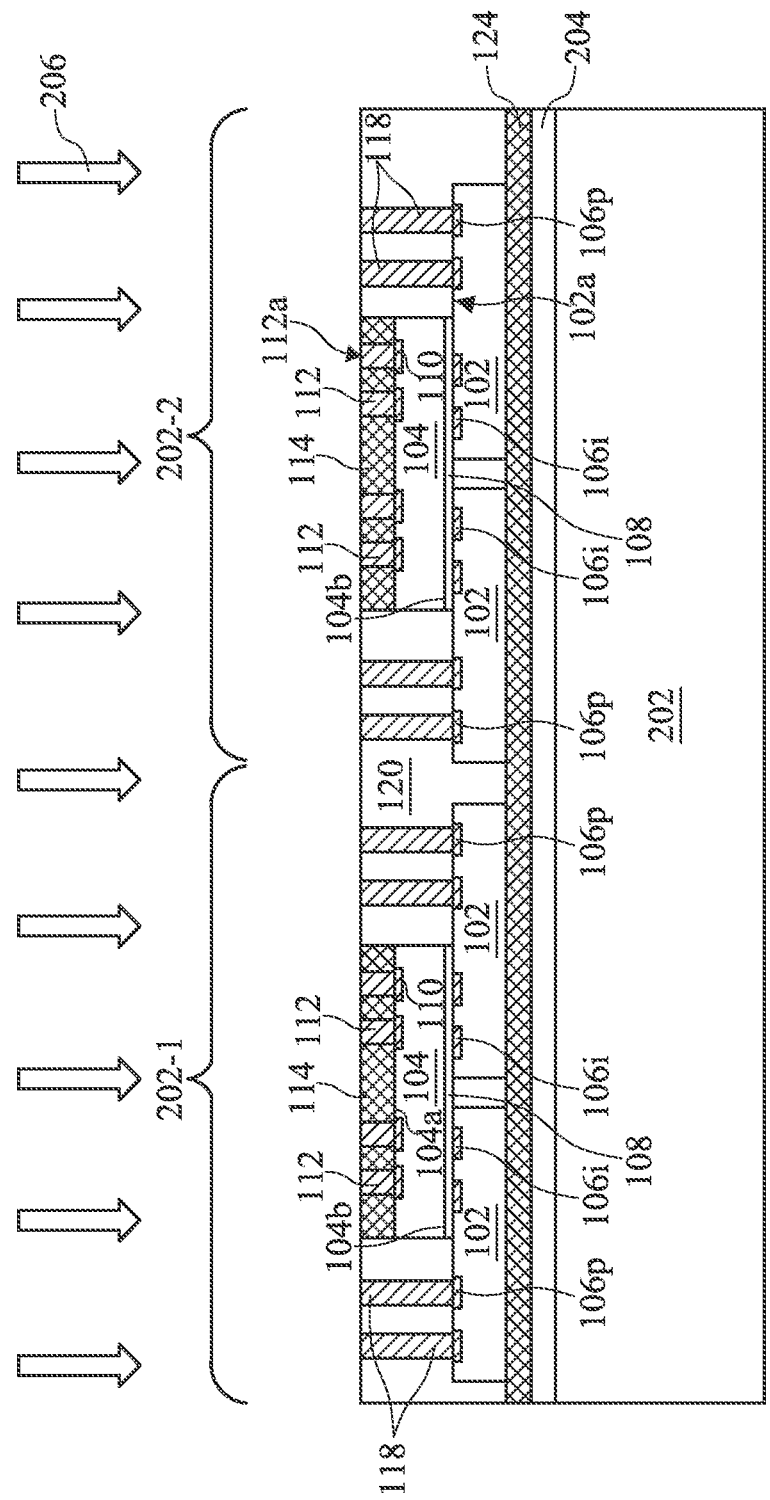
Figure 8F:
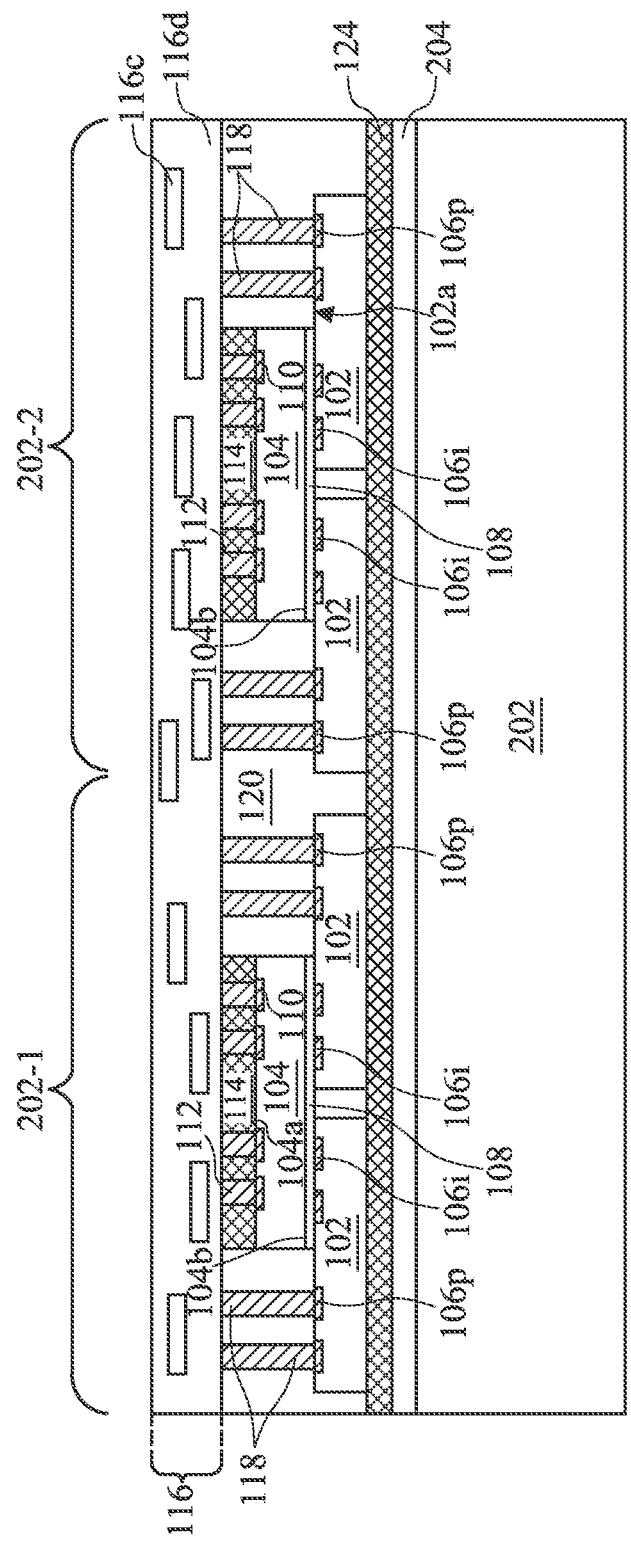

Referring to FIG. 8E, the first thinning process 206 may be performed on the molding compound 120 to expose the at least one second conductive pillar 118 and the plurality of first conductive pillars 112. Referring to FIG. 8F, in each of the first portion 202-1 and the second portion 202-2 of the carrier 202, the second RDL 116 may be formed over the molding compound 120, the at least one second conductive pillar 118, the plurality of first conductive pillars 112, and the first polymer layer 114. The second RDL 116 may be formed using one or more of the processes described above in relation to FIG. 1. The conductive features 116c of the second RDL 116 may be coupled (e.g. electrically and/or physically coupled) to the at least one second conductive pillar 118 and the plurality of first conductive pillars 112.

Figure 8G:
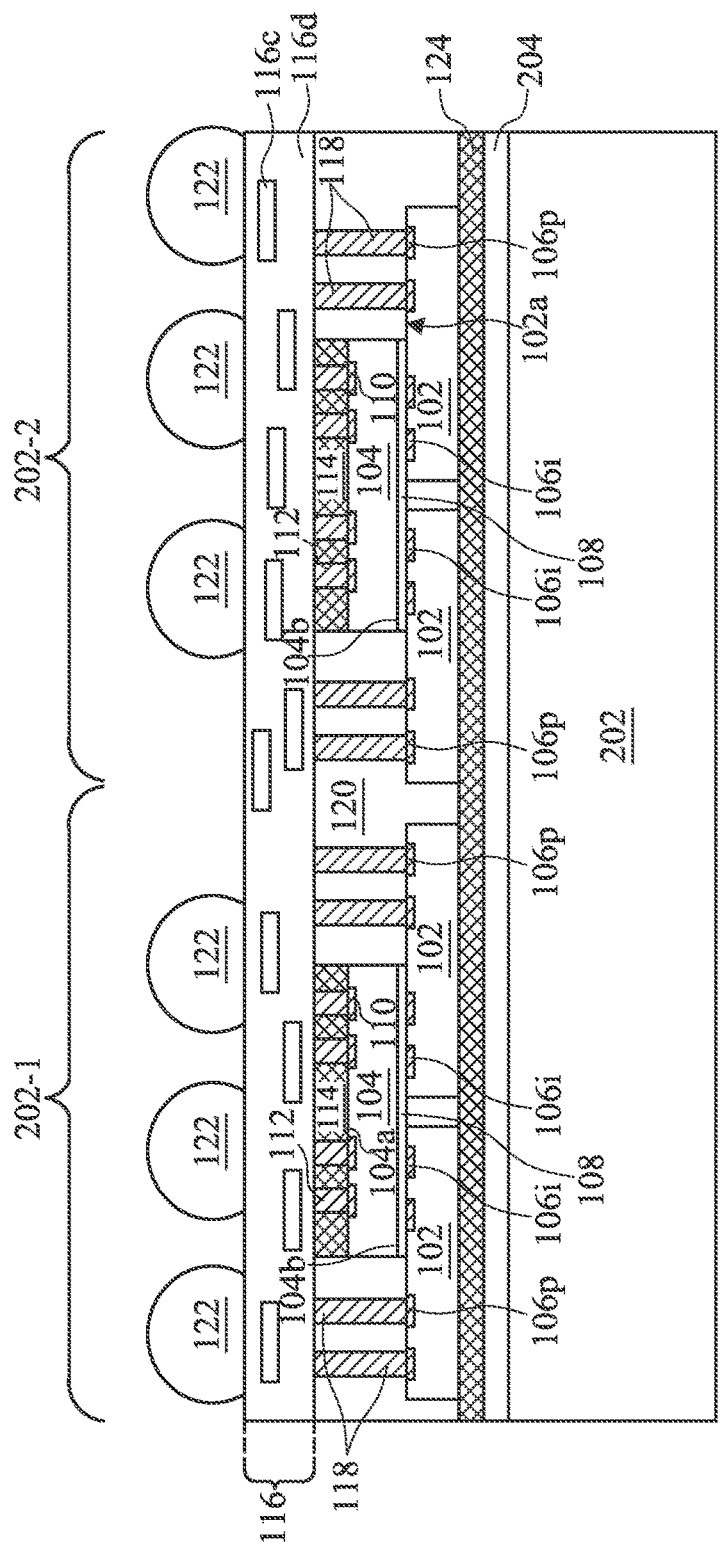

Referring to FIG. 8G, in each of the first portion 202-1 and the second portion 202-2 of the carrier 202, some of the conductive features 116c of the second RDL 116 may be exposed (e.g. by a laser opening process and/or etching process), and the external connectors 122 may thereafter be formed over the exposed conductive features 116c of the second RDL 116 (e.g. by a BGA mounting process).

Figure 8H:
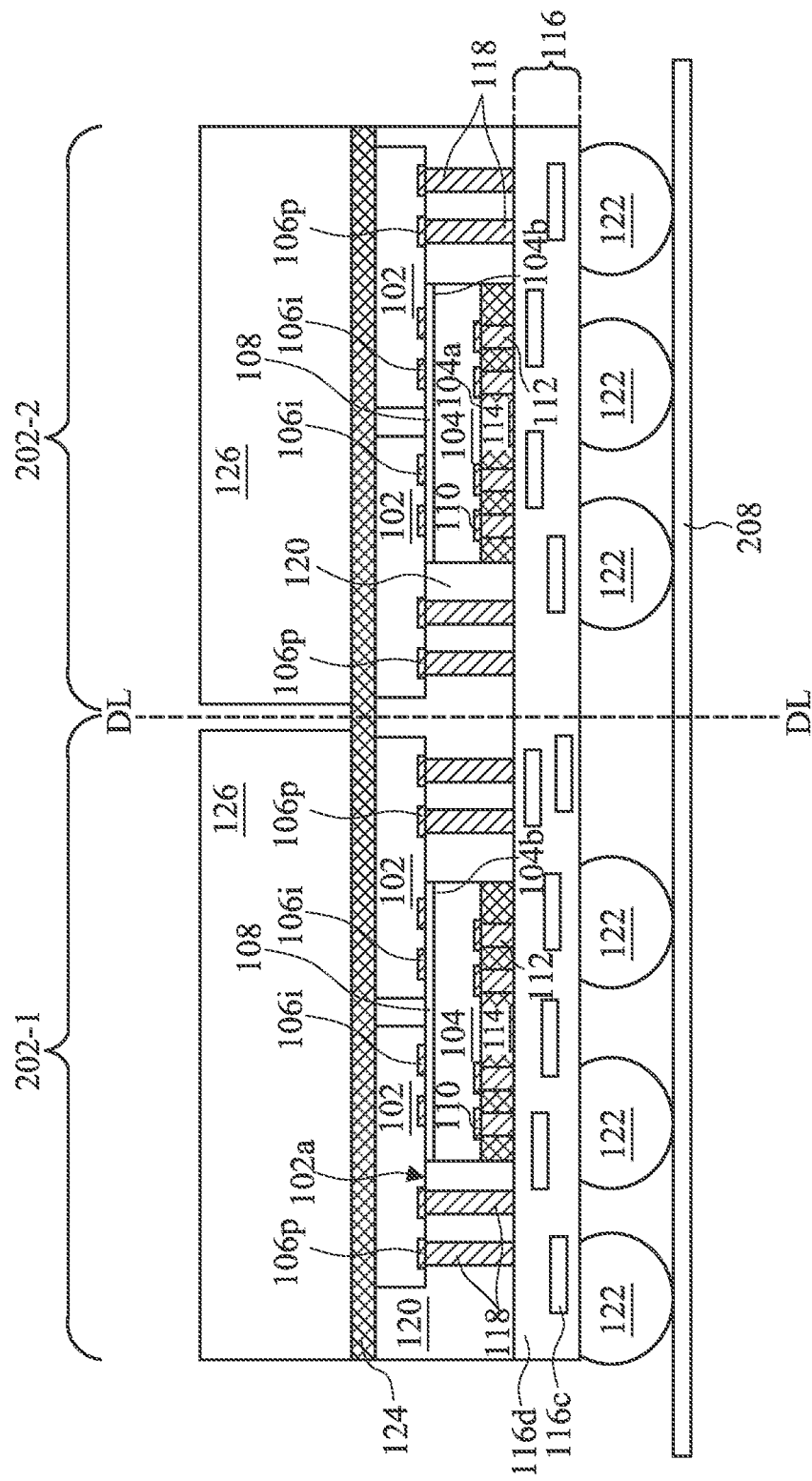

Referring to FIG. 8H, the carrier 202 may be inverted and the external connectors 122 may be mounted (e.g. frame mounted) onto the dicing tape 208. Additionally, the carrier 202 may be debonded from the second adhesive layer 124, e.g. by decomposing the third adhesive layer 204 under the heat of light, thereby releasing the carrier 202 from the second adhesive layer 124. Since the second adhesive layer 124 is free from the LTHC material, exposure to the heat of light does not decompose the second adhesive layer 124. In other embodiments, a thermal debonding process or a laser debonding process may be utilized, depending upon the precise adhesive chosen for the third adhesive layer 204.

Figure 8I:
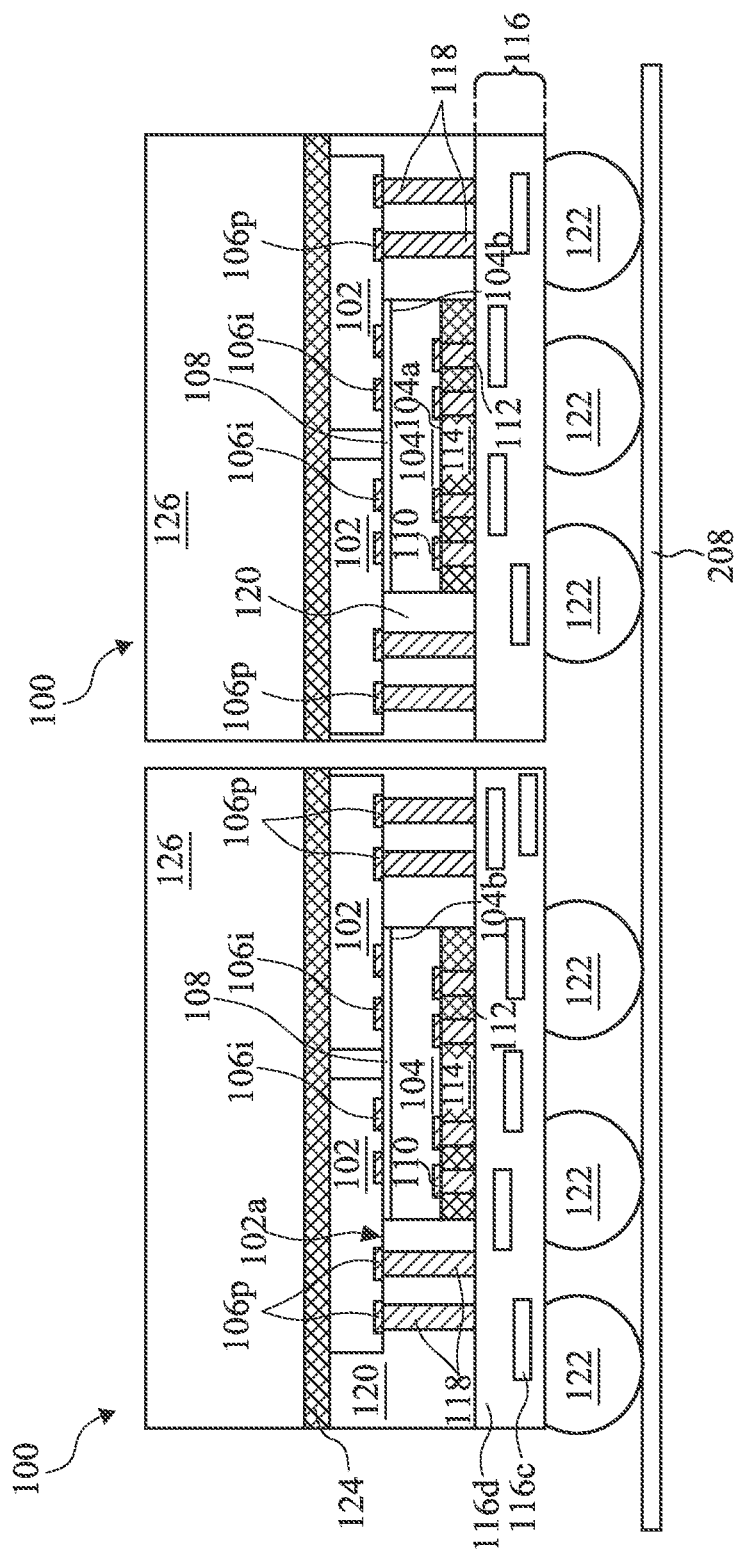

The step shown in FIG. 8H shows the first one of the heat sink 126 attached to the second adhesive layer 124 in the first portion 202-1 of the carrier 202, and the second one of the heat sink 126 attached to the second adhesive layer 124 in the second portion 202-2 of the carrier 202. Following this, the structure shown in FIG. 8H may be singulated or diced (e.g. along dicing line DL), thereby forming a plurality of packages 101 (as shown in FIG. 8I), each of which may be substantially identical to the package 101 shown in FIG. 5. Following this, dimensions of the plurality of packages 100 may be inspected (e.g. optically inspected).

According to various embodiments described herein, a chip package may include: a redistribution layer (RDL); a first chip comprising a plurality of first contact pads, the plurality of first contact pads facing the RDL; a second chip disposed between the first chip and the redistribution layer (RDL) wherein a portion of the first chip is disposed outside a lateral extent of the second chip; and a conductive via laterally separated from the second chip, the conductive via extending between the RDL and a first contact pad of the plurality of first contact pads, the first contact pad located in the portion of the first chip disposed outside the lateral extent of the second chip.

According to various embodiments described herein, a chip package may include: a plurality of dynamic random access memory (DRAM) chips laterally adjacent to each other, each of the plurality of DRAM chips having a plurality of first contact pads disposed at a first surface thereof; a logic chip attached to the first surfaces of the plurality of DRAM chips, the logic chip having a plurality of second contact pads disposed at a first surface thereof, wherein the first surface of the logic chip faces away from the plurality of DRAM chips; a plurality of first conductive pillars having first ends coupled to the plurality of second contact pads of the logic chip; a redistribution layer (RDL) coupled to second ends of the plurality of first conductive pillars opposite the first ends; and a plurality of second conductive pillars laterally separated from the logic chip, the plurality of second conductive pillars extending between the RDL and a first group of the plurality of first contact pads, the first group disposed outside a width of the logic chip.

According to various embodiments described herein, a method of manufacturing a chip package may include: placing at least one first die over a carrier, the at least one first die having a plurality of first contact pads facing away from the carrier; forming at least one conductive pillar over at least one peripheral contact pad of the plurality of first contact pads; placing at least one second die over the at least one first die and laterally adjacent to the at least one conductive pillar, the at least one second die having a plurality of second contact pads facing away from the carrier; encapsulating the at least one first die, the at least one second die, and the at least one conductive pillar in a molding compound; and forming a redistribution layer (RDL) over the molding compound, the RDL electrically coupled to the plurality of second contact pads and the at least one conductive pillar.

In some embodiments, a chip package includes a plurality of first chips laterally adjacent to each other, each of the plurality of first chips having a plurality of first contact pads on a first surface thereof, a second chip attached to the first surfaces of the plurality of first chips, the second chip having a plurality of second contact pads on a first surface thereof, where the first surface of the second chip faces away from the plurality of first chips, where the plurality of first chips extend beyond lateral extents of the second chip. The chip package also includes an adhesive layer between the second chip and the plurality of first chips, the adhesive layer being attached to a second surface of the second chip opposing the first surface of the second chip, the adhesive layer having a same width as the second chip, a first portion of the adhesive layer being attached to a first one of the plurality of first chips, and a second portion of the adhesive layer being attached to a second one of the plurality of first chips. The chip package further includes a first redistribution layer (RDL) coupled to the plurality of second contact pads of the second chip, a plurality of first conductive pillars laterally separated from the second chip, the plurality of first conductive pillars extending from the first RDL to corresponding ones of a first group of the plurality of first contact pads, the first group disposed outside a width of the second chip, and a molding compound around the plurality of first chips, the second chip, and the plurality of first conductive pillars.

In some embodiments, a method for forming a semiconductor package includes attaching a first die and a second die to a carrier, the first die being laterally adjacent to the second die, forming a first conductive pillar over a first contact pad of the first die, the first contact pad being on an upper surface of the first die facing away from the carrier, and forming a second conductive pillar over a second contact pad of the second die, the second contact pad being on an upper surface of the second die facing away from the carrier. The method also includes attaching a third die to the upper surface of the first die and to the upper surface of the second die, where the first die and the second die extend beyond lateral extents of the third die, where the third die has a third conductive pillar over a third contact pad of the third die, where the third contact pad is on an upper surface of the third die facing away from the carrier. The method further includes depositing a molding material over the first die, the second die, the third die, the first conductive pillar, and the second conductive pillar, recessing the molding material, where after the recessing, an upper surface of the molding material is level with an upper surface of the first conductive pillar, an upper surface of the second conductive pillar, and an upper surface of the third conductive pillar, and forming a first redistribution layer (RDL) over and electrically coupled to the first conductive pillar, the second conductive pillar, and the third conducive pillar.

In some embodiments, a method includes attaching a first side of a first die to a carrier, where the first die has a first conductive pillar disposed over a first contact pad on a second side of the first die opposing the first side of the first die; attaching a first side of a second die to the carrier such that the second die is laterally adjacent to the first die, where the second die has a second conductive pillar disposed over a second contact pad on a second side of the second die opposing the first side of the second die; and attaching a third die to the second side of the first die and to the second side of the second die, where a portion of the first die extends outside a lateral extent of the third die, and a portion of the second die extends outside the lateral extent of the third die. The method further includes embedding the first die, the second die, the third die, the first conductive pillar and the second conductive pillar in a molding layer; thinning the molding layer, where after the thinning, the molding layer, the first conductive pillar, the second conductive pillar, and a third conductive pillar of the third die have a coplanar upper surface; and forming a first redistribution layer (RDL) over the molding layer, where the first RDL is electrically coupled to the first conductive pillar, the second conductive pillar and the third conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   attaching a first side of a first die to a carrier, wherein an opposing second side of the first die has a first redistribution layer (RDL) extending along and has a first conductive pillar on the first RDL;
   attaching a first side of a second die to the carrier such that the second die is laterally adjacent to the first die, wherein an opposing second side of the second die has a second RDL extending along and has a second conductive pillar on the second RDL, wherein the first RDL and the second RDL are spaced apart from each other;
   attaching a third die to the second side of the first die and to the second side of the second die, wherein a first portion of the third die extends outside a lateral extent of the first die, and a second portion of the third die extends outside a lateral extent of the second die;
   after the first die, the second die, and the third die are attached, embedding the first die, the second die, the third die, the first conductive pillar, and the second conductive pillar in a molding layer; and
   forming a third RDL over the molding layer, wherein the third RDL is electrically coupled to the first conductive pillar, the second conductive pillar and the third die.

2. The method of claim 1, wherein the first RDL and the first conductive pillar are formed on the second side of the first die before attaching the first side of the first die to the carrier, and wherein the second RDL and the second conductive pillar are formed on the second side of the second die before attaching the first side of the second die to the carrier.

3. The method of claim 1, wherein attaching the third die comprises attaching the third die to the second side of the first die and to the second side of the second die using an adhesive layer, wherein the adhesive layer extends continuously from the first die to the second die.

4. The method of claim 1, wherein the embedding comprises:
   depositing, in a single process, the molding layer around the first die, the second die, the third die, the first conductive pillar, and the second conductive pillar.

5. The method of claim 4, further comprising:
   after the embedding and before forming the third RDL, thinning the molding layer, wherein after the thinning, the molding layer, the first conductive pillar, the second conductive pillar, and a third conductive pillar of the third die have a coplanar surface.

6. The method of claim 1, further comprising:
   after forming the third RDL, removing the carrier; and
   attaching a heat sink to the first side of the first die and the first side of the second die.

7. The method of claim 6, further comprising:
   forming conductive connectors on a surface of the third RDL facing away from the molding layer.

8. A method comprising:
   placing a first die and a second die over a carrier such that the first die and the second die are laterally adjacent to each other;
   forming a first conductive pillar over a first contact pad of the first die;
   forming a second conductive pillar over a second contact pad of the second die;
   after placing the first die and the second die, attaching a third die to an upper surface of the first die and an upper surface of the second die that face away from the carrier, the first die and the second die extending beyond a lateral extent of the third die, a first portion of the third die being directly over the first die and attached to the first die, a second portion of the third die being directly over the second die and attached to the second die, the third die being laterally adjacent to the first conductive pillar;
   embedding the first die, the second die, the third die, the first conductive pillar, and the second conductive pillar in a molding material after the attaching; and
   forming a first redistribution layer (RDL) over the molding material, the first RDL being electrically coupled to the first conductive pillar, the second conductive pillar, the first die, the second die, and the third die.

9. The method of claim 8, wherein attaching the third die comprises attaching a backside of the third die to the first die and the second die, wherein after attaching the third die, the third die is directly over a third contact pad of the first die and directly over a fourth contact pad of the second die.

10. The method of claim 8, further comprising:
before forming the first conductive pillar, forming a second RDL over the upper surface of the first die, the second RDL electrically coupled to the first contact pad of the first die; and
before forming the second conductive pillar, forming a third RDL over the upper surface of the second die, the third RDL electrically coupled to the second contact pad of the second die.

11. The method of claim 10, wherein the second RDL has a same width as the first die, and the third RDL has a same width as the second die, wherein the second RDL is spaced apart from the third RDL.

12. A method comprising:
attaching a first chip and a second chip to a first side of a carrier;
forming a first redistribution layer (RDL) along a first side of the first chip facing away from the carrier;
forming a second RDL along a first side of the second chip facing away from the carrier;
after attaching the first chip and the second chip, attaching a third chip to the first RDL and the second RDL, wherein after attaching the third chip, a first portion of the third chip is disposed within lateral extents of the first chip, and a second portion of the third chip is disposed within lateral extents of the second chip;
forming a molding material around the first chip, the second chip, the third chip; and
forming a third RDL over the molding material and electrically coupled to the third chip, wherein the third chip is between the third RDL and the first chip.

13. The method of claim 12, wherein the first RDL and the second RDL are laterally spaced apart from each other and have a gap in between, wherein the molding material extends into the gap between the first RDL and the second RDL.

14. The method of claim 13, wherein attaching the third chip comprises attaching the third chip to the first RDL and the second RDL using an adhesive layer, wherein the adhesive layer contacts and extends along the first RDL, the second RDL, and the molding material between the first RDL and the second RDL.

15. The method of claim 14, further comprising, before forming the molding material, forming first conductive pillars over the first RDL and laterally separated from the third chip, wherein after forming the third RDL, the first conductive pillars extend from the third RDL to the first RDL.

16. The method of claim 15, further comprising, before forming the molding material, forming second conductive pillars over the second RDL and laterally separated from the third chip, wherein after forming the third RDL, the second conductive pillars extend from the third RDL to the second RDL.

17. The method of claim 16, wherein the third chip has third conductive pillars at a first side of the third chip facing away from the first chip, wherein the method further comprises, before forming the third RDL, performing a planarization process to achieve a level surface between the first conductive pillars, the second conductive pillars, the third conductive pillars, and the molding material.

18. The method of claim 12, further comprising:
removing the carrier after forming the third RDL; and
attaching a heat sink to the first chip and to the second chip, wherein after attaching the heat sink, the first chip and the second chip are between the heat sink and the third chip.

19. The method of claim 18, wherein the heat sink is formed to extends continuously from the first chip to the second chip, wherein a third width of the heat sink is larger than a sum of a first width of the first chip and a second width of the second chip.

20. The method of claim 18, further comprising, before removing the carrier, forming conductive connectors over and electrically coupled to the third RDL, wherein the third RDL is between the conductive connectors and the molding material.

* * * * *